US010120470B2

(12) United States Patent
Kurokawa

(10) Patent No.: US 10,120,470 B2
(45) Date of Patent: Nov. 6, 2018

(54) SEMICONDUCTOR DEVICE, DISPLAY DEVICE AND ELECTRONIC DEVICE

(71) Applicant: Semiconductor Energy Laboratory Co., Ltd., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/652,542

(22) Filed: Jul. 18, 2017

(65) Prior Publication Data

US 2018/0024663 A1  Jan. 25, 2018

(30) Foreign Application Priority Data

Jul. 22, 2016 (JP) .................................. 2016-144229

(51) Int. Cl.
*G06F 3/041* (2006.01)
*G09G 3/3275* (2016.01)
(Continued)

(52) U.S. Cl.
CPC .......... *G06F 3/041* (2013.01); *G09G 3/3266* (2013.01); *G09G 3/3275* (2013.01);
(Continued)

(58) Field of Classification Search
CPC ... G06F 3/041; H01L 27/1225; G09G 3/3275; G09G 3/3688; G09G 3/3266; G09G 3/3677; G09G 2300/0426; G09G 2330/023; G09G 2360/12; G09G 2310/08; G02F 1/13338
See application file for complete search history.

(56) References Cited

U.S. PATENT DOCUMENTS

2003/0052869 A1    3/2003  Fujii et al.
2011/0090183 A1*   4/2011  Yamazaki ............ G09G 3/3648
                                                 345/204
(Continued)

FOREIGN PATENT DOCUMENTS

JP    2003-157026 A    5/2003
JP    2011-141522 A    7/2011
(Continued)

*Primary Examiner* — Erin M File
(74) *Attorney, Agent, or Firm* — Fish & Richardson P.C.

(57) ABSTRACT

A semiconductor device with low power consumption is provided. The semiconductor device includes a controller, an AI controller, a frame memory, a register, and an image processing portion. The image processing portion is configured to receive image data from the frame memory and a parameter from the register, and to process the image data using the parameter. The frame memory is configured to retain the image data while power supply is stopped, and the register is configured to retain the parameter while power supply is stopped. The controller is configured to control power supply to the frame memory, the register, and the image processing portion. The AI controller is configured to predict when to switch into power gating and to provide a timing instruction to perform preparation operation for power gating.

8 Claims, 27 Drawing Sheets

(51) Int. Cl.
*G09G 3/36* (2006.01)
*G09G 3/3266* (2016.01)
*H01L 27/12* (2006.01)
*G02F 1/1333* (2006.01)

(52) U.S. Cl.
CPC ......... *G09G 3/3677* (2013.01); *G09G 3/3688* (2013.01); *H01L 27/1225* (2013.01); *G02F 1/13338* (2013.01); *G09G 2300/0426* (2013.01); *G09G 2310/08* (2013.01); *G09G 2330/023* (2013.01); *G09G 2360/12* (2013.01)

(56) References Cited

U.S. PATENT DOCUMENTS

| | | |
|---|---|---|
| 2011/0090207 A1 | 4/2011 | Yamazaki et al. |
| 2011/0156027 A1 * | 6/2011 | Yamazaki ............... H01L 29/24 257/43 |
| 2012/0274356 A1 | 11/2012 | Takahashi |
| 2013/0134416 A1 | 5/2013 | Nishijima et al. |
| 2013/0191673 A1 | 7/2013 | Koyama et al. |
| 2013/0235689 A1 | 9/2013 | Koyama |
| 2013/0262828 A1 | 10/2013 | Yoneda |
| 2013/0262896 A1 | 10/2013 | Yoneda |
| 2013/0270551 A1 | 10/2013 | Yoneda |
| 2013/0285711 A1 | 10/2013 | Miyake |
| 2013/0293266 A1 | 11/2013 | Takemura |
| 2013/0297874 A1 | 11/2013 | Kurokawa |
| 2013/0297952 A1 | 11/2013 | Miyake |
| 2013/0315011 A1 | 11/2013 | Takahashi et al. |
| 2013/0315021 A1 | 11/2013 | Kondo et al. |
| 2013/0326244 A1 | 12/2013 | Koyama et al. |
| 2013/0326309 A1 | 12/2013 | Yoneda |
| 2014/0025978 A1 | 1/2014 | Tokunaga |
| 2014/0068300 A1 | 3/2014 | Nishijima et al. |
| 2014/0108836 A1 | 4/2014 | Nishijima et al. |
| 2014/0159771 A1 | 6/2014 | Ikeda et al. |
| 2014/0208142 A1 | 7/2014 | Tamura |
| 2014/0325171 A1 | 10/2014 | Yoneda |
| 2014/0340127 A1 | 11/2014 | Kobayashi et al. |
| 2014/0340134 A1 | 11/2014 | Shionoiri |
| 2014/0368235 A1 | 12/2014 | Aoki et al. |
| 2015/0028837 A1 | 1/2015 | Takahashi |
| 2015/0103611 A1 | 4/2015 | Ishizu |
| 2015/0109870 A1 | 4/2015 | Ishizu et al. |
| 2015/0117093 A1 | 4/2015 | Onuki et al. |
| 2015/0269977 A1 | 9/2015 | Ishizu et al. |
| 2015/0370313 A1 | 12/2015 | Tamura |
| 2016/0006433 A1 | 1/2016 | Ishizu et al. |
| 2016/0043716 A1 | 2/2016 | Kurokawa et al. |
| 2016/0217848 A1 | 7/2016 | Ishizu et al. |
| 2016/0226490 A1 | 8/2016 | Kozuma et al. |
| 2016/0232956 A1 | 8/2016 | Ishizu et al. |
| 2016/0233866 A1 | 8/2016 | Ishizu et al. |
| 2016/0301932 A1 | 10/2016 | Kurokawa |
| 2016/0379564 A1 | 12/2016 | Inoue et al. |
| 2017/0187357 A1 | 6/2017 | Tamura |
| 2017/0248128 A1 | 8/2017 | Koyama et al. |
| 2017/0337884 A1 | 11/2017 | Kurokawa |
| 2017/0365209 A1 | 12/2017 | Kurokawa |
| 2018/0018565 A1 | 1/2018 | Kurokawa |
| 2018/0018752 A1 | 1/2018 | Kurokawa |
| 2018/0026612 A1 | 1/2018 | Kurokawa |

FOREIGN PATENT DOCUMENTS

| | | |
|---|---|---|
| JP | 2011-141524 A | 7/2011 |
| JP | 2011-151383 A | 8/2011 |

* cited by examiner

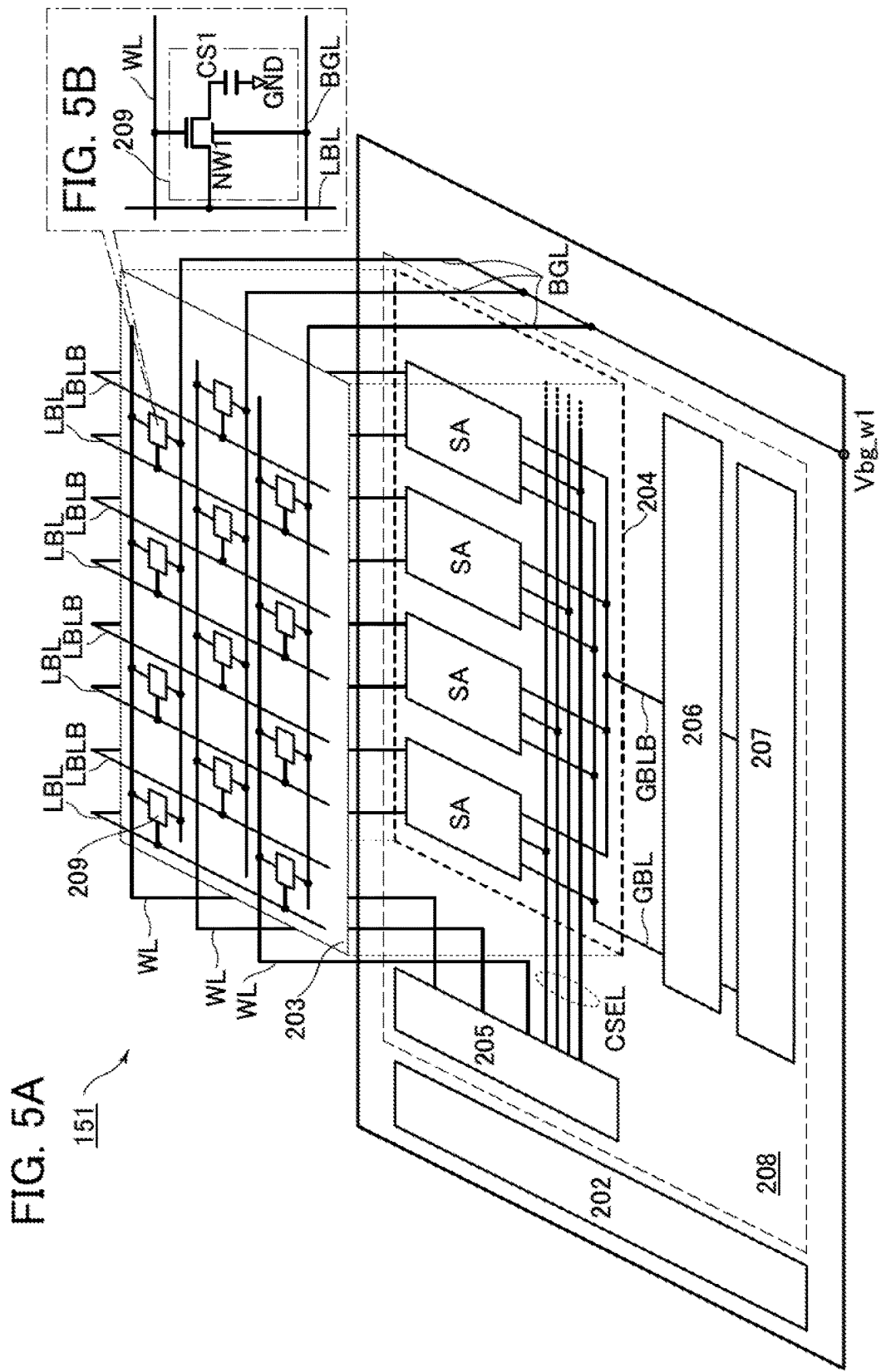

270

271

SEMICONDUCTOR DEVICE, DISPLAY DEVICE AND ELECTRONIC DEVICE

BACKGROUND OF THE INVENTION

1. Field of the Invention

One embodiment of the present invention relates to a semiconductor device.

Note that one embodiment of the present invention is not limited to the above technical field. The technical field of the invention disclosed in this specification and the like relates to an object, a method, or a manufacturing method. Furthermore, one embodiment of the present invention relates to a process, a machine, manufacture, or a composition of matter.

Specific examples of the technical field of one embodiment of the present invention disclosed in this specification and the like include a semiconductor device, a display device, an electronic device, a method for driving any of them, and a method for manufacturing any of them. In this specification and the like, a semiconductor device generally means a device that can function by utilizing semiconductor characteristics.

2. Description of the Related Art

A display device in which a reflective element and a light emission type element are combined has been proposed (Patent Document 1). The reflective element is used in bright environments and the light emission type element is used in dark environments, so that it is possible to provide a display device with high display quality independent of environment light and with low power consumption.

A technique for using a transistor including an oxide semiconductor in a channel formation region (hereinafter referred to as an OS transistor) for a display device such as a liquid crystal display or an organic electroluminescent (EL) display has been proposed. An OS transistor has an extremely low off-state current. With use of this, a technique for reducing refresh frequency in displaying still images and reducing power consumption of a liquid crystal display or an organic EL display has been disclosed (Patent Document 2 and Patent Document 3). Note that the aforementioned technique for reducing the power consumption of the display device is referred to as idling stop or IDS driving in this specification.

In addition, an example of using an OS transistor for a nonvolatile memory device to utilize the low off-state current has been disclosed (Patent Document 4).

REFERENCE

Patent Document

[Patent Document 1] Japanese Published Patent Application No. 2003-157026
[Patent Document 2] Japanese Published Patent Application No. 2011-141522
[Patent Document 3] Japanese Published Patent Application No. 2011-141524
[Patent Document 4] Japanese Published Patent Application No. 2011-151383

To perform display using the reflection type element in bright environments and the light emission type element in dark environments, a semiconductor device which distributes image data to each display element by detecting external light is necessary. The semiconductor device does not need to transmit image data or a signal to a display device while the display device performs IDS driving; thus, power supply for circuits relating to the transmission can be stopped. An object of one embodiment of the present invention is to provide a semiconductor device which has low power consumption and a mechanism in which display quality is not influenced even when power supply for some circuits is stopped.

After sensing that no image data is updated, the display device performs the IDS driving. In some of the circuits in a semiconductor device, data need to be stored (saved) into a nonvolatile register, which does not lose data even without power supply, before power supply is stopped. If data is stored after no update image data is sensed, the period for stopping power supply becomes short, which may decrease the power reduction effect. Another object of one embodiment of the present invention is to provide a semiconductor device capable of storing data into a nonvolatile register before sensing of no update of the image data by predicting the absence of the update of the image data.

Another object of one embodiment of the present invention is to provide a novel semiconductor device. Another object of one embodiment of the present invention is to provide a novel semiconductor device with low power consumption. Another object of one embodiment of the present invention is to provide a display device including the novel semiconductor device. Another object of one embodiment of the present invention is to provide an electronic device using the display device including the novel semiconductor device.

Note that one embodiment of the present invention does not necessarily achieve all the objects listed above and only needs to achieve at least one of the objects. The description of the above objects does not preclude the existence of other objects. Other objects will be apparent from and can be derived from the description of the specification, the drawings, the claims, and the like.

One embodiment of the present invention is a semiconductor device including a first controller, a second controller, a frame memory, a register, and an image processing portion. The frame memory has a function of storing image data. The image processing portion has a function of processing the image data. The register has a function of storing a parameter for performing processing in the image processing portion. The frame memory has a function of retaining the image data while power supply to the frame memory is stopped. The register has a function of retaining the parameter when power supply to the register is stopped. The first controller has a function of controlling the power supply to the frame memory, the power supply to the register, and power supply to the image processing portion. The second controller has a function of instructing the register before power supply to the register is stopped in timing of performing preparation operation for stop of the power supply to the register.

One embodiment of the present invention is the semiconductor device according to the above embodiment further including a third controller. The third controller has a function of receiving a first signal from a touch sensor and generating a second signal on the basis of the first signal. The second signal includes information sensed by the touch sensor. The second controller has a function of instructing the register on the basis of the second signal and current consumption of the frame memory in timing of performing preparation operation for stop of the power supply to the register.

One embodiment of the present invention is the semiconductor device according to the above embodiment in which the register includes a scan chain register, a first register, and a second register. The scan chain register includes a third register and a fourth register. An output terminal of the third register is electrically connected to an input terminal of the fourth register. The first register has a function of reading data stored in the third register. The second register has a function of reading data stored in the fourth register. The data read by the first register and the second register are output to the image processing portion as the parameter. The third register includes a first retention circuit. The fourth register includes a second retention circuit. The first retention circuit has a function of storing the data stored in the third register. The third register has a function of reading data stored in the first retention circuit. The second retention circuit has a function of storing the data stored in the fourth register. The fourth register has a function of reading data stored in the second retention circuit. The first retention circuit and the second retention circuit have a function of retaining the stored data while power supply to the register is stopped. The second controller has a function of instructing the first retention circuit in timing of storing the data stored in the third register, and instructing the second retention circuit in timing of storing the data stored in the fourth register.

In the above embodiment, the second controller has a function of instructing the first retention circuit in timing of storing the data stored in the third register and instructing the second retention circuit in timing of storing the data stored in the fourth register on the basis of the second signal generated by the third controller and current consumption of the frame memory.

In the above embodiment, the first retention circuit includes a first transistor and a first capacitor and the second retention circuit includes a second transistor and a second capacitor. The first transistor controls charge and discharge of the first capacitor. The second transistor controls charge and discharge of the second capacitor. The first transistor and the second transistor each include a metal oxide in a channel formation region.

In the above embodiment, the second controller includes a product-sum operation circuit with an analog memory.

In the above embodiment, a transistor with which the analog memory is configured includes a metal oxide in a channel formation region.

One embodiment of the present invention is the semiconductor device according to the above embodiment in which the frame memory includes a plurality of memory cells and the memory cells each include a third transistor and a third capacitor. The third transistor controls charge and discharge of the third capacitor. The third transistor includes a metal oxide in a channel formation region.

One embodiment of the present invention can provide a novel semiconductor device. One embodiment of the present invention can provide a novel semiconductor device with low power consumption.

One embodiment of the present invention can provide a display device including the novel semiconductor device. One embodiment of the present invention can provide an electronic device using the display device including the novel semiconductor device.

Note that the effects of one embodiment of the present invention are not limited to the above effects. The effects described above do not preclude the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the above effects in some cases.

BRIEF DESCRIPTION OF THE DRAWINGS

In the accompanying drawings:

FIGS. 5A and 5B are block diagrams illustrating a configuration example of a frame memory;

DETAILED DESCRIPTION OF THE INVENTION

Figure 1:
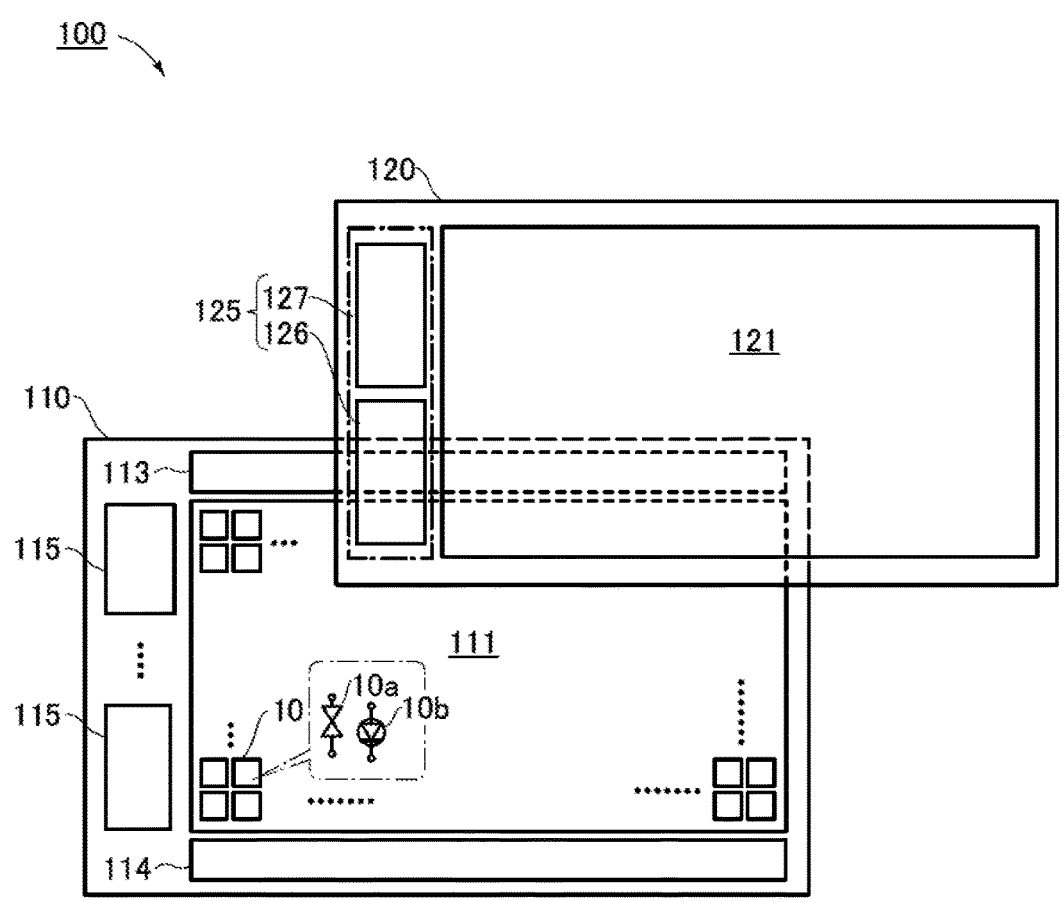
FIG. 1 is a block diagram illustrating a configuration example of a display device.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments. Any of the embodiments described below can be combined as appropriate.

Note that a controller IC described in embodiments is a semiconductor device including a transistor including silicon in a channel formation region, a transistor including an oxide semiconductor in a channel formation region, a capacitor, and the like. Thus, a controller IC can be referred to as a semiconductor device.

In the drawings, the size, the layer thickness, the region, or the like is sometimes exaggerated for clarity, and thus is not limited to the illustrated scale. The drawings are schematic views showing ideal examples, and shapes or values are not limited to those illustrated in the drawings.

In the drawings and the like, the same elements, elements having similar functions, elements formed of the same material, elements formed at the same time, and the like are sometimes denoted by the same reference numerals, and the description thereof is not repeated in some cases.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Note that in this specification and the like, the terms for describing arrangement such as "above" and "below" do not necessarily mean "directly above" and "directly below", respectively, in the description of a physical relationship between components. For example, the expression "a gate electrode over a gate insulating layer" can mean the case where there is an additional component between the gate insulating layer and the gate electrode.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly also includes the case where the angle is greater than or equal to 85° and less than or equal to 95°.

In this specification and the like, ordinal numbers such as "first", "second", and "third" are used in order to avoid confusion among components, and the terms do not limit the components numerically.

In this specification and the like, the term "electrically connected" includes the case where components are connected through an object having any electric function. There is no particular limitation on the "object having any electric function" as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

In this specification and the like, the term "voltage" often refers to a difference between a given potential and a reference potential (e.g., a ground potential). Accordingly, voltage, potential, and potential difference can also be referred to as potential, voltage, and voltage difference, respectively.

In this specification and the like, a transistor is an element having at least three terminals: a gate, a drain, and a source. The transistor has a channel region between a drain (a drain terminal, a drain region, or a drain electrode) and a source (a source terminal, a source region, or a source electrode), and current can flow between the source and the drain through the channel region. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be used interchangeably in this specification and the like.

Unless otherwise specified, off-state current in this specification and the like refers to drain current of a transistor in an off state (also referred to as a non-conducting state and a cutoff state). Unless otherwise specified, the off state of an n-channel transistor means that a gate voltage with respect to a source voltage ($V_{gs}$) is lower than the threshold voltage ($V_{th}$), and the off state of a p-channel transistor means that $V_{gs}$ is higher than $V_{th}$. That is, the off-state current of an n-channel transistor sometimes refers to a drain current that flows when the gate voltage with respect to the source voltage $V_{gs}$ is lower than the threshold voltage $V_{th}$.

In the above description of off-state current, a drain may be replaced with a source. That is, the off-state current sometimes refers to current that flows through a source of a transistor in the off state.

In this specification and the like, the term "leakage current" sometimes expresses the same meaning as "off-state current". In this specification and the like, the off-state current sometimes refers to a current that flows between a source and a drain when a transistor is off, for example.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. That is to say, a metal oxide that has at least one of an amplifying function, a rectifying function, and a switching function can be called a metal oxide semiconductor, or OS for short. An OS transistor or an OS FET refers to a transistor including a metal oxide or an oxide semiconductor.

Embodiment 1

Described in this embodiment is a hybrid display device in which a reflective element and a light-emitting element are provided in each pixel. In particular, a controller IC of the display device will be described. Note that liquid crystals, electronic paper, or the like can be used for the reflective element. In the description below, the reflective element and the light-emitting element are referred to as a reflective element 10a and a light-emitting element 10b, respectively.

<<Display Device>>

FIG. 1 is a block diagram illustrating a configuration example of a display device. The display device 100 includes a display unit 110 and a touch sensor unit 120.

<Display Unit>

The display unit 110 includes a pixel array 111, a gate driver 113, a gate driver 114, and a controller IC 115.

The pixel array 111 includes a plurality of pixels 10. Each of the pixels 10 is an active element driven by a transistor. Each of the pixels 10 includes the reflective element 10a and the light-emitting element 10b. A more specific structure example of the pixel array 111 will be described in Embodiment 2.

The gate driver 113 has a function of driving a gate line for selecting the reflective element 10a. The gate driver 114 has a function of driving a gate line for selecting the light-emitting element 10b. The controller IC 115 includes a source driver that drives a source line supplying a data signal to the reflective element 10a and a source driver that drives a source line supplying a data signal to the light-emitting element 10b. The controller IC 115 has a function of collectively controlling the operation of the display device 100. The number of controller ICs 115 is determined depending on the number of pixels of the pixel array.

Although FIG. 1 illustrates an example in which the gate driver 113 and the gate driver 114 are integrated together with the pixel array 111 over the same substrate, the gate driver 113 and the gate driver 114 can be dedicated ICs. For another example, the gate driver 113 or the gate driver 114 may be incorporated in the controller IC 115.

The controller IC 115 is mounted by a chip on glass (COG) method here; however, there is no particular limitation on the mounting method. A chip on flexible (COF) method, a tape automated bonding (TAB) method, or the like may be employed. The same applies to a method for mounting an IC on the touch sensor unit 120.

A transistor used for the pixel 10 is an OS transistor, which has a lower off-state current than a Si transistor.

The OS transistor preferably includes a metal oxide in a channel formation region. The metal oxide used for the OS transistor preferably contains at least one of indium (In) and zinc (Zn).

Typical examples of such oxide include In-M-Zn oxide, In-M oxide, Zn-M oxide, and In—Zn oxide (the element M is aluminum (Al), gallium (Ga), yttrium (Y), tin (Sn), boron (B), silicon (Si), titanium (Ti), iron (Fe), nickel (Ni), germanium (Ge), zirconium (Zr), molybdenum (Mo), lanthanum (La), cerium (Ce), neodymium (Nd), vanadium (V), beryllium (Be), hafnium (Hf), tantalum (Ta), or tungsten (W), for example). In the OS transistor, the off-state current per micrometer of a channel length can be as small as approximately greater than or equal to 1 yA/μm (y represents yocto and denotes a factor of $10^{-24}$) and less than or equal to 1 zA/μm (z represents zepto and denotes a factor of $10^{-21}$).

It is preferable to use cloud-aligned composite (CAC) OS for the OS transistor. Note that the details of the CAC-OS will be described in Embodiment 6.

The transistor used for the pixel 10 does not necessarily be an OS transistor as long as its off-state current is low. For example, a transistor including a wide-bandgap semiconductor may be used. In some cases, the wide-bandgap semiconductor refers to a semiconductor with a bandgap of 2.2 eV or greater. Examples of the wide-bandgap semiconductor materials include silicon carbide, gallium nitride, and diamond.

By using the transistor having a low off-state current for the pixel 10, the gate driver 113, the gate driver 114, and the source driver can be temporarily stopped (the temporary stop is referred to as "idling stop" or "IDS driving", as described above) in the case where rewriting of a display screen is not necessary, that is, a still image is displayed. Power consumption of the display device 100 can be reduced by IDS driving.

<Touch Sensor Unit>

The touch sensor unit 120 in FIG. 1 includes a sensor array 121 and a peripheral circuit 125. The peripheral circuit 125 includes a touch sensor driver ("TS driver") 126 and a sensing circuit 127. The peripheral circuit 125 can be composed of a dedicated IC.

Figure 2:
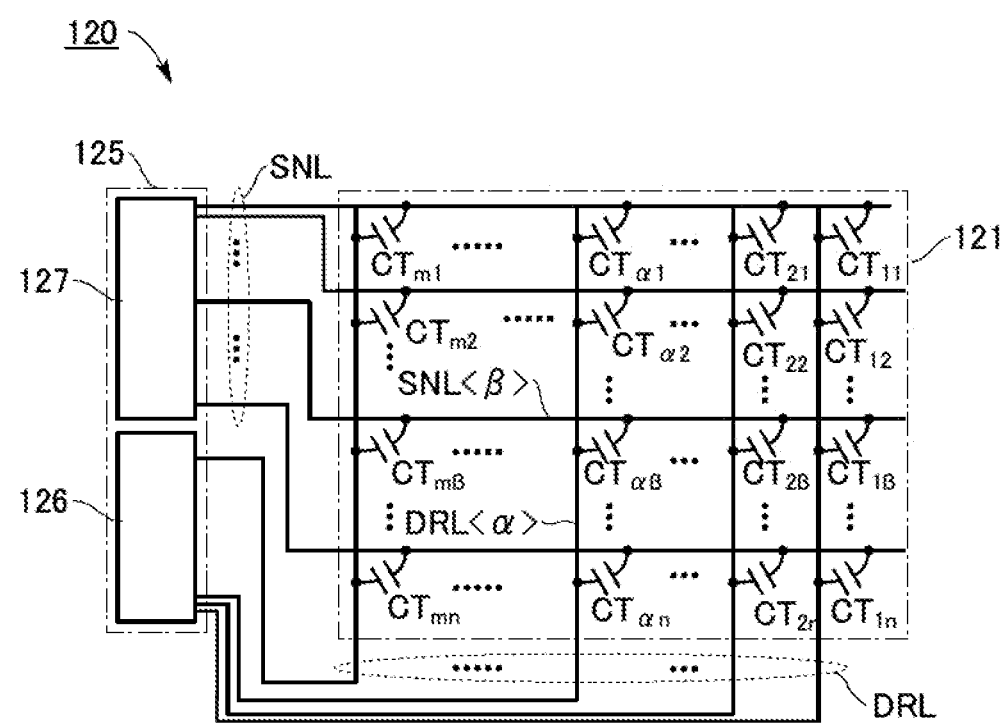
FIG. 2 illustrates a configuration example of a touch sensor unit.

FIG. 2 illustrates a configuration example of the touch sensor unit 120. Here, the touch sensor unit 120 is a mutual capacitive touch sensor unit as an example. The sensor array 121 includes m wirings DRL and n wirings SNL, where m is an integer greater than or equal to 1 and n is an integer greater than or equal to 1. The wiring DRL is a driving line, and the wiring SNL is a sensing line. Here, the α-th wiring DRL (α is an integer greater than or equal to 1 and less than or equal to m) is referred to as the wiring DRL<α>, and the β-th wiring SNL (β is an integer greater than or equal to 1 and less than or equal to n) is referred to as the wiring SNL<β>. A capacitor $CT_{\alpha\beta}$ refers to a capacitor formed between the wiring DRL<α> and the wiring SNL<β>.

The m wirings DRL are electrically connected to the TS driver 126. The TS driver 126 has a function of driving the wirings DRL. The n wirings SNL are electrically connected to the sensing circuit 127. The sensing circuit 127 has a function of sensor signals of the wirings SNL. A signal of the wiring SNL<β> at the time when the wiring DRL<α> is driven by the TS driver 126 includes information on the amount of change in capacitance of the capacitor $CT_{\alpha\beta}$. By analyzing signals of n wirings SNL, information on the presence or absence of touch, the touch position, and the like can be obtained.

<<Controller IC>>

Figure 3:
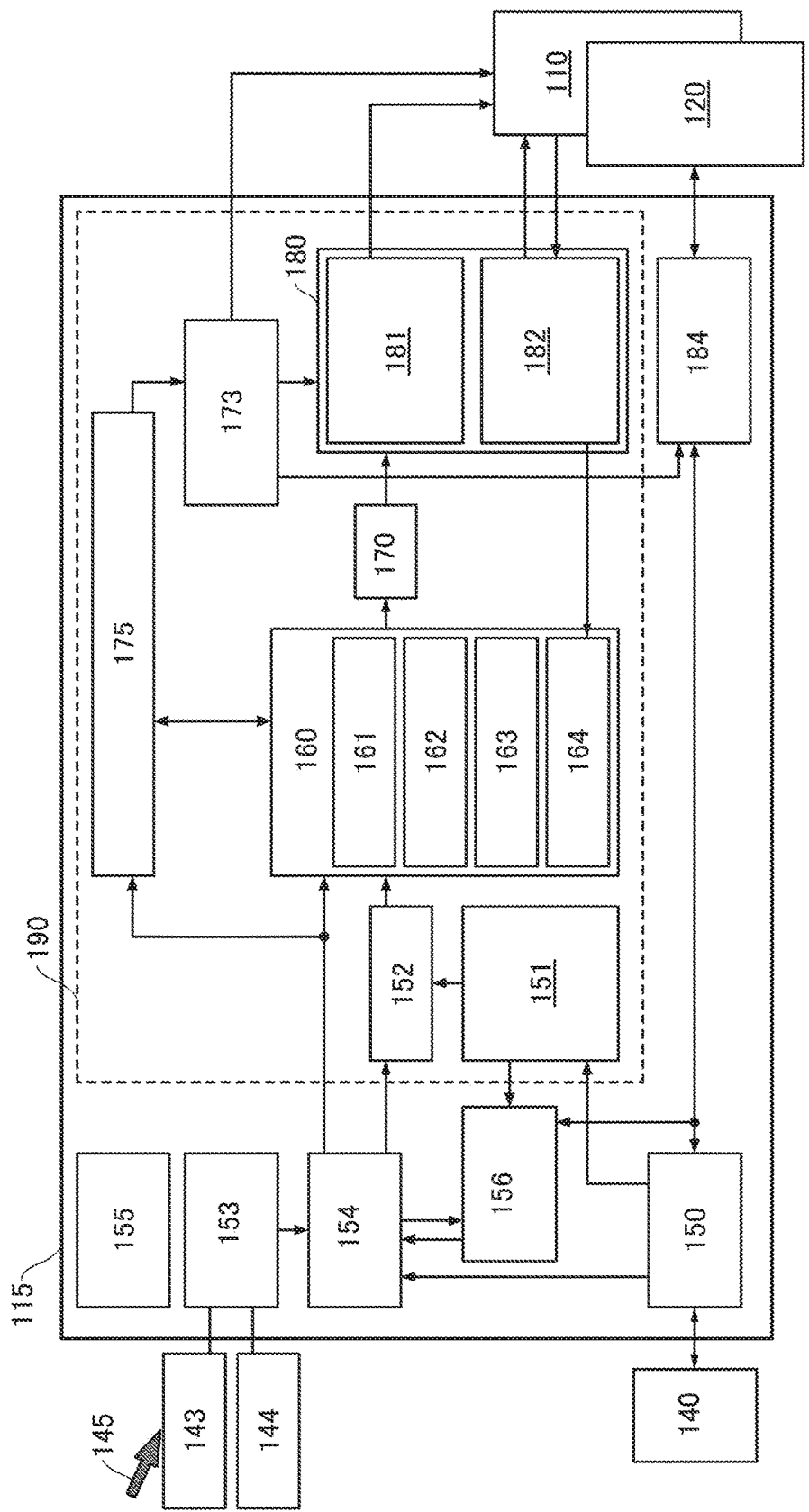
FIG. 3 is a block diagram illustrating a configuration example of a controller IC.

FIG. 3 is a block diagram illustrating a configuration example of the controller IC 115. The controller IC 115 includes an interface 150, a frame memory 151, a decoder 152, a sensor controller 153, a controller 154, an AI controller 156, a clock generation circuit 155, an image processing portion 160, a memory 170, a timing controller 173, a register 175, a source driver 180, and a touch sensor controller 184.

The source driver 180 includes a source driver 181 and a source driver 182. The source driver 181 is a driver for driving the reflective element 10a. The source driver 182 is a driver for driving the light-emitting element 10b. The reflective element 10a and the light-emitting element 10b, which are driven by the controller IC, are a liquid crystal (LC) element and an organic electroluminescent (organic EL) element, respectively, in this example.

Communication between the controller IC 115 and a host 140 is performed through the interface 150. Image data, a variety of control signals, and the like are transmitted from the host 140 to the controller IC 115. Information on a touch position or the like obtained by the touch sensor controller 184 is transmitted from the controller IC 115 to the host 140. Note that the decision whether the circuits included in the controller IC 115 are chosen or not is made as appropriate depending on the standard of the host 140, the specifications of the display device 100, and the like.

The frame memory 151 is a memory for storing the image data input to the controller IC 115. In the case where compressed image data is transmitted from the host 140, the frame memory 151 can store the compressed image data. The decoder 152 is a circuit for decompressing the compressed image data. When decompression of the image data is not needed, processing is not performed in the decoder 152. Alternatively, the decoder 152 can be provided between the frame memory 151 and the interface 150.

The image processing portion 160 has a function of performing various kinds of image processing on image data. For example, the image processing portion 160 includes a gamma correction circuit 161, a dimming circuit 162, a toning circuit 163, and an EL correction circuit 164.

The EL correction circuit 164 is provided in the case where the source driver 182 is provided with a current detection circuit that detects current flowing through the light-emitting element 10b. The EL correction circuit 164 has a function of adjusting luminance of the light-emitting element 10b on the basis of a signal transmitted from the current detection circuit of the source driver 182.

The image data processed in the image processing portion 160 is output to the source driver 180 through the memory 170. The memory 170 is a memory for temporarily storing image data. The source driver 181 and the source driver 182 each have a function of processing the input image data and writing the image data to the source line of the pixel array 111.

The timing controller 173 has a function of generating timing signals to be used in the source driver 180, the touch sensor controller 184, and the gate drivers 113 and 114 of the display unit 110.

The touch sensor controller 184 has a function of controlling the TS driver 126 and the sensing circuit 127 of the touch sensor unit 120. A signal including touch information read from the sensing circuit 127 is processed in the touch sensor controller 184 and transmitted to the host 140 through the interface 150. The host 140 generates image data reflecting the touch information and transmits the image data to the controller IC 115. Note that the controller IC 115 can reflect the touch information in the image data.

The clock generation circuit 155 has a function of generating a clock signal to be used in the controller IC 115. The controller 154 has a function of processing a variety of control signals transmitted from the host 140 through the interface 150 and controlling a variety of circuits in the controller IC 115. The controller 154 also has a function of controlling power supply to the variety of circuits in the controller IC 115. Hereinafter, temporary stop of power supply to a circuit that is not used is referred to as power gating. Note that a power supply line is omitted in FIG. 3.

The AI controller 156 provides a timing instruction to perform preparation operation for power gating. The AI controller 156 performs arithmetic processing using neural networks, and can predict when to switch into power gating on the basis of the current consumption of the frame memory 151, the touch information from the touch sensor controller 184, and the like. The details thereof will be described later.

The register 175 stores data used for the operation of the controller IC 115. The data stored in the register 175 includes a parameter used to perform correction processing in the image processing portion 160, parameters used to generate waveforms of a variety of timing signals in the timing controller 173, and the like. The register 175 is provided with a scan chain register including a plurality of registers.

The sensor controller 153 is electrically connected to an optical sensor 143. The optical sensor 143 senses external light 145 and generates a sensor signal. The sensor controller 153 generates a control signal on the basis of the sensor signal. The control signal generated in the sensor controller 153 is output to the controller 154, for example.

In the case where the reflective element 10a and the light-emitting element 10b display the same image data, the image processing portion 160 has a function of separately generating image data that the reflective element 10a displays and image data that the light-emitting element 10b displays. In that case, the reflection intensity of the reflective element 10a and the emission intensity of the light-emitting element 10b can be adjusted in response to brightness of the external light 145 measured using the optical sensor 143 and the sensor controller 153. Here, the adjustment is referred to as dimming or dimming treatment. In addition, a circuit that performs the dimming treatment is referred to as a dimming circuit.

In the case where the display device 100 is used outside at daytime on a sunny day, it is not necessary to make the light-emitting element 10b emit light if sufficient luminance can be obtained only with the reflective element 10a. This is due to the fact that favorable display cannot be obtained because, even when the light-emitting element 10b is used to perform display, external light exceeds light emitted from the light-emitting element 10b. In contrast, in the case where the display device 100 is used at night or in a dark place, display is performed by making the light-emitting element 10b emit light.

In response to the brightness of external light, the image processing portion 160 can generate image data that only the reflective element 10a displays, image data that only the light-emitting element 10b displays, or image data that the reflective element 10a and the light-emitting element 10b display in combination. The display device 100 can perform favorable display even in an environment with bright external light or an environment with weak external light. Furthermore, power consumption can be reduced by making the light-emitting element 10b emit no light or reducing the luminance of the light-emitting element 10b in the environment with bright external light.

Color tones can be corrected by combining the display by the light-emitting element 10b with the display by the reflective element 10a. A function of measuring the color tones of the external light 145 may be added to the optical sensor 143 and the sensor controller 153 to perform such tone correction. For example, in the case where the display device 100 is used in a reddish environment at dusk, a blue (B) component is not sufficient only with the display by the reflective element 10a; thus, a blue (B) pixel of the light-emitting element 10b is made to emit light to correct the color tones. Here, the correction is referred to as toning or toning treatment. In addition, a circuit that performs the toning treatment is referred to as a toning circuit.

The image processing portion 160 might include another processing circuit such as an RGB-RGBW conversion circuit depending on the specifications of the display device 100. The RGB-RGBW conversion circuit has a function of converting image data of red, green, and blue (RGB) into image data of red, green, blue, and white (RGBW). That is, in the case where the display device 100 includes pixels of four colors of RGBW, power consumption can be reduced by displaying a white (W) component in the image data using the white (W) pixel. Note that the image processing portion 160 may include, for example, an RGB-RGBY (red, green, blue, and yellow) conversion circuit, instead of the RGB-RGBW conversion circuit.

The reflective element 10a and the light-emitting element 10b can display different image data. In general, operation speed of liquid crystal, electronic paper, or the like that can be used as a reflective element is low in many cases (it takes time to display a picture). Thus, a still image to be a background can be displayed on the reflective element 10a and a moving mouse pointer or the like can be displayed on the light-emitting element 10b. By performing the above IDS driving on a still image and making the light-emitting element 10b emit light to display a moving image, the display device 100 can achieve display of a smooth moving image and reduction of power consumption at the same time. In that case, the frame memory 151 may be provided with regions for storing image data displayed on the reflective element 10a and image data displayed on the light-emitting element 10b.

<Parameter>

Image correction processing such as gamma correction, dimming, or toning corresponds to processing of generating output correction data Y with respect to input image data X. The parameter that the image processing portion 160 uses is a parameter for converting the image data X into the correction data Y.

Figure 4A:
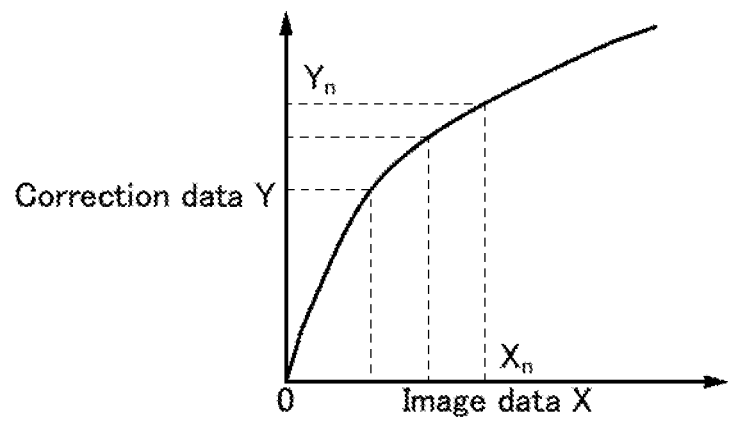
FIGS. 4A to 4C each explain a parameter.
Figure 4B:
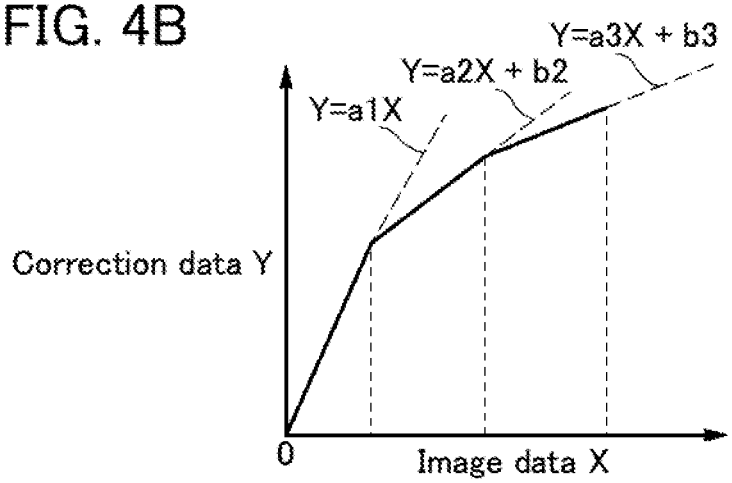

As a parameter setting method, there are a table method and a function approximation method. In a table method explained in FIG. 4A, correction data $Y_n$ with respect to image data $X_n$ is stored in a table as a parameter. In the table method, a number of registers for storing the parameters that correspond to the table is necessary; however, correction can be performed with high degree of freedom. In contrast, in the case where the correction data Y with respect to the image data X can be empirically determined in advance, it is effective to employ a function approximation method as explained in FIG. 4B. Note that a1, a2, b2, and the like are parameters. Although a method of performing linear approximation in every period is shown here, a method of performing approximation with a nonlinear function can be employed. In the function approximation method, correction is performed with low degree of freedom; however, the number of registers for storing parameters that defines a function can be small.

Figure 4C:
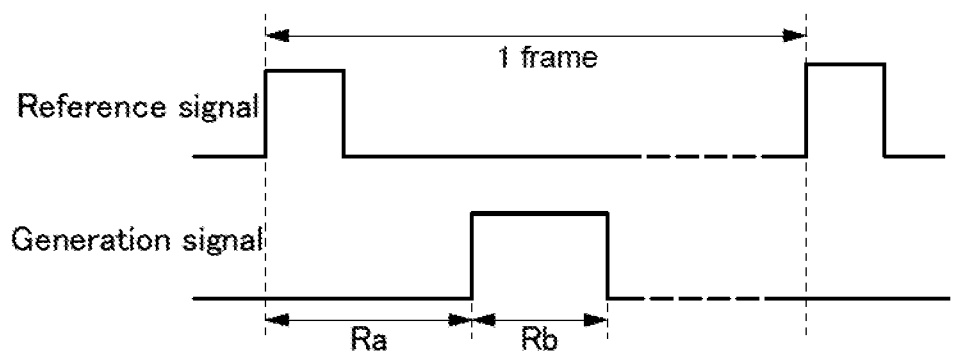

The parameter that the timing controller 173 uses indicates timing at which a generation signal of the timing controller 173 becomes "L" (or "H") with respect to a reference signal as explained in FIG. 4C. A parameter Ra (or Rb) indicates the number of clock cycles that corresponds to timing at which the parameter becomes "L" (or "H") with respect to the reference signal.

The above parameter for correction can be stored in the register 175. Other parameters that can be stored in the register 175 include data of the EL correction circuit 164, luminance, color tones, and setting of energy saving (time taken to make display dark or turn off display) of the display device 100 which are set by an user, sensitivity of the touch sensor controller 184, and the like.

<Power Gating>

In the case where image data transmitted from the host 140 is not changed, the controller 154 can power gate some circuits in the controller IC 115. Specifically, for example, the circuits are circuits in a region 190 (the frame memory 151, the decoder 152, the image processing portion 160, the memory 170, the timing controller 173, the register 175, and the source driver 180). Power gating can be performed in the case where a control signal that indicates no change in the image data is transmitted from the host 140 to the controller IC 115 and detected by the controller 154.

The circuits in the region 190 are the circuits relating to image data and the circuits for driving the display unit 110; therefore, the circuits in the region 190 can be temporarily stopped in the case where the image data is not changed. Note that even when the image data is not changed, time during which the transistor used for the pixel 10 can store data (time during which idling stop can be performed) and time during which inversion driving is performed to prevent burn-in of a liquid crystal (LC) element used as the reflective element 10a may be considered.

For example, the controller 154 may be incorporated with a timer function so as to determine timing at which power supply to the circuits in the region 190 is restarted, on the basis of time measured by a timer. Note that it is possible to store image data in the frame memory 151 or the memory 170 in advance and supply the image data to the display unit 110 at inversion driving. With such a structure, inversion driving can be performed without transmitting the image data from the host 140. Thus, the amount of data transmitted from the host 140 can be reduced and power consumption of the controller IC 115 can be reduced.

To perform power gating, the register 175 needs to perform preparation operation of storing (saving) data into a nonvolatile register, which does not lose data even when power supply is stopped. It is preferable to perform the preparation operation immediately before the image data stops changing because this allows a long period for power gating. The AI controller 156 predicts when to switch into power gating and provides a timing instruction to perform the preparation operation.

Specific circuit configurations of the frame memory 151 and the register 175 will be described below. Note that the circuits that can be power gated are not limited to the circuits in the region 190, the sensor controller 153, the touch sensor controller 184, and the like, which are described here. A variety of combinations can be considered depending on the configuration of the controller IC 115, the standard of the host 140, the specifications of the display device 100, and the like.

<Frame Memory 151>

FIG. 5A illustrates a configuration example of the frame memory 151. The frame memory 151 includes a control portion 202, a cell array 203, and a peripheral circuit 208. The periphery circuit 208 includes a sense amplifier circuit 204, a driver 205, a main amplifier 206, and an input output circuit 207.

The control portion 202 has a function of controlling the frame memory 151. For example, the control portion 202 controls the driver 205, the main amplifier 206, and the input output circuit 207.

The driver 205 is electrically connected to a plurality of wirings WL and CSEL. The driver 205 generates signals output to the plurality of wirings WL and CSEL.

The memory cell array 203 includes a plurality of memory cells 209. The memory cells 209 are electrically connected to wirings WL, LBL (or LBLB), and BGL. The wiring WL is a word line. The wirings LBL and LBLB are local bit lines. Although a folded-bit-line method is employed for the configuration of the cell array 203 in the example of FIG. 5A, an open-bit-line method can also be employed.

FIG. 5B illustrates a configuration example of a memory cell 209. The memory cell 209 includes a transistor NW1 and a capacitor CS1. The memory cell 209 has a circuit configuration similar to that of a memory cell for a dynamic random access memory (DRAM). The transistor NW1 in this example is a transistor having a back gate. The backgate of the transistor NW1 is electrically connected to a wiring BGL. A voltage Vbg_w1 is input to the wiring BGL.

The transistor NW1 is an OS transistor. Since an OS transistor has an extremely low off-state current, the frequency of refresh operation of the frame memory 151 can be reduced because leakage of charge from the capacitor CS1 can be suppressed by forming the memory cell 209 using an OS transistor. The frame memory 151 can retain image data for a long time even when power supply is stopped. Moreover, by setting the voltage Vbg_w1 to a negative voltage, the threshold voltage of the transistor NW1 can be shifted to the positive potential side and thus the retention time of the memory cell 209 can be increased.

Here, an off-state current refers to a current that flows between a source and a drain of a transistor in an off state. In the case of an n-channel transistor, for example, when the threshold voltage of the transistor is approximately 0 V to 2 V, a current flowing between a source and a drain when a voltage of a gate with respect to the source is negative can be referred to as an off-state current. An extremely low off-state current means that, for example, an off-state current per micrometer of channel width is lower than or equal to 100 zA (z represents zepto and denotes a factor of $10^{-21}$). Since the off-state current is preferably as low as possible, the normalized off-state current is preferably lower than or equal to 10 zA/μm or lower than or equal to 1 zA/μm), further preferably lower than or equal to 10 yA/μm (y represents yocto and denotes a factor of $10^{-24}$).

The transistors NW1 in the plurality of memory cells 209 included in the cell array 203 are OS transistors; thus, Si transistors formed over a silicon wafer can be used as transistors in other circuits, for example. Accordingly, the cell array 203 can be stacked over the sense amplifier circuit 204. Thus, the circuit area of the frame memory 151 can be reduced, which leads to miniaturization of the controller IC 115.

The cell array 203 is stacked over the sense amplifier circuit 204. The sense amplifier circuit 204 includes a plurality of sense amplifiers SA. The sense amplifiers SA are electrically connected to adjacent wirings LBL and LBLB (a pair of local bit lines), wirings GBL and GBLB (a pair of global bit lines), and the plurality of wirings CSEL. The sense amplifiers SA have a function of amplifying the potential difference between the wirings LBL and LBLB.

In the sense amplifier circuit 204, one wiring GBL is provided for four wirings LBL, and one wiring GBLB is provided for four wirings LBLB. However, the configuration of the sense amplifier circuit 204 is not limited to the configuration example of FIG. 5A.

The main amplifier 206 is connected to the sense amplifier circuit 204 and the input output circuit 207. The main amplifier 206 has a function of amplifying the potential difference between the wirings GBL and GBLB. The main amplifier 206 is not necessarily provided.

The input/output circuit 207 has a function of outputting a potential corresponding to write data to the wirings GBL and GBLB or the main amplifier 206 and a function of outputting the potentials of the wirings GBL and GBLB or an output potential of the main amplifier 206 to the outside as read data. The sense amplifier SA from which data is read and the sense amplifier SA to which data is written can be selected in accordance with the signal of the wiring CSEL. Therefore, there is no need to provide a selection circuit such as a multiplexer in the input/output circuit 207. Thus, the input/output circuit 207 can have a simple circuit configuration and occupy a small area.

<Register 175>

Figure 6:
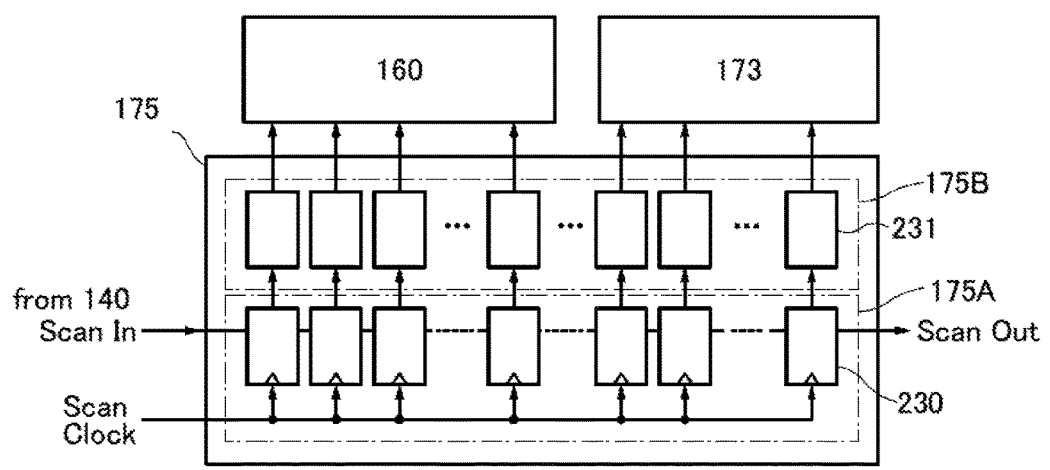
FIG. 6 is a block diagram illustrating a configuration example of a register.

FIG. 6 is a block diagram illustrating a configuration example of the register 175. The register 175 includes a scan chain register portion 175A and a register portion 175B. The scan chain register portion 175A includes a plurality of registers 230. The scan chain register is formed by the plurality of registers 230. The register portion 175B includes a plurality of registers 231.

The register 230 is a nonvolatile register which does not lose data even when power supply is stopped. Here, the register 230 is provided with a retention circuit including an OS transistor to be nonvolatile.

The other register 231 is a volatile register. There is no particular limitation on the circuit configuration of the register 231, and a latch circuit, a flip-flop circuit, or the like is used as long as data can be stored. The image processing portion 160 and the timing controller 173 access the register portion 175B and take data from the corresponding registers 231. Alternatively, the processing contents of the image processing portion 160 and the timing controller 173 are controlled in accordance with data supplied from the register portion 175B.

To update data stored in the register 175, first, data in the scan chain register portion 175A are changed. After the data in the registers 230 of the scan chain register portion 175A are rewritten, the data are loaded into the registers 231 of the register portion 175B at the same time.

Accordingly, the image processing portion 160, the timing controller 173, and the like can perform various kinds of processing using the data which are updated at the same time. The operation of the controller IC 115 can be stable because simultaneity can be maintained in updating data. By providing the scan chain register portion 175A and the register portion 175B, data in the scan chain register portion 175A can be updated even during the operation of the image processing portion 160 and the timing controller 173.

At the time when the controller IC 115 is power gated, power supply is stopped after data is stored (saved) in the retention circuit of the register 230. After the power supply is restored, normal operation is restarted after data in the registers 230 are restored (loaded) in the register 231. Note that in the case where the data stored in the register 230 and the data stored in the register 231 do not match each other, it is preferable to save the data of the register 231 in the register 230 and then store the data again in the retention circuit of the register 230. For example, while updated data is being inserted in the scan chain register portion 175A, the data do not match each other.

Figure 7:
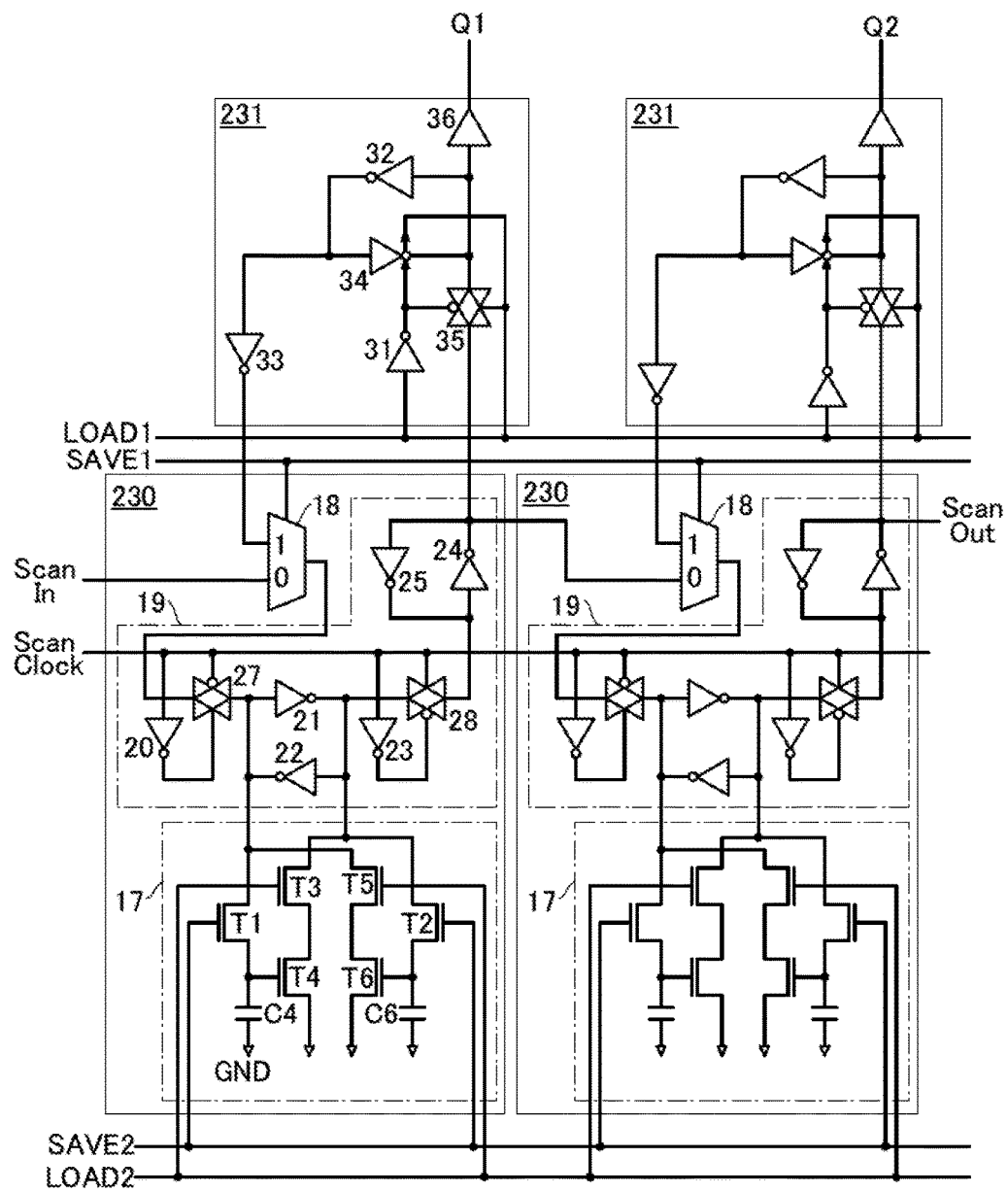
FIG. 7 is a circuit diagram illustrating a configuration example of a register.

FIG. 7 illustrates an example of a circuit configuration of the register 230 and the register 231. FIG. 7 illustrates two registers 230 of the scan chain register portion 175A and corresponding two registers 231. A signal Scan In is input to the register 230, and the register 230 outputs a signal Scan Out.

The register 230 includes a retention circuit 17, a selector 18, and a flip-flop circuit 19. The selector 18 and the flip-flop circuit 19 form a scan flip-flop circuit. A signal SAVE1 is input to the selector 18.

A signal SAVE2 and a signal LOAD2 are input to the retention circuit 17. The retention circuit 17 includes a transistor T1, a transistor T2, a transistor T3, a transistor T4, a transistor T5, a transistor T6, a capacitor C4, and a capacitor C6. The transistor T1 and the transistor T2 are OS transistors. The transistor T1 and the transistor T2 may each be an OS transistor having a back gate, as with the transistor NW1 of the memory cell 209 (see FIG. 5B).

A 3-transistor gain cell is formed by the transistor T1, the transistor T3, the transistor T4, and the capacitor C4. In a similar manner, a 3-transistor gain cell is formed by the transistor T2, the transistor T5, the transistor T6, and the capacitor C6. The two gain cells store complementary data retained in the flip-flop circuit 19. Since the transistor T1 and the transistor T2 are OS transistors, the retention circuit 17 can retain data for a long time even when power supply is stopped. In the register 230, the transistors other than the transistor T1 and the transistor T2 may be formed using Si transistors.

The retention circuit 17 stores complementary data retained in the flip-flop circuit 19 in response to the signal SAVE2 and loads the retained data in the flip-flop circuit 19 in response to the signal LOAD2.

An output terminal of the selector 18 is electrically connected to an input terminal of the flip-flop circuit 19, and an input terminal of the register 231 is electrically connected to a data output terminal. The flip-flop circuit 19 includes an inverter 20, an inverter 21, an inverter 22, an inverter 23, an inverter 24, an inverter 25, an analog switch 27, and an analog switch 28. The on/off state of each of the analog switch 27 and the analog switch 28 is controlled by a scan clock signal. The flip-flop circuit 19 is not limited to the circuit configuration in FIG. 7 and a variety of flip-flop circuits 19 can be employed.

An output terminal of the register 231 is electrically connected to one of two input terminals of the selector 18, and an output terminal of the flip-flop circuit 19 in the previous stage is electrically connected to the other input terminal of the selector 18. Note that data is input from the outside of the register 175 to the input terminal of the selector 18 in the previous stage of the scan chain register portion 175A.

The register 231 includes an inverter 31, an inverter 32, an inverter 33, a clocked inverter 34, an analog switch 35, and a buffer 36. The register 231 loads the data of the flip-flop circuit 19 on the basis of a signal LOAD1. The transistors of the register 231 may be formed using Si transistors.

<Another Configuration Example of Controller IC>

Another configuration example of a controller IC will be described below.

Figure 8:
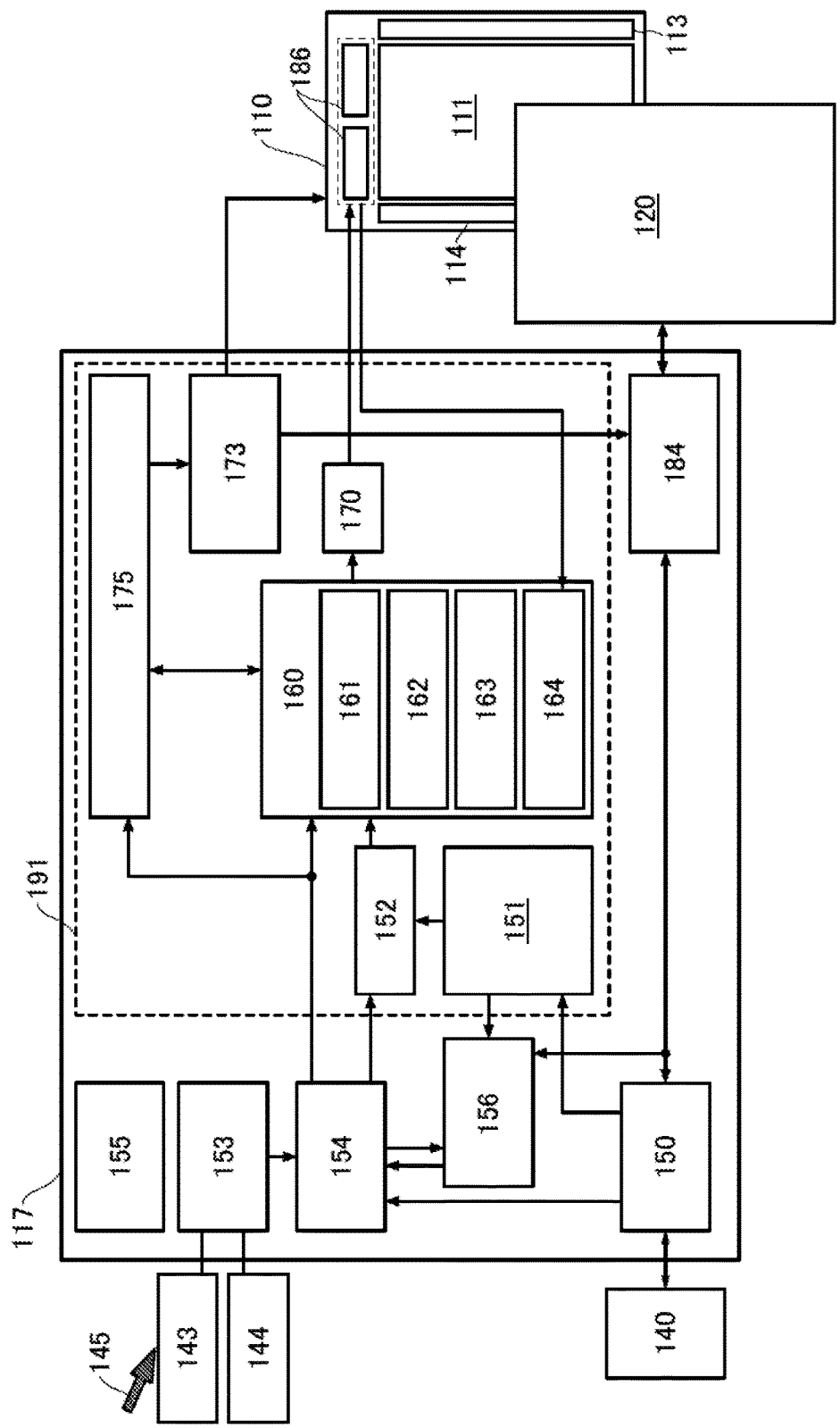
FIG. 8 is a block diagram illustrating a configuration example of a controller IC.

FIG. 8 illustrates a configuration example of a controller IC without a source driver. A controller IC 117 in FIG. 8 is a modification example of the controller IC 115 and includes a region 191. The controller 154 controls power supply to circuits in the region 191.

The region 191 is not provided with a source driver. Thus, the display unit 110 includes a source driver IC 186. The number of source driver ICs 186 is determined in accordance with the number of pixels of the pixel array 111.

The source driver IC 186 has a function of driving both the reflective element 10a and the light-emitting element 10b. Although the source driver is formed using only one kind of source driver IC 186, the configuration of the source driver is not limited thereto. For example, the source driver may be formed using a source driver IC for driving the reflective element 10a and a source driver IC for driving the light-emitting element 10b.

Similar to the gate driver 113 and the gate driver 114, the source drivers may be formed over a substrate of the pixel array 111.

The controller IC 117 may be provided with one or both of the TS driver 126 and the sensing circuit 127. The same applies to the controller IC 115.

<<Operation Examples>>

Operation examples of the controller IC 115 and the register 175 of the display device 100 before shipment, at boot-up of an electronic device including the display device 100, and at normal operation will be described separately.

<Before Shipment>

Parameters relating to the specifications and the like of the display device 100 are stored in the register 175 before shipment. These parameters include, for example, the number of pixels, the number of touch sensors, parameters used to generate waveforms of the variety of timing signals in the timing controller 173, and correction data of the EL correction circuit 164 in the case where the source driver 182 is provided with the current detection circuit that detects current flowing through the light-emitting element 10b. These parameters may be stored by providing a dedicated ROM other than the register 175.

<At Boot-Up>

At boot-up of an electronic device including the display device 100, the parameters set by an user or the like which are transmitted from the host 140 are stored in the register 175. These parameters include, for example, luminance, color tones, sensitivity of a touch sensor, setting of energy saving (time taken to make display dark or turn off display), and a curve or a table for gamma correction. Note that in storing the parameters in the register 175, a scan clock signal and data corresponding to the parameters in synchronization with the scan clock signal are transmitted from the controller 154 to the register 175.

<Normal Operation>

Normal operation can be classified into a state of displaying a moving image or the like, a state capable of performing IDS driving while a still image is displaying, a state of displaying no image, and the like. The image processing portion 160, the timing controller 173, and the like are operating in the state of displaying a moving image or the like; however, the image processing portion 160 and the like are not influenced because only the data of the register 175 in the scan chain register portion 175A are changed. After the data of the scan chain register portion 175A are changed, the data of the scan chain register portion 175A are loaded in the register portion 175B at the same time, so that change of the data of the register 175 is completed. The operation of the image processing portion 160 and the like is switched to the operation corresponding to the data.

In the state capable of performing IDS driving while a still image is displaying, the register 175 can be power gated in a manner similar to that of the other circuits in the region 190. In that case, the complementary data retained in the flip-flop circuit 19 is stored in the retention circuit 17 in response to the signal SAVE2 before the power gating in the register 230 included in the scan chain register portion 175A.

The AI controller 156 provides a timing instruction to store the complementary data retained in the flip-flop circuit 19 into the retention circuit 17 (the preparation operation for power gating). Power gating can be performed when the image data does not change; immediately before the image data ceases to change, some characteristic events and behavior can be found with regard to an area where the image data is rewritten, input to the touch sensor unit 120, and the like.

For example, in the case where there is no input to the touch sensor unit 120 and the area where the image data is rewritten are decreased, it is predicted that the image data will be about to cease to change. For example, in the case where there is an input to the touch sensor unit 120, it is predicted that the image data will continue to change for a while before it ceases to change.

Specifically, in the case where a tap or a double tap, which is corresponding to a click with a mouse, is performed, it is predicted that, following the processing operation by application software and the completion of image display, the image data will cease to change. A drag is an operation for moving an image; thus, it is predicted that after a drag, image display will be completed relatively quickly, and then the image data will cease to change. In the case of a touch panel, a flick is an operation for scrolling image and turning pages; thus, it is predicted that during flick operation, an image will be changed in a large area for a while, and then the image data will cease to change. A pinch-in and a pinch-out are an input with two points or more, and an operation for enlarging or shrinking an image; thus, it is predicted that after a pinch-in and a pinch-out, an image will be changed in a large area, and then the image data will cease to change relatively soon. After such operations, a user of the display device 100 is expected to check the image for a while; thus, it can be predicted that there will be a period in which image data does not change.

Regarding input to the touch sensor unit 120, the touch information from the touch sensor controller 184 provides the number of input points, the movement of coordinates, the speed of the movement, and the like. Regarding the area where the image data is rewritten, the data retained in the frame memory 151 may be directly compared with the data to be rewritten, or the current consumption of the frame memory 151 may be measured. This is because the current consumption of the frame memory 151 becomes large when data different from the retained data is written thereto.

For example, there is a method for measuring the instantaneous current consumption and the average current consumption of the frame memory 151. The memory cells 209 of the frame memory 151 are sequentially scanned with word lines (wirings WL); when the memory cell 209 that retains image data to be rewritten is selected, charge different from charge retained in the capacitor CS1 is injected via local bit lines (wirings LBL and LBLB), and thus the current consumption of the frame memory 151 is instantaneously increased (see FIGS. 5A and 5B). That is, from the viewpoint of instantaneous current consumption, there are two types of current consumption: current consumption when the memory cell 209 that is subjected to data rewriting is selected, and current consumption when the memory cell 209 that is not subjected to be rewritten is selected (hereinafter referred to as rewriting current consumption and steady-state current consumption, respectively).

Meanwhile, the current consumption averaged with a capacitor, a coil, and the like exhibits a value between the above-described rewriting current consumption and steady-state current consumption (the averaging is performed for a period of one frame or more). When the number of the memory cells 209 that are subjected to data rewriting is large, many of the instantaneous current consumption values have the value of the rewriting current consumption and thus the average current consumption approaches the rewriting current consumption. When the number of memory cells 209 that are not subjected to data rewriting is large, many of the instantaneous current consumption values have the value of the steady-state current consumption, and thus the average current consumption approaches the steady-state current consumption. Approach of the average current consumption to the steady-state current consumption suggests that the area where the image data is to be rewritten is decreased.

In this manner, the AI controller 156 can provide a timing instruction to perform preparation operation for power gating on the basis of the current consumption of the frame memory 151, the touch information obtained from the touch sensor controller 184, and the like. Subsequently, when the image data is confirmed to have no change, the controller 154 performs power gating of part of circuits in the controller IC 115 and the display device 100 performs IDS driving.

In practice, even when the AI controller 156 provides an instruction to perform preparation operation for power gating, the image data does not cease to change and power gating is unable to be performed in some cases. In this case, performing the preparation operation increases the power consumption of the controller IC 115. Thus, to increase the success rate of power gating, the AI controller 156 performs arithmetic processing using a neural network. For example, how much the average current consumption should approach the steady-state current consumption is used as a parameter to determine the timing of performing preparation operation for power gating. Here, for the parameter, a predetermined value is not used; instead, the parameter is set to be variable to some extent with the use of learning with a neural network. The details of the neural network will be described in Embodiment 4.

To restore the data retained in the retention circuit 17 from power gating, the data is loaded in the flip-flop circuit 19 in response to the signal LOAD2 and the data in the flip-flop circuit 19 is loaded in the register 231 in response to the signal LOAD1. In this manner, the data of the register 175 becomes effective in the same state as before the power gating. Note that even when the register 175 is in a state of power gating, the parameter of the register 175 can be changed by canceling the power gating in the case where change of the parameter is requested by the host 140.

In the state of displaying no image, for example, the circuits (including the register 175) in the region 190 can be power gated. In that case, the operation of the host 140 might also be stopped; however, when the data in the frame memory 151 and the register 175 are restored from the power gating, the frame memory 151 and the register 175 can perform display (a still image) before power gating without waiting the restore of the host 140 because they are nonvolatile.

For example, in the case where the display device 100 is employed for a display portion of a foldable information terminal, when the information terminal is folded and the display surface of the display device 100 is sensed to be unused by a signal from an open/close sensor 144, the sensor controller 153, the touch sensor controller 184, and the like can be power gated in addition to the circuits in the region 190.

When the information terminal is folded, the operation of the host 140 might be stopped depending on the standard of the host 140. Even when the information terminal is unfolded while the operation of the host 140 is stopped, the image data in the frame memory 151 can be displayed before image data, a variety of control signals, and the like are transmitted from the host 140 because the frame memory 151 and the register 175 are nonvolatile.

In such a manner, the register 175 includes the scan chain register portion 175A and the register portion 175B and data of the scan chain register portion 175A are changed, so that the data can be changed smoothly without influencing the image processing portion 160, the timing controller 173, and the like. Each register 230 in the scan chain register portion 175A includes the retention circuit 17 and can perform transfer to and restore from a power gated state smoothly.

Embodiment 2

In this embodiment, details of the display unit 110 described in Embodiment 1 will be described.

<Configuration Example of Display Panel>

Figure 9:
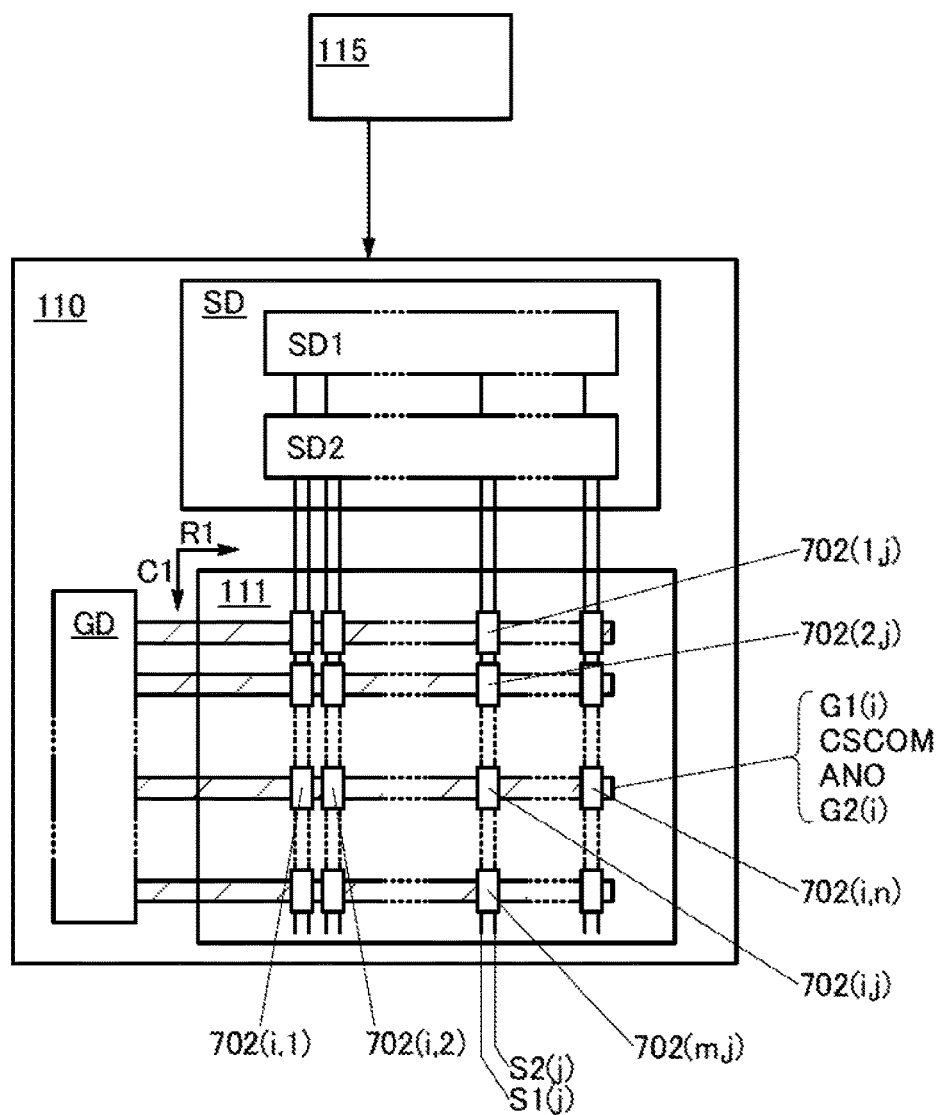
FIG. 9 is block diagram illustrating a configuration example of a display unit.

FIG. 9 is a block diagram illustrating a configuration example of the display unit 110.

The display unit 110 includes a pixel array 111. In addition, the display unit 110 can include a gate driver GD or a source driver SD.

<<Pixel Array 111>>

The pixel array 111 includes one group of pixels 702($i$,1) to 702($i$,$n$), another group of pixels 702(1,$j$) to 702($m$,$j$), a scan line G1($i$), and a scan line G2($i$). Moreover, the pixel array 111 includes a wiring CSCOM, a wiring ANO, and a signal line S2($j$). Note that i is an integer greater than or equal to 1 and less than or equal to m, and j is an integer greater than or equal to 1 and less than or equal to n. Note that i is an integer greater than or equal to 1 and less than or equal to m, j is an integer greater than or equal to 1 and less than or equal to n, and each of m and n is an integer greater than or equal to 1.

The one group of pixels 702($i$,1) to 702($i$,$n$) include the pixel 702($i$,$j$) and are provided in the row direction (the direction indicated by the arrow R1 in the drawing).

The another group of pixels 702(1,$j$) to 702($m$,$j$) include the pixel 702($i$,$j$) and are arranged in the column direction (the direction indicated by the arrow C1 in the drawing) that intersects the row direction.

The scan line G1($i$) and the scan line G2($i$) are electrically connected to the group of pixels 702($i$,1) to 702($i$,$n$) provided in the row direction.

The signal line S1($j$) and the signal line S2($j$) are electrically connected to the another group of the pixels 702(1,$j$) to 702($m$,$j$) arranged in the column direction.

<<Gate Driver GD>>

The gate driver GD has a function of supplying a selection signal in accordance with control information.

For example, the driver circuit GD has a function of supplying a selection signal to one scan line at a frequency of 30 Hz or higher, preferably 60 Hz or higher, in accordance with the control information. Accordingly, moving images can be smoothly displayed.

For example, the driver circuit GD has a function of supplying a selection signal to one scan line at a frequency lower than 30 Hz, preferably lower than 1 Hz, further preferably less than once per minute, in accordance with the control data. Accordingly, a still image can be displayed while flickering is suppressed.

<<Source Driver SD, Source Driver SD1, Source Driver SD2>>

The source driver SD includes a source driver SD1 and a source driver SD2. Each of the source driver SD1 and the source driver SD2 has a function of supplying a data signal in accordance with a signal from the controller IC 115.

The source driver SD1 has a function of generating a data signal which is to be supplied to a pixel circuit electrically connected to a display element. Specifically, the driver circuit SD1 has a function of generating a signal whose polarity is inverted. Thus, for example, a liquid crystal display element can be driven.

The source driver SD2 has a function of generating a data signal that is supplied to a pixel circuit electrically connected to another display element (hereinafter also referred to as a second display element) which displays an image by a method different from that of the abovementioned display element. For example, an organic EL element can be driven.

For example, any of a variety of sequential circuits, such as a shift register, can be used as the source driver SD.

For example, an integrated circuit in which the source driver SD1 and the source driver SD2 are integrated can be used as the source driver SD. Specifically, an integrated circuit formed over a silicon substrate can be used as the source driver SD.

The source driver SD may be included in the integrated circuit including the controller IC 115. Specifically, an integrated circuit formed over a silicon substrate can be used for the controller IC 115 and the source driver SD.

For example, the above integrated circuit can be mounted on a terminal by a chip on glass (COG) method or a chip on film (COF) method. Specifically, an anisotropic conductive film can be used to mount an integrated circuit on the terminal.

<<Pixel Circuit>>

Figure 10:
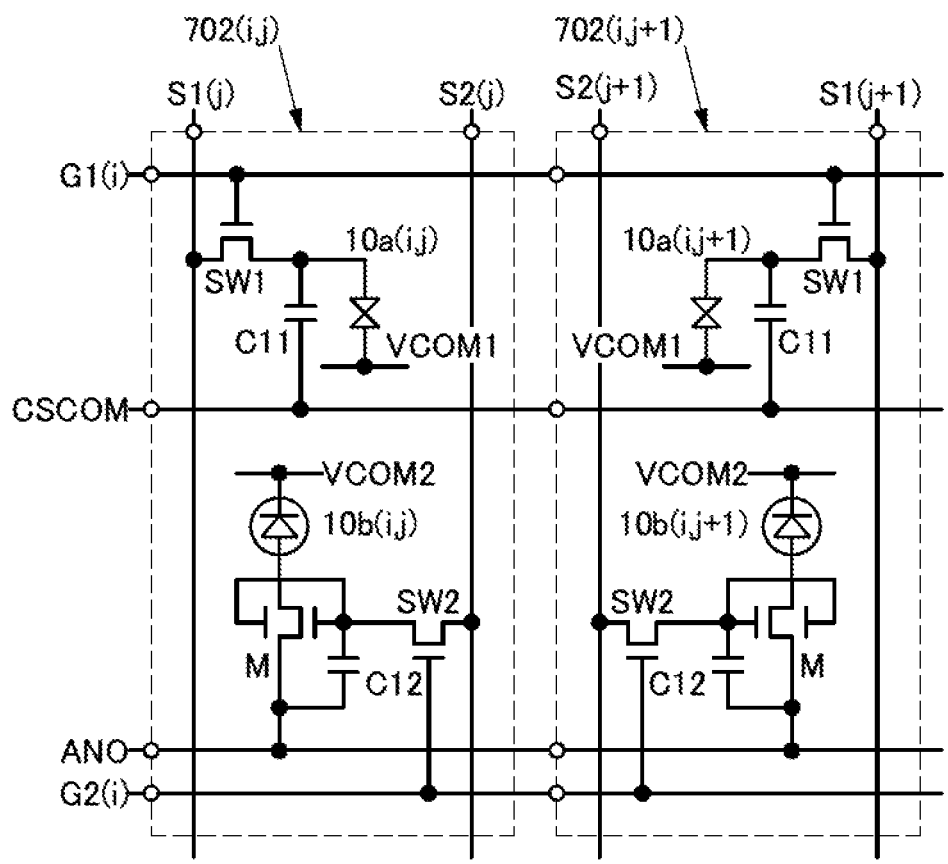
FIG. 10 is a circuit diagram illustrating a configuration example of pixels.

FIG. 10 is a circuit diagram illustrating configuration examples of pixels 702. The pixel 702($i$,$j$) has a function of driving the reflective element 10$a$($i$,$j$) and the light-emitting element 10$b$($i$,$j$). Accordingly, the reflective element 10$a$ and the light-emitting element 10$b$ which perform display using a different method from that of the reflective element 10$a$ can be driven, for example, with the pixel circuit which can be formed in the same process. The display performed using the reflective element 10$a$, which is a reflective display element, can be performed with lower power consumption. In addition, an image with high contrast can be favorably displayed in an environment with bright external light. With the use of the light-emitting element 10$b$, which is a light-emitting display element, images can be favorably displayed in a dark environment.

The pixel 702($i$,$j$) is electrically connected to the signal line S1($j$), the signal line S2($j$), the scan line G1($i$), the scan line G2($i$), the wiring CSCOM, and the wiring ANO.

The pixel 702($i$,$j$) includes a switch SW1, a capacitor C11, a switch SW2, a transistor M, and a capacitor C12.

A transistor including a gate electrode electrically connected to the scan line G1($i$) and a first electrode electrically connected to the signal line S1($j$) can be used as the switch SW1.

The capacitor C11 includes a first electrode electrically connected to a second electrode of the transistor used as the switch SW1 and a second electrode electrically connected to the wiring CSCOM.

A transistor including a gate electrode electrically connected to the scan line G2($i$) and a first electrode electrically connected to the signal line S2($j$) can be used for the switch SW2.

The transistor M includes a gate electrode electrically connected to a second electrode of the transistor used for the switch SW2 and a first electrode electrically connected to the wiring ANO.

Note that the transistor M may include a first gate electrode and a second gate electrode. The first gate electrode may be electrically connected to the second gate electrode. The first gate electrode and the second gate electrode preferably include regions overlapping with each other with a semiconductor film provided therebetween.

The capacitor C12 includes a first electrode electrically connected to a second electrode of the transistor used as the switch SW2 and a second electrode electrically connected to the first electrode of the transistor M.

A first electrode of the reflective element 10$a$($i$,$j$) is electrically connected to the second electrode of the transistor used as the switch SW1. A second electrode of the reflective element 10$a$($i$,$j$) is electrically connected to a wiring VCOM1. The reflective elements $10a(i,j)$ can be driven with this configuration.

A first electrode and a second electrode of the light-emitting element $10b(i,j)$ are electrically connected to a second electrode of the transistor M and to a wiring VCOM2, respectively. The light-emitting element $10b(i,j)$ can be driven with this configuration.

<Top View of Display Panel>

Figure 11A:
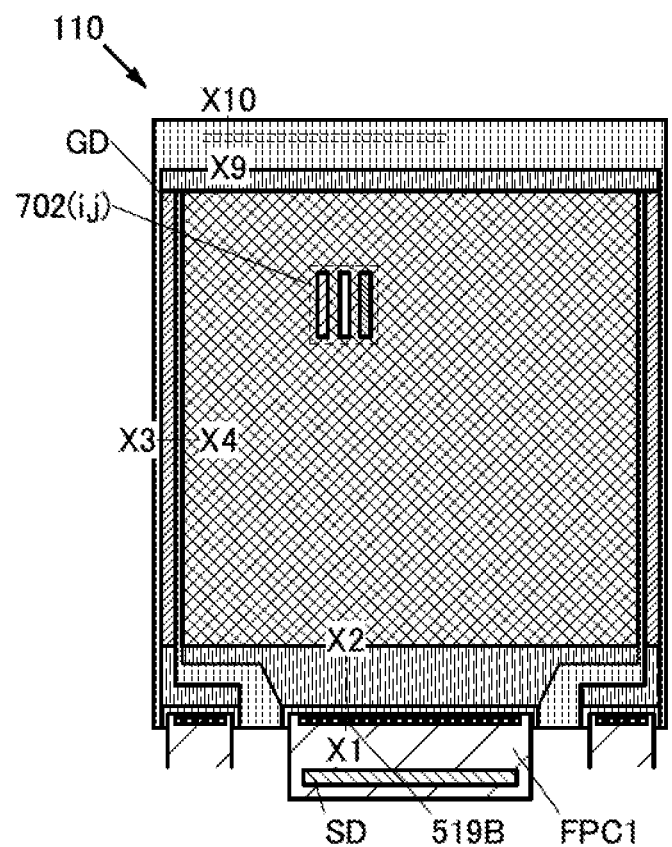
FIGS. 11A to 11C are top views illustrating a structure example of a display unit and a pixel.
Figure 11B:
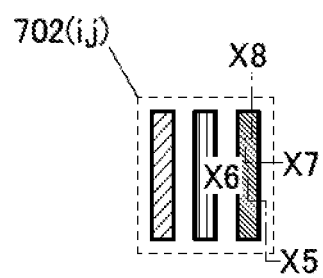
Figure 11C:
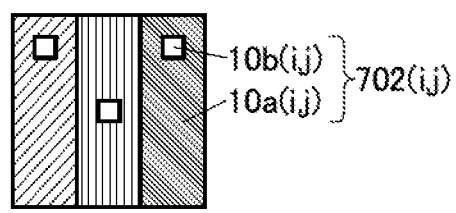

FIGS. 11A to 11C illustrate the structure of the display unit 110. FIG. 11A is a top view of the display unit 110. FIG. 11B is a top view illustrating part of a pixel of the display unit 110 illustrated in FIG. 11A. FIG. 11C is a schematic view illustrating the structure of the pixel illustrated in FIG. 11B.

In the example in FIG. 11A, the source driver SD and a terminal 519B are provided over a flexible printed circuit FPC1.

The pixel $702(i,j)$ in FIG. 11C includes the reflective element $10a(i,j)$ and the light-emitting element $10b(i,j)$.

<Cross-Sectional View of Display Panel>

Figure 12A:
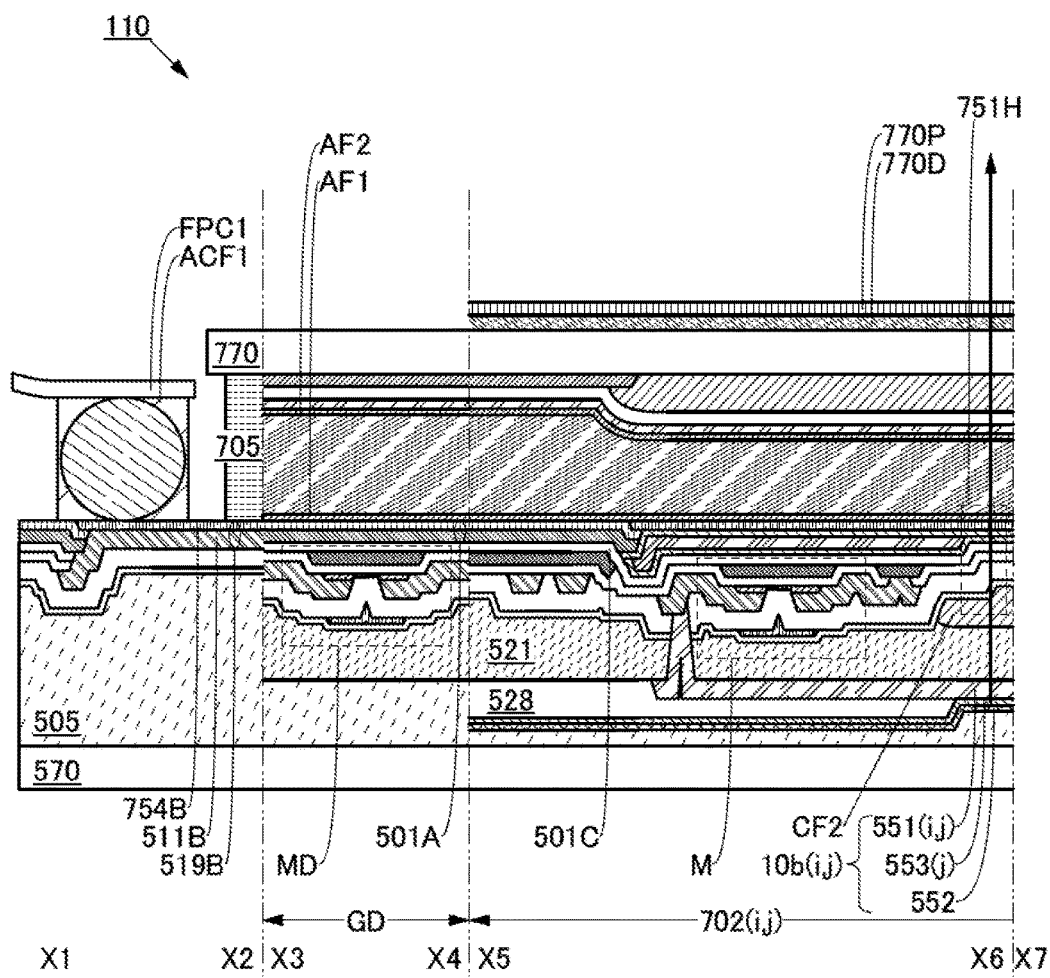
FIGS. 12A and 12B are cross-sectional views illustrating a structure example of a display unit.
Figure 12B:
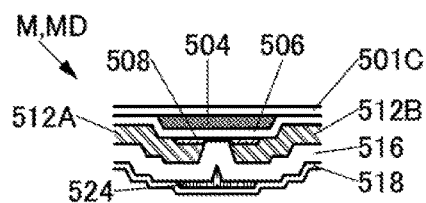

FIGS. 12A and 12B and FIGS. 13A and 13B are cross-sectional views illustrating the structure of the display unit 110. FIG. 12A is a cross-sectional view taken along lines X1-X2 and X3-X4 in FIG. 11A and X5-X6 in FIG. 11B. FIG. 12B illustrates part of FIG. 12A.

Figure 13A:
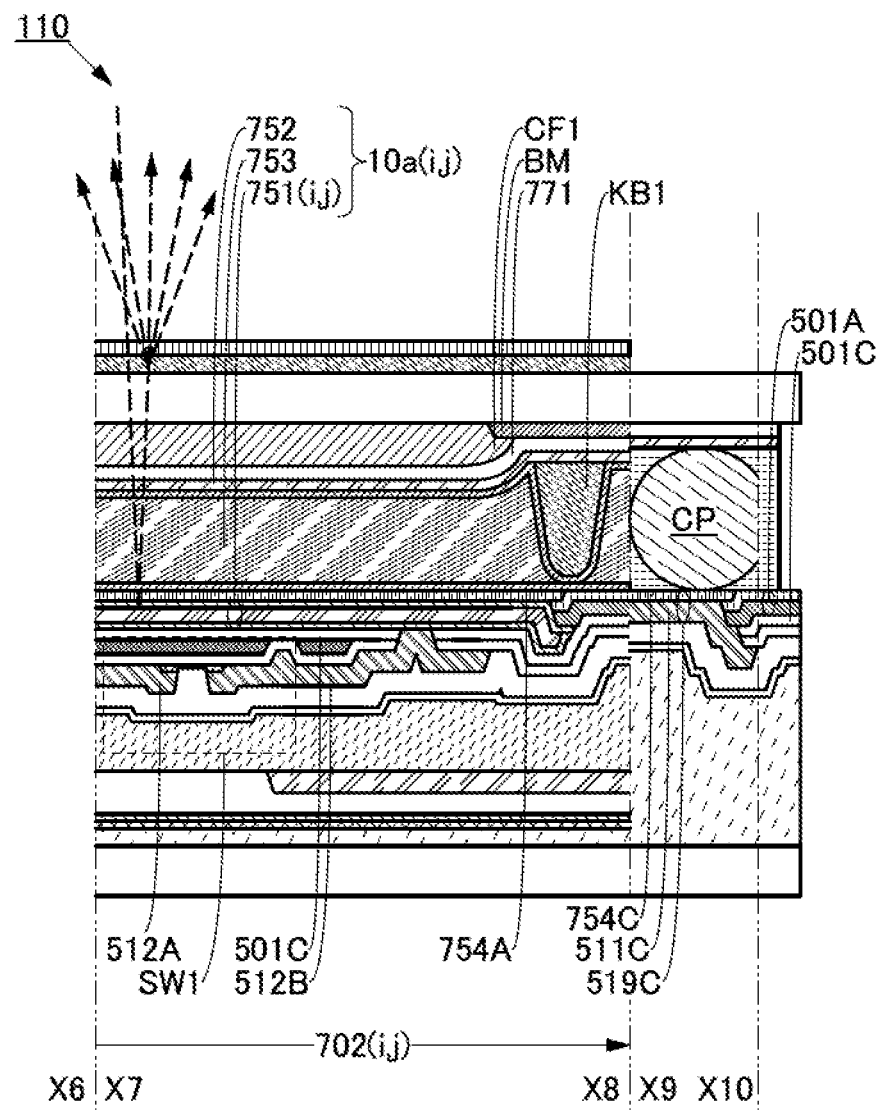
FIGS. 13A and 13B are cross-sectional views illustrating a structure example of a display unit.
Figure 13B:
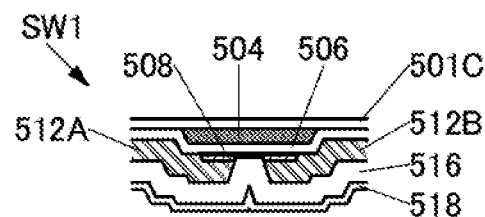

FIG. 13A is a cross-sectional view taken along lines X7-X8 in FIG. 11B and X9-X10 in FIG. 11A. FIG. 13B illustrates part of FIG. 13A.

Components of the display unit 110 will be described with reference to FIGS. 12A and 12B and FIGS. 13A and 13B.

<<Substrate 570>>

The substrate 570 or the like can be formed using a material having heat resistance high enough to withstand heat treatment in the manufacturing process. For example, a material with a thickness greater than or equal to 0.1 mm and less than or equal to 0.7 mm can be used for the substrate 570. Specifically, a material polished to a thickness of approximately 0.1 mm can be used.

For example, a large-sized glass substrate having any of the following sizes can be used as the substrate 570 or the like: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

For the substrate 570 or the like, an organic material, an inorganic material, a composite material of an organic material and an inorganic material, or the like can be used. For example, an inorganic material such as glass, ceramic, or metal can be used for the substrate 570 or the like.

Specifically, non-alkali glass, soda-lime glass, potash glass, crystal glass, aluminosilicate glass, tempered glass, chemically tempered glass, quartz, sapphire, or the like can be used for the substrate 570 or the like. Specifically, an inorganic oxide film, an inorganic nitride film, an inorganic oxynitride film, or the like can be used for the substrate 570 or the like. For example, a silicon oxide film, a silicon nitride film, a silicon oxynitride film, an aluminum oxide film, or the like can be used for the substrate 570 or the like. Stainless steel, aluminum, or the like can be used for the substrate 570 or the like.

For example, a single crystal semiconductor substrate or a polycrystalline semiconductor substrate of silicon or silicon carbide, a compound semiconductor substrate of silicon germanium or the like, or an SOI substrate can be used as the substrate 570 or the like. Thus, a semiconductor element can be provided over the substrate 570 or the like.

For example, an organic material such as a resin, a resin film, or plastic can be used for the substrate 570 or the like. Specifically, a resin film or resin plate of polyester, polyolefin, polyamide, polyimide, polycarbonate, an acrylic resin, or the like can be used for the substrate 570 or the like.

For example, a composite material formed by attaching a metal plate, a thin glass plate, or a film of an inorganic material to a resin film or the like can be used for the substrate 570 or the like. For example, a composite material formed by dispersing a fibrous or particulate metal, glass, inorganic material, or the like into a resin film can be used for the substrate 570 or the like. For example, a composite material formed by dispersing a fibrous or particulate resin, organic material, or the like into an inorganic material can be used for the substrate 570 or the like.

Furthermore, a single-layer material or a layered material in which a plurality of layers are stacked can be used for the substrate 570 or the like. For example, a layered material in which a base, an insulating film that prevents diffusion of impurities contained in the base, and the like are stacked can be used for the substrate 570 or the like. Specifically, a layered material in which glass and one or a plurality of films that are selected from a silicon oxide layer, a silicon nitride layer, a silicon oxynitride layer, and the like and that prevent diffusion of impurities contained in the glass are stacked can be used for the substrate 570 or the like. Alternatively, a layered material in which a resin and a film for preventing diffusion of impurities that penetrate the resin, such as a silicon oxide film, a silicon nitride film, and a silicon oxynitride film are stacked can be used for the substrate 570 or the like.

Specifically, a resin film, a resin plate, a stacked-layer material, or the like containing polyester, polyolefin, polyamide, polyimide, polycarbonate, an acrylic resin, or the like can be used as the substrate 570 or the like.

Specifically, a material including polyester, polyolefin, polyamide (e.g., nylon or aramid), polyimide, polycarbonate, an acrylic resin, a urethane resin, an epoxy resin, a resin having a siloxane bond, such as silicone, or the like can be used for the substrate 570 or the like.

Specifically, polyethylene terephthalate (PET), polyethylene naphthalate (PEN), polyethersulfone (PES), an acrylic resin, or the like can be used for the substrate 570 or the like. Alternatively, a cyclo olefin polymer (COP), a cyclo olefin copolymer (COC), or the like can be used.

Alternatively, paper, wood, or the like can be used for the substrate 570 or the like.

For example, a flexible substrate can be used as the substrate 570 or the like.

Note that a transistor, a capacitor, or the like can be directly formed on the substrate. Alternatively, a transistor, a capacitor, or the like can be formed on a substrate which is for use in the manufacturing process and can withstand heat applied in the manufacturing process, and then the transistor, the capacitor, or the like can be transferred to the substrate 570 or the like. Thus, a transistor, a capacitor, or the like can be formed over a flexible substrate, for example.

<<Substrate 770>>

For example, a light-transmitting material can be used for the substrate 770. Specifically, any of the materials that can be used for the substrate 570 can be used for the substrate 770.

For example, aluminosilicate glass, tempered glass, chemically tempered glass, sapphire, or the like can be favorably used for the substrate 770 that is on a side closer to a user of the display panel. This can prevent breakage or damage of the display panel caused by the use.

A material with a thickness greater than or equal to 0.1 mm and less than or equal to 0.7 mm can be also used for the substrate 770, for example. Specifically, a substrate polished to reduce the thickness can be used. Thus, a functional film 770D can be provided so as to be close to the reflective element 10a(i,j). As a result, image blur can be reduced and an image can be displayed clearly.

<<Structure Body KB1>>

The structure body KB1 or the like can be formed using an organic material, an inorganic material, or a composite material of an organic material and an inorganic material. Accordingly, a predetermined space can be provided between components between which the structure KB1 and the like are provided.

Specifically, for the structure KB1, polyester, polyolefin, polyamide, polyimide, polycarbonate, polysiloxane, an acrylic resin, or the like, or a composite material of a plurality of resins selected from these can be used. Alternatively, a photosensitive material may be used.

<<Sealant 705>>

For the sealant 705 or the like, an inorganic material, an organic material, a composite material of an inorganic material and an organic material, or the like can be used.

For example, an organic material such as a thermally fusible resin or a curable resin can be used for the sealant 705 or the like.

For example, an organic material such as a reactive curable adhesive, a light curable adhesive, a thermosetting adhesive, and/or an anaerobic adhesive can be used for the sealant 705 or the like.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, or the like can be used for the sealant 705 or the like.

<<Bonding Layer 505>>

For example, any of the materials that can be used for the sealant 705 can be used for a bonding layer 505.

<<Insulating Film 521, Insulating Film 518>>

For example, an insulating inorganic material, an insulating organic material, or an insulating composite material containing an inorganic material and an organic material can be used for an insulating film 521, an insulating film 518, or the like.

Specifically, an inorganic oxide film, an inorganic nitride film, an inorganic oxynitride film, or a layered material obtained by stacking some of these films can be used as the insulating films 521 and 518 or the like. For example, a film including any of a silicon oxide film, a silicon nitride film, a silicon oxynitride film, an aluminum oxide film, and the like, or a film including a material obtained by stacking some of these films can be used as the insulating films 521 and 518 or the like.

Specifically, for the insulating films 521 and 518 or the like, polyester, polyolefin, polyamide, polyimide, polycarbonate, polysiloxane, an acrylic resin, or the like, or a layered or composite material of a plurality of kinds of resins selected from these can be used. Alternatively, a photosensitive material may be used.

Thus, steps due to various components overlapping with the insulating films 521 and 518, for example, can be reduced.

<<Insulating Film 528>>

For example, any of the materials that can be used for the insulating film 521 can be used for an insulating film 528 or the like. Specifically, a 1-μm-thick polyimide-containing film can be used as the insulating film 528.

For example, any of the materials that can be used for the insulating film 521 can be used for an insulating film 501A. For example, a material having a function of supplying hydrogen can be used for the insulating film 501A.

Specifically, a material in which a material containing silicon and oxygen and a material containing silicon and nitrogen are stacked can be used for the insulating film 501A. For example, a material having a function of releasing hydrogen by heating or the like to supply the hydrogen to another component can be used for the insulating film 501A. Specifically, a material having a function of releasing hydrogen taken in the manufacturing process, by heating or the like, to supply the hydrogen to another component can be used for the insulating film 501A.

For example, a film containing silicon and oxygen that is formed by a chemical vapor deposition method using silane or the like as a source gas can be used as the insulating film 501A.

Specifically, a material in which a 200- to 600-nm-thick material containing silicon and oxygen and a material containing silicon and nitrogen with a thickness of approximately 200 nm are stacked can be used for the insulating film 501A.

<<Insulating Film 501C>>

For example, any of the materials that can be used for the insulating film 521 can be used for an insulating film 501C. Specifically, a material containing silicon and oxygen can be used for the insulating film 501C. Thus, diffusion of impurities into the pixel circuit, the second display element, or the like can be inhibited.

For example, a 200-nm-thick film containing silicon, oxygen, and nitrogen can be used as the insulating film 501C.

<<Intermediate Film 754A, Intermediate Film 754B, Intermediate Film 754C>>

A film with a thickness greater than or equal to 10 nm and less than or equal to 500 nm, preferably greater than or equal to 10 nm and less than or equal to 100 nm, can be used for the intermediate film 754A, the intermediate film 754B, or the intermediate film 754C, for example. Note that in this specification, the intermediate film 754A, the intermediate film 754B, or the intermediate film 754C is referred to as an intermediate film.

For example, a material having a function of allowing the passage of hydrogen or the supply of hydrogen can be used for the intermediate film.

For example, a conductive material can be used for the intermediate film.

For example, a light-transmitting material can be used for the intermediate film.

Specifically, a material containing indium and oxygen, a material containing indium, gallium, zinc, and oxygen, a material containing indium, tin, and oxygen, or the like can be used for the intermediate film. Note that the above material is permeable to hydrogen.

Specifically, a 50- or 100-nm-thick film containing indium, gallium, zinc, and oxygen can be used as the intermediate film.

Note that a material in which films serving as etching stoppers are stacked can be used for the intermediate film. Specifically, a material in which a 50-nm-thick film containing indium, gallium, zinc, and oxygen and a 20-nm-thick film containing indium, tin, and oxygen, are stacked in this order can be used for the intermediate film.

<<Wiring, Terminal, and Conductive Film>>

A conductive material can be used for the wiring or the like. Specifically, the conductive material can be used for the signal line $S1(j)$, the signal line $S2(j)$, the scan line $G1(i)$, the scan line $G2(i)$, the wiring CSCOM, the wiring ANO, a conductive film 511B, a conductive film 511C, or the like.

For example, an inorganic conductive material, an organic conductive material, a metal, conductive ceramics, or the like can be used for the wiring or the like.

Specifically, a metal element selected from aluminum, gold, platinum, silver, copper, chromium, tantalum, titanium, molybdenum, tungsten, nickel, iron, cobalt, palladium, and manganese, or the like can be used for the wiring or the like. Alternatively, an alloy including any of the above-described metal elements, or the like can be used for the wiring or the like. In particular, an alloy of copper and manganese is suitably used in microfabrication with the use of a wet etching method.

Specifically, any of the following structures can be used for the wiring or the like: a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like.

Specifically, a conductive oxide, such as indium oxide, indium tin oxide, indium zinc oxide, zinc oxide, or zinc oxide to which gallium is added, can be used for the wiring or the like.

Specifically, a film containing graphene or graphite can be used for the wiring or the like.

For example, a film including graphene oxide is formed and is subjected to reduction, so that a film including graphene can be formed. As a reducing method, a method with application of heat, a method using a reducing agent, or the like can be employed.

A film containing a metal nanowire can be used for the wiring or the like, for example. Specifically, a nanowire containing silver can be used.

Specifically, a conductive high molecular compound can be used for the wiring or the like.

Note that the terminal 519B can be electrically connected to a flexible printed circuit FPC1 using a conductive material ACF1, for example.

<<Reflective Element $10a(i,j)$>>

The reflective element $10a(i,j)$ is a display element having a function of controlling reflection of light. For example, a liquid crystal element, an electrophoretic element, a display element using MEMS, or the like can be used. Specifically, a reflective liquid crystal display element can be used as the reflective element $10a(i,j)$. The use of a reflective display element can reduce power consumption of a display panel.

For example, a liquid crystal element driven in any of the following driving modes can be used: an in-plane switching (IPS) mode, a twisted nematic (TN) mode, a fringe field switching (FFS) mode, an axially symmetric aligned microcell (ASM) mode, an optically compensated birefringence (OCB) mode, a ferroelectric liquid crystal (FLC) mode, an antiferroelectric liquid crystal (AFLC) mode, and the like.

In addition, a liquid crystal element that can be driven by, for example, a vertical alignment (VA) mode such as a multi-domain vertical alignment (MVA) mode, a patterned vertical alignment (PVA) mode, an electrically controlled birefringence (ECB) mode, a continuous pinwheel alignment (CPA) mode, or an advanced super view (ASV) mode can be used.

The reflective element $10a(i,j)$ includes an electrode 751$(i,j)$, an electrode 752, and a layer 753 containing a liquid crystal material. The layer 753 contains a liquid crystal material whose alignment is controlled by a voltage applied between the electrode 751$(i,j)$ and the electrode 752. For example, the alignment of the liquid crystal material can be controlled by an electric field in the thickness direction (also referred to as the vertical direction) of the layer 753, or the direction that crosses the vertical direction (the horizontal direction, or the diagonal direction).

For example, thermotropic liquid crystal, low-molecular liquid crystal, high-molecular liquid crystal, polymer dispersed liquid crystal, ferroelectric liquid crystal, anti-ferroelectric liquid crystal, or the like can be used for the layer 753 containing a liquid crystal material. Alternatively, a liquid crystal material which exhibits a cholesteric phase, a smectic phase, a cubic phase, a chiral nematic phase, an isotropic phase, or the like can be used. Alternatively, a liquid crystal material which exhibits a blue phase can be used.

For example, the material that is used for the wiring or the like can be used for the electrode 751$(i,j)$. Specifically, a reflective film can be used for the electrode 751$(i,j)$. For example, a material in which a light-transmitting conductive film and a reflective film having an opening are stacked can be used for the electrode 751$(i,j)$.

For example, a material having conductivity can be used for the electrode 752. For example, a material having a visible-light-transmitting property can be used for the electrode 752.

For example, a conductive oxide, a metal film thin enough to transmit light, or a metal nanowire can be used for the electrode 752.

Specifically, a conductive oxide containing indium can be used for the electrode 752. Alternatively, a metal thin film with a thickness greater than or equal to 1 nm and less than or equal to 10 nm can be used for the electrode 752. Alternatively, a metal nanowire containing silver can be used for the electrode 752.

Specifically, indium oxide, indium tin oxide, indium zinc oxide, zinc oxide, zinc oxide to which gallium is added, zinc oxide to which aluminum is added, or the like can be used for the electrode 752.

<Reflective Film>

For example, a material that reflects visible light can be used for the reflective film. Specifically, a material containing silver can be used for the reflective film. For example, a material containing silver, palladium, and the like or a material containing silver, copper, and the like can be used for the reflective film.

The reflective film reflects light that passes through the layer 753, for example. This allows the reflective element $10a(i,j)$ to serve as a reflective display element. Alternatively, for example, a material with unevenness on its surface can be used for the reflective film. In that case, incident light can be reflected in various directions so that a white image can be displayed.

For example, the electrode 751$(i,j)$ or the like can be used as a reflective film.

For example, the reflective film can be provided as a film including a region sandwiched between the layer 753 and the electrode 751$(i,j)$. In the case where the electrode 751$(i,j)$ has a light-transmitting property, the reflective film can be used as a film including a region provided so that the electrode 751(i,j) is positioned between the region and the layer 753.

The reflective film preferably has a shape, for example, including a region that does not block light emitted from the light-emitting element 10b(i,j). For example, the reflective film may have a shape with one or a plurality of openings 751H.

The opening may have a polygonal shape, a quadrangular shape, an elliptical shape, a circular shape, a cross-like shape, or the like. The opening 751H may also have a stripe shape, a slit-like shape, or a checkered pattern.

If the ratio of the total area of the opening 751H to the total area except for the openings is too high, display performed using the reflective element 10a(i,j) is dark.

If the ratio of the total area of the opening 751H to the total area except for the openings is too low, display performed using the light-emitting element 10b(i,j) is dark.

Figure 14A:
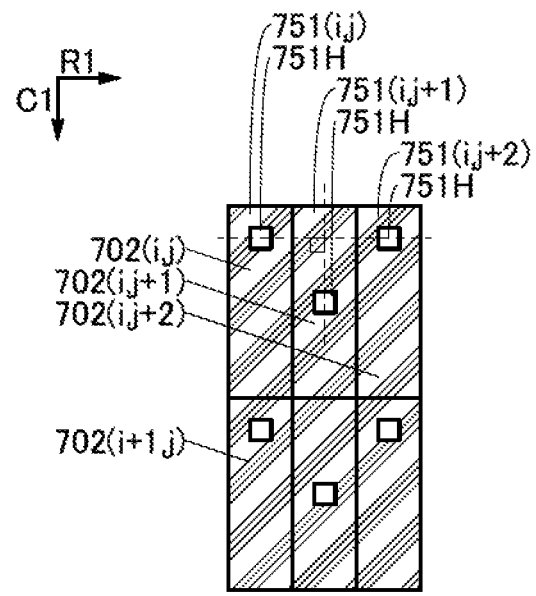
FIGS. 14A to 14C are schematic views illustrating the shapes of reflective films.
Figure 14B:
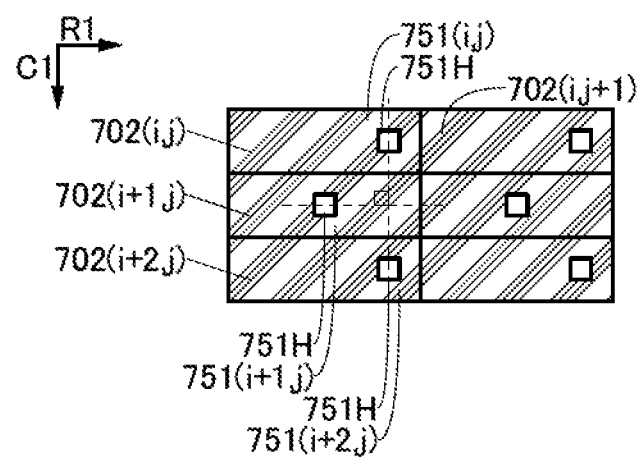
Figure 14C:
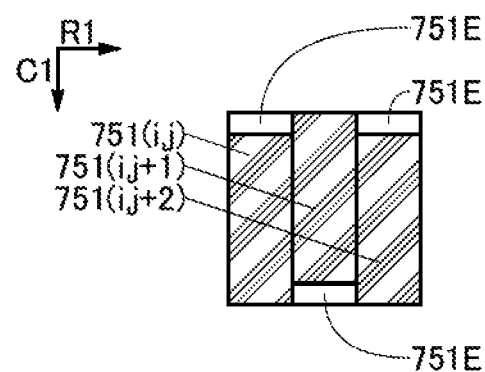

FIGS. 14A to 14C are schematic views each illustrating the shape of a reflective film that can be used in a pixel of the display unit 110.

The opening 751H of the pixel 702(i,j+1), which is adjacent to the pixel 702(i,j), is not provided on a line that extends in the row direction (the direction indicated by the arrow R1 in the drawing) through the opening 751H of the pixel 702(i,j) (see FIG. 14A). Alternatively, for example, the opening 751H of the pixel 702(i+1,j), which is adjacent to the pixel 702(i,j), is not provided on a line that extends in the column direction (the direction indicated by the arrow C1 in the drawing) through the opening 751H of the pixel 702(i,j) (see FIG. 14B).

For example, the opening 751H of the pixel 702(i,j+2) is provided on a line that extends in the row direction through the opening 751H of the pixel 702(i,j) (see FIG. 14A). In addition, the opening 751H of the pixel 702(i,j+1) is provided on a line that is perpendicular to the above-mentioned line between the opening 751H of the pixel 702(i,j) and the opening 751H of the pixel 702(i,j+2).

Alternatively, for example, the opening 751H of the pixel 702(i+2,j) is provided on a line that extends in the column direction through the opening 751H of the pixel 702(i,j) (see FIG. 14B). In addition, for example, the opening 751H of the pixel 702(i+1,j) is provided on a line that is perpendicular to the above-mentioned line between the opening 751H of the pixel 702(i,j) and the opening 751H of the pixel 702(i+2,j).

Thus, a second display element that includes a region overlapping with an opening of a pixel adjacent to one pixel can be apart from a second display element that includes a region overlapping with an opening of the one pixel. A display element which displays color different from that displayed from the second display element of one pixel can be provided as the second display element of another pixel adjacent to the one pixel. The difficulty in arranging a plurality of display elements displaying different colors adjacent to each other can be lowered.

For example, the reflective film can be formed using a material having a shape in which an end portion is cut off so as to form a region 751E that does not block light emitted from the light-emitting element 10b(i,j) (see FIG. 14C). Specifically, the electrode 751(i,j) whose end portion is cut off so as to be shorter in the column direction (the direction indicated by the arrow C1 in the drawing) can be used as the reflective film.

<<Alignment Films AF1 and AF2>>

The alignment films AF1 and AF2 can be formed using a material containing polyimide or the like, for example. Specifically, a material formed by rubbing treatment or an optical alignment technique such that a liquid crystal material has a predetermined alignment can be used.

For example, a film containing soluble polyimide can be used for the alignment films AF1 and AF2. In this case, the temperature required in forming the alignment film AF1 or AF2 can be low. As a result, damage to other components caused when the alignment film AF1 or the alignment film AF2 is formed can be reduced.

<<Coloring Films CF1 and CF2>>

A material transmitting light of a predetermined color can be used for the coloring film CF1 or the coloring film CF2. Thus, the coloring film CF1 or the coloring film CF2 can be used as a color filter, for example. For example, a material that transmits blue light, green light, or red light can be used for the coloring film CF1 or the coloring film CF2. Furthermore, a material that transmits yellow light, white light, or the like can be used for the coloring film CF1 or the coloring film CF2.

Note that a material having a function of converting the emitted light to a predetermined color light can be used for the coloring film CF2. Specifically, quantum dots can be used for the coloring film CF2. Thus, display with high color purity can be achieved.

<<Light-Blocking Film BM>>

The light-blocking film BM can be formed with a material that prevents light transmission and can thus be used as a black matrix, for example.

<<Insulating Film 771>>

The insulating film 771 can be formed of polyimide, epoxy resin, acrylic resin, or the like.

<<Functional Films 770P and 770D>>

An anti-reflection film, a polarizing film, a retardation film, a light diffusion film, a condensing film, or the like can be used for the functional film 770P or the functional film 770D, for example.

Specifically, a film containing a dichromatic pigment can be used for the functional film 770P or the functional film 770D. Alternatively, a material with a columnar structure having an axis along the direction intersecting a surface of a base can be used for the functional film 770P or the functional film 770D. In that case, light can be transmitted in the direction along the axis and scattered in other directions easily.

Alternatively, an antistatic film preventing the attachment of a foreign substance, a water repellent film suppressing the attachment of stain, a hard coat film suppressing a scratch in use, or the like can be used as the functional film 770P.

Specifically, a circularly polarizing film can be used for the functional film 770P. Furthermore, a light diffusion film can be used for the functional film 770D.

<<Light-Emitting Element 10b(i,j)>>

For example, a self-luminous light-emitting element such as an organic EL element, an inorganic EL element, a quantum-dot light-emitting diode (QLED), and any other light-emitting diode can be used as the light-emitting element 10b(i,j).

The light-emitting element 10b(i,j) includes an electrode 551(i,j), an electrode 552, and a layer 553(j) containing a light-emitting material.

For example, a light-emitting organic compound can be used for the layer 553(j) containing a light-emitting material.

For example, quantum dots can be used for the layer 553(j). Accordingly, the half width becomes narrow, and light of a bright color can be emitted.

For example, a layered material for emitting blue light, green light, or red light, or the like can be used for the layer 553(j).

For example, a belt-like layered material that extends in the column direction along the signal line S2(j) can be used for the layer 553(j).

Alternatively, a layered material for emitting white light can be used for the layer 553(j). Specifically, a layered material in which a layer containing a light-emitting material including a fluorescent material that emits blue light, and a layer containing materials that are other than a fluorescent material and that emit green light and red light or a layer containing a material that is other than a fluorescent material and that emits yellow light are stacked can be used for the layer 553(j).

For example, a material that can be used for the wiring or the like can be used for the electrode 551(i,j).

For example, a material that transmits visible light selected from materials that can be used for the wiring or the like can be used for the electrode 551(i,j).

Specifically, conductive oxide, indium-containing conductive oxide, indium oxide, indium tin oxide, indium zinc oxide, zinc oxide, zinc oxide to which gallium is added, or the like can be used for the electrode 551(i,j). Alternatively, a metal film that is thin enough to transmit light can be used as the electrode 551(i,j). Further alternatively, a metal film that transmits part of light and reflects another part of light can be used as the electrode 551(i,j). Thus, the light-emitting element 10b(i,j) can be provided with a microcavity structure. Consequently, light of a predetermined wavelength can be extracted more efficiently than light of the other wavelengths.

For example, a material that can be used for the wiring or the like can be used for the electrode 552. Specifically, a material that reflects visible light can be used for the electrode 552.

<<Gate Driver GD>>

Any of a variety of sequential circuits, such as a shift register, can be used as the gate driver GD. For example, a transistor MD, a capacitor, and the like can be used in the gate driver GD. Specifically, a transistor including a semiconductor film that can be formed in the same process as the semiconductor film of the transistor M or the transistor which can be used as the switch SW1 can be used.

As the transistor MD, a transistor having a different structure from the transistor that can be used as the switch SW1 can be used, for example. Specifically, a transistor including the conductive film 524 can be used as the transistor MD.

Note that the transistor MD can have the same structure as the transistor M.

<<Transistor>>

For example, semiconductor films formed at the same step can be used for transistors in the gate driver, the source driver, and the pixel circuit.

For example, a bottom-gate transistor, a top-gate transistor, or the like can be used for transistors in the gate driver, the source driver, or a pixel circuit.

For example, the OS transistor described in Embodiment 1 can be used. In that case, the above-mentioned idling stop can be performed.

For example, a transistor including an metal oxide 508, a conductive film 504, a conductive film 512A, and a conductive film 512B can be used as the switch SW1 (see FIG. 13B). The insulating film 506 includes a region positioned between the metal oxide 508 and the conductive film 504.

The conductive film 504 includes a region overlapping with the metal oxide 508. The conductive film 504 functions as a gate electrode. The insulating film 506 functions as a gate insulating film.

The conductive film 512A and the conductive film 512B are electrically connected to the metal oxide 508. The conductive film 512A has one of a function as a source electrode and a function as a drain electrode, and the conductive film 512B has the other.

A transistor including the conductive film 524 can be used as the transistor in the gate driver, the source driver, or the pixel circuit. The conductive film 524 includes a region so that the metal oxide 508 is sandwiched between the conductive film 504 and the region. The insulating film 516 includes a region positioned between the conductive film 524 and the metal oxide 508. For example, the conductive film 524 is electrically connected to a wiring supplying the same potential as that supplied to the conductive film 504.

A conductive film in which a 10-nm-thick film containing tantalum and nitrogen and a 300-nm-thick film containing copper are stacked can be used as the conductive film 504, for example. A film containing copper includes a region provided so that a film containing tantalum and nitrogen is positioned between the film containing copper and the insulating film 506.

For example, a material obtained by stacking a 400-nm-thick film containing silicon and nitrogen and a 200-nm-thick film containing silicon, oxygen, and nitrogen can be used for the insulating film 506. Note that the film containing silicon and nitrogen includes a region so that the film containing silicon, oxygen, and nitrogen is sandwiched between the region and the metal oxide 508.

A 25-nm-thick film containing indium, gallium, and zinc can be used as the metal oxide 508, for example.

For example, a conductive film in which a 50-nm-thick film containing tungsten, a 400-nm-thick film containing aluminum, and a 100-nm-thick film containing titanium are stacked in this order can be used as the conductive film 512A or 512B. Note that the film containing tungsten includes a region in contact with the metal oxide 508.

Note that this embodiment can be combined with any of the other embodiments in this specification as appropriate.

Figure 15A:
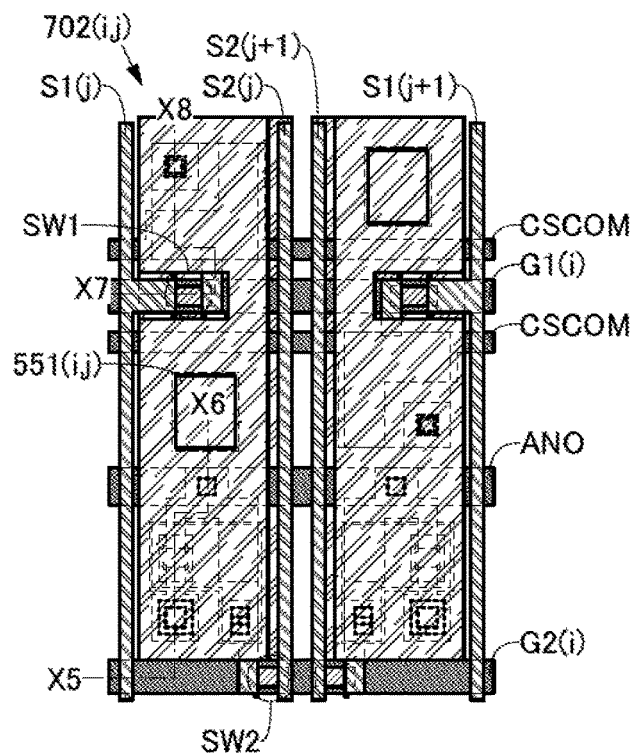
FIGS. 15A and 15B are bottom views each illustrating part of a pixel of a display unit.
Figure 15B:
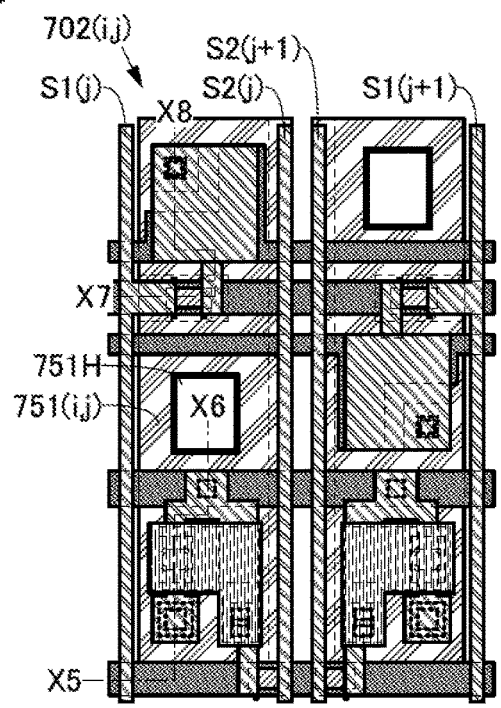

FIG. 15A is a bottom view illustrating part of the pixel of the display panel in FIG. 11B. FIG. 15B is a bottom view illustrating part of the structure in FIG. 15A in which some components are omitted.

Embodiment 3

A display device described in this embodiment includes the display unit described in the above embodiments and a touch sensor unit.

Figure 16:
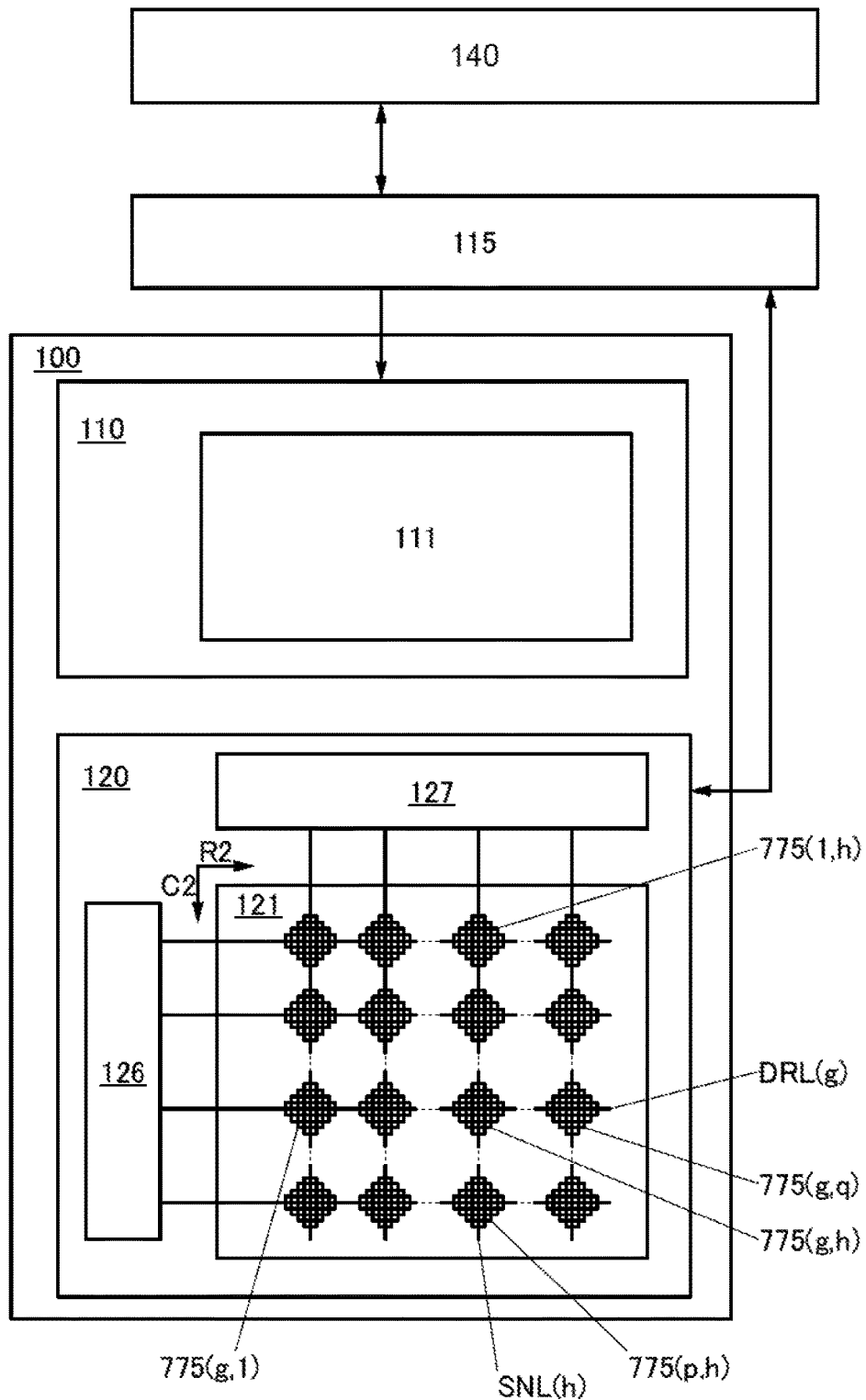
FIG. 16 is a block diagram illustrating a structure example of a display device.
Figure 17A:
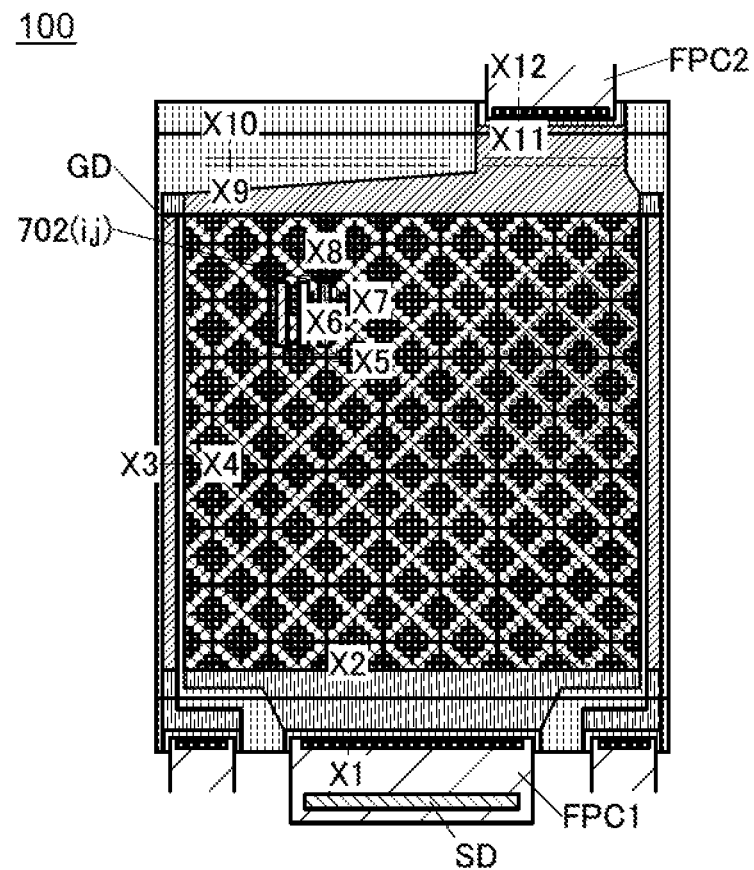
FIGS. 17A and 17B are a top view illustrating a display device and a schematic view illustrating part of an input portion of the display device.
Figure 17B:
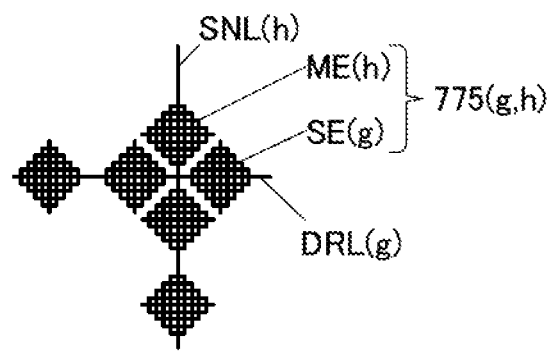

FIG. 16 is a block diagram showing the structure of the display device 100 including the touch sensor unit 120 and the display unit 110. FIG. 17A is a top view of the display device 100. FIG. 17B is a schematic view showing part of an input portion of the display device 100.

The touch sensor unit 120 includes the sensor array 121, the TS driver 126, and the sensing circuit 127 (see FIG. 16).

The sensor array 121 includes a region overlapping with the pixel array 111 of the display unit 110. The sensor array 121 has a function of sensing an object approaching the region overlapping with the pixel array 111.

The sensor array 121 includes a group consisting of sensing elements 775(g,1) to 775(g,q) and another group consisting of sensing elements 775(1,h) to 775(p,h). Note that g is an integer greater than or equal to 1 and less than or equal to p, h is an integer greater than or equal to 1 and less than or equal to q, and each of p and q is an integer greater than or equal to 1.

The one group of the sensing elements 775(g,1) to 775(g,q) include the sensing element 775(g,h). The sensing elements 775(g,1) to 775(g,q) are arranged in a row direction (indicated by the arrow R2 in the drawing).

The another group of sensing elements 775(1,h) to 775(p,h) include the sensing element 775(g,h) and are provided in the column direction (the direction indicated by the arrow C2 in the drawing) that intersects the row direction.

The one group of sensing elements 775(g,1) to 775(g,q) provided in the row direction include an electrode SE(g) that is electrically connected to a control line DRL(g) (see FIG. 17B).

The another group of sensing elements 775(1,h) to 775(p,h) provided in the column direction include an electrode ME(h) that is electrically connected to the sensor signal line SNL(h) (see FIG. 17B).

The electrode SE(g) and the electrode ME(h) preferably have light-transmitting properties.

The wiring DRL(g) has a function of supplying a control signal.

The wiring SNL(h) has a function of receiving a sensor signal.

The electrode ME(h) is provided so that an electric field can be formed between the electrode ME(h) and the electrode SE(g). When an object such as a finger approaches the sensor array 121, the electric field is blocked, and the sensing element 775(g,h) supplies the sensor signal.

The TS driver 126 is electrically connected to the wiring DRL(g) and has a function of supplying the control signal. For example, a rectangular wave, a sawtooth wave, a triangular wave, or the like can be used as the control signal.

The sensing circuit 127 is electrically connected to the wiring SNL(h) and has a function of supplying the sensor signal on the basis of change in the potential of the wiring SNL(h). Note that the sensor signal includes, for example, positional data.

The sensor signal is supplied to the controller IC 115. The controller IC 115 supplies data corresponding to the sensor signal to the host 140 to update the image displayed with the pixel array 111.

Figure 18A:
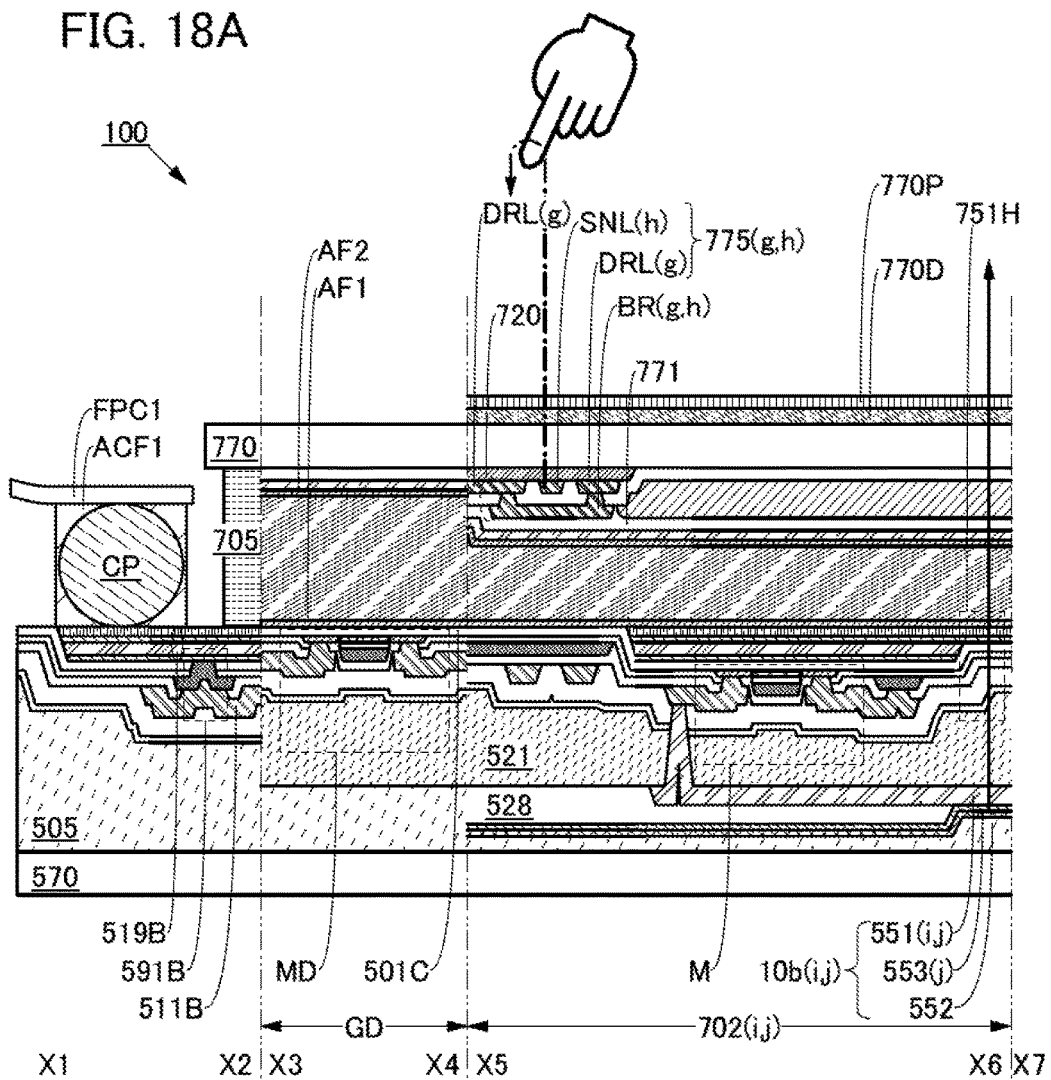
FIGS. 18A and 18B are cross-sectional views illustrating a structure example of a display device.
Figure 18B:
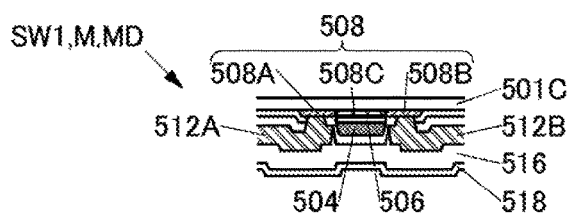
Figure 19:
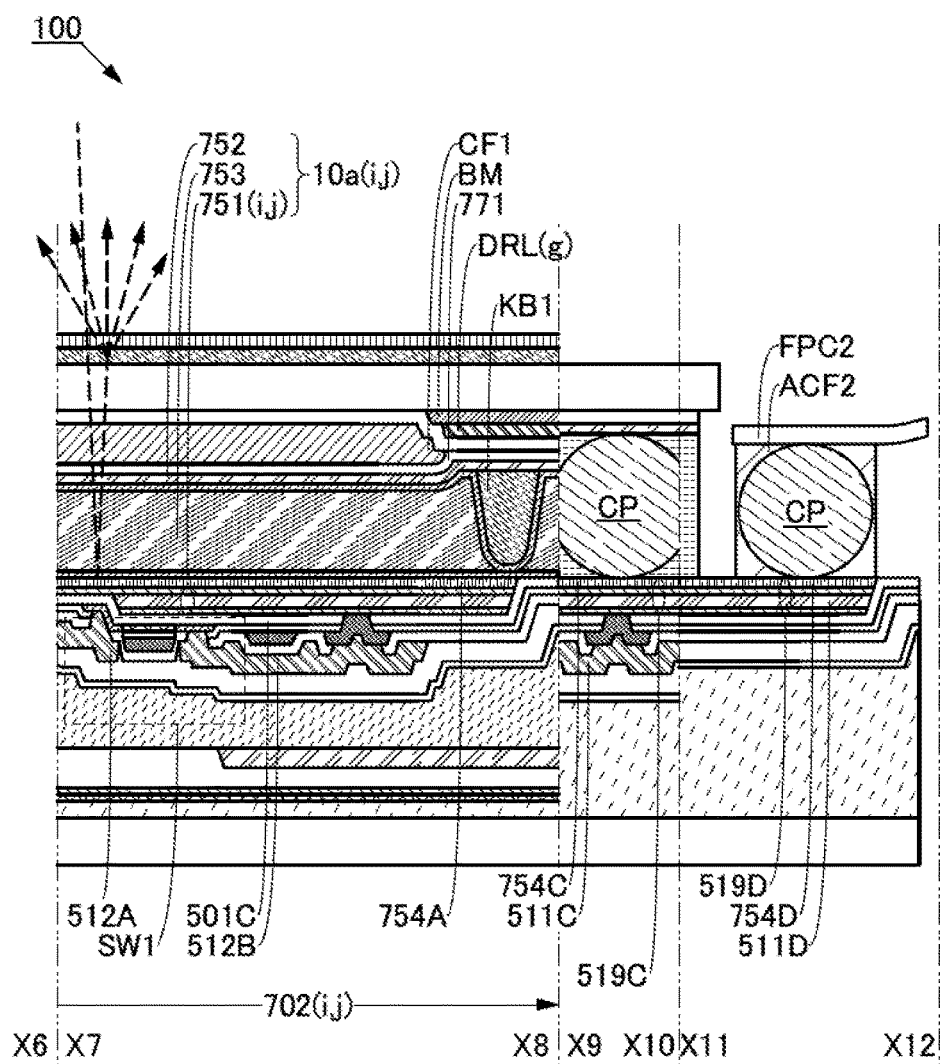
FIG. 19 is a cross-sectional view illustrating a structure example of a display device.

FIGS. 18A and 18B and FIG. 19 illustrate the structure of the display device 100. FIG. 18A is a cross-sectional view taken along lines X1-X2, X3-X4, and X5-X6 in FIG. 17A. FIG. 18B is a cross-sectional view illustrating part of the structure illustrated in FIG. 18A.

FIG. 19 is a cross-sectional view taken along lines X7-X8, X9-X10, and X11-X12 in FIG. 17A.

The display device 100 is different from, for example, the display unit 110 in Embodiment 2 in including a functional layer 720 and a top-gate transistor. Different structures will be described in detail below, and the above description is referred to for the other similar structures.

The functional layer 720 includes a region surrounded by the substrate 770, the insulating film 501C, and the sealant 705 (FIGS. 18A and 18B).

The functional layer 720 includes the wiring DRL(g), the wiring SNL(h), and the sensing element 775(g,h).

The gap between the wiring DRL(g) and the electrode 752 or between the wiring SNL(h) and the electrode 752 is greater than or equal to 0.2 µm and less than or equal to 16 µm, preferably greater than or equal to 1 µm and less than or equal to 8 µm, further preferably greater than or equal to 2.5 µm and less than or equal to 4 µm.

The display device 100 includes a conductive film 511D (see FIG. 19).

Note that the conductive material CP or the like can be provided between the wiring DRL(g) and the conductive film 511D to electrically connect the wiring DRL(g) and the conductive film 511D. Alternatively, the conductive material CP or the like can be provided between the wiring SNL(h) and the conductive film 511D to electrically connect the wiring SNL(h) and the conductive film 511D. A material that can be used for the wiring or the like can be used for the conductive film 511D, for example.

The display device 100 includes a terminal 519D (see FIG. 19).

The terminal 519D is provided with the conductive film 511D and an intermediate film 754D, and the intermediate film 754D includes a region in contact with the conductive film 511D.

For example, a material that can be used for a wiring or the like can be used for the terminal 519D. Specifically, the terminal 519D can have the same structure as that of the terminal 519B or the terminal 519C.

Note that for example, the terminal 519D can be electrically connected to a flexible printed circuit FPC2 using a conductive material ACF2, for example. Thus, a control signal can be supplied to the wiring DRL(g) with use of the terminal 519D, for example. Alternatively, a sensor signal can be supplied from the wiring SNL(h) with use of the terminal 519D.

A transistor that can be used for the switch SW1, the transistor M, and the transistor MD include the conductive film 504 having a region overlapping with the insulating film 501C and the metal oxide 508 having a region located between the insulating film 501C and the conductive film 504. Note that the conductive film 504 functions as a gate electrode (see FIG. 18B).

The metal oxide 508 includes a first region 508A, a second region 508B, and a third region 508C. The first region 508A and the second region 508B do not overlap with the conductive film 504. The third region 508C is positioned between the first region 508A and the second region 508B and overlaps with the conductive film 504.

The transistor MD includes the insulating film 506 between the third region 508C and the conductive film 504. Note that the insulating film 506 functions as a gate insulating film.

The first region 508A and the second region 508B have a lower resistivity than the third region 508C, and function as a source region and a drain region.

The first region 508A and the second region 508B can be formed in the metal oxide 508 by, for example, performing plasma treatment on the metal oxide film using a gas containing a rare gas.

For example, the conductive film 504 can be used as a mask. The use of the conductive film 504 as a mask allows the shape of part of the third region 508C to be self-aligned with the shape of an end of the conductive film 504.

The transistor MD includes the conductive film 512A and the conductive film 512B that are in contact with the first region 508A and the second region 508B, respectively. The conductive film 512A and the conductive film 512B function as a source electrode and a drain electrode.

A transistor that can be fabricated in the same process as the transistor MD can be used as the transistor M, for example.

Embodiment 4

The AI controller 156 performs arithmetic processing using a neural network to increase the success rate of power gating. In this embodiment, the details of the AI controller 156 in Embodiment 1 will be described.

<<Neural Network>>

A neural network is an information processing system modeled on a biological neural network. A computer having a higher performance than a conventional von Neumann computer is expected to be provided by utilizing the neural network, and in these years, a variety of researches on a neural network formed with an electronic circuit have been carried out.

In the neural network, units that resemble neurons are interconnected, and a plurality of data are input to each neuron. The plurality of data input to the neuron are each multiplied by a "weigh coefficient", which represents the strength of connection, and the sum of the products is obtained. When the result of the product-sum operation obtained in this manner exceeds a threshold, the neuron outputs a high-level signal. This phenomenon is called "firing".

The AI controller 156 receives the touch information obtained from the touch sensor controller 184, the information on the current consumption of the frame memory 151, and the like, as described in Embodiment 1. Subsequently, the AI controller 156 receives information from the controller 154 as to whether power gating is actually performed (see FIGS. 3 and 8).

The AI controller 156 performs supervised learning, with the above-described touch information, the current consumption of the frame memory 151, and the like as learning data, and with the information on whether power gating is actually performed as teacher data. The learning is performed by updating a weight coefficient, which represents the strength of connection, and the like.

Having learned with a neural network, the AI controller 156 can output a prediction signal that indicates whether power gating will be performed, following the input data such as the touch information and the current consumption of the frame memory 151.

When the AI controller 156 outputs a prediction signal that indicates that power gating will be performed, the complementary data retained in the flip-flop circuit 19 is stored into the retention circuit 17 (see FIG. 7). Subsequently, when the image data is confirmed to have no change, power gating is performed.

In this manner, power gating can be performed immediately after the image data ceases to change, by predicting whether power gating will be performed before the image data ceases to change. This can ensure a long period for power gating, and thus can increase the power reduction effect.

As an example of neural networks that can be used for the AI controller 156, a hierarchical neural network and supervised learning will be described below.

Figure 20A:
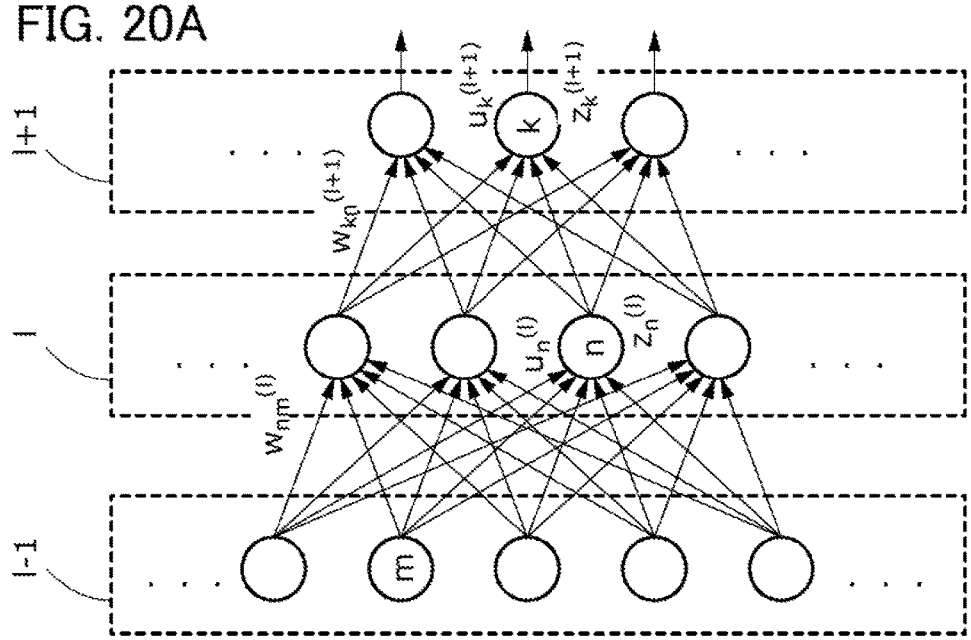
FIG. 20A illustrates a configuration example of a hierarchical neural network and FIGS. 20B and 20C illustrate circuit configurations for arithmetic processing.

FIG. 20A illustrates a configuration example of a hierarchical neural network. In FIG. 20A, a neuron of each layer is denoted by a circle. In FIG. 20A, the hierarchical neural network includes neurons (formal neurons) divided into three layers: a (l−1)th layer serving as an input layer, a l-th layer serving as a middle layer (hidden layer), and a (l+1)th layer serving as an output layer (l is an integer of 2 or more). The number of neurons in the (l−1)th layer is M (M is an integer of 2 or more), the number of neurons in the l-th layer is N (N is an integer of 2 or more), and the number of neurons in the (l+1)th layer is K (K is an integer of 2 or more).

FIG. 20A illustrates five neurons among a plurality of neurons in the (l−1)th layer, four neurons among a plurality of neurons in the l-th layer, and three neurons among a plurality of neurons in the (l+1)th layer.

Although FIG. 20A illustrates a configuration example of a hierarchical neural network including one middle layer, the middle layer may include a plurality of layers. Thus, in the case of a hierarchical neural network including L layers (L is an integer of 3 or more), a first layer corresponds to an input layer, second to (L−1)th layers correspond to a middle layer, and a L-th layer corresponds to an output layer.

In FIG. 20A, an output $z_m^{(l-1)}$ of an m-th neuron in the (l−1)th layer (m is an integer greater than or equal to 1 and less than or equal to M) is input to an n-th neuron in the l-th layer (n is an integer greater than or equal to 1 and less than or equal to N). An output $z_n^{(l)}$ of the n-th neuron is input to a k-th neuron in the (l+1)th layer (k is an integer greater than or equal to 1 and less than or equal to K). The output of the k-th neuron is denoted by $z_k^{(l+1)}$. The weight coefficient of the n-th neuron in the l-th layer is denoted by $w_{nm}^{(l)}$, and the weight coefficient of the k-th neuron in the (l+1)th layer is denoted by $w_{kn}^{(l+1)}$.

Under the above condition, the sum (net value) $u_n^{(l)}$ of the input to the n-th neuron in the l-th layer is represented by following Formula (a1).

$$u_n^{(l)} = \Sigma_m w_{nm}^{(l)} \cdot z_m^{(l-1)} \quad (a1)$$

The arithmetic processing of Formula (a1) can be performed by using a product-sum operation circuit, which will be described later.

The output $z_n^{(l)}$ of the n-th neuron in the l-th layer is represented by following Formula (a2).

$$z_n(l) = f(u_n^{(l)}) \quad (a2)$$

Figure 20B:
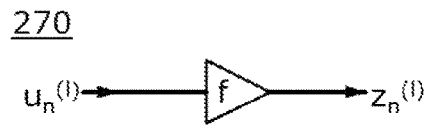

Note that ƒ is an output function of the neuron. As the output function ƒ of a neuron, a step function, a linear ramp function, a sigmoid function, or the like can be used. For example, the arithmetic processing of Formula (a2) can be performed by using a circuit 270 illustrated by FIG. 20B. In the circuit 270, the output function ƒ corresponds to the output characteristics of an operational (OP) amplifier. Furthermore, the arithmetic processing of Formula (a2) can also be performed by using an output signal from the OP amplifier and performing arithmetic processing in an arithmetic circuit associated with a desired output function.

Likewise, the sum (net value) $u_k^{(l+1)}$ of the input to the k-th neuron in the (l+1)th layer is represented by following Formula (a3).

$$u_k^{(l+1)} = \Sigma n w_{kn}^{(l+1)} \cdot z_n^{(l)} \quad (a3)$$

The arithmetic processing of Formula (a3) can be performed by using a product-sum operation circuit, which will be describe later.

The output $z_k^{(l+1)}$ of the k-th neuron in the (l+1)th layer is represented by following Formula (a4).

$$z_k^{(l+1)} = f(u_k^{(l+1)}) \quad (a4)$$

Figure 20C:
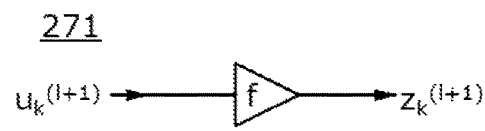

For example, the arithmetic processing of Formula (a4) can be performed by using a circuit 271 illustrated in FIG. 20C. In the circuit 271, the output function ƒ corresponds to the output characteristics of the OP amplifier, as with the circuit 270. Furthermore, the arithmetic processing of Formula (a4) can also be performed by using an output signal from the OP amplifier and performing arithmetic processing in an arithmetic circuit corresponding to a desired output function.

With the above-described configuration, the output $z_k^{(l+1)}$ of the k-th neuron can be obtained.

Next, supervised learning will be described. Supervised learning refers to operation of updating all weight coefficients of a hierarchical neural network on the basis of an output result and a desired result (also referred to as teacher data or a teacher signal in some cases) when the output result and the desired result differ from each other in the function of the above hierarchical neural network.

Figure 21A:
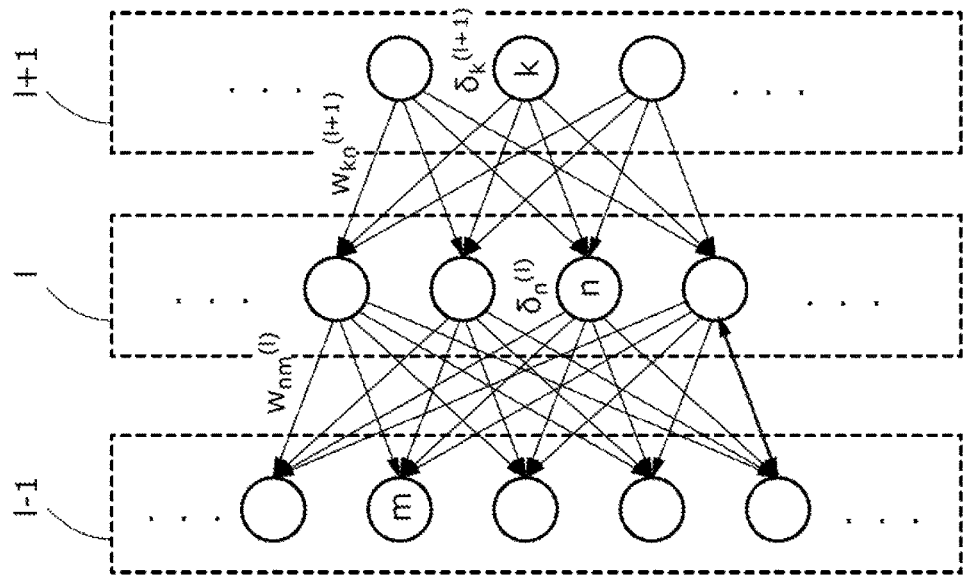
FIG. 21A is a schematic view of backpropagation and FIGS. 21B to 21D illustrate circuit configurations for arithmetic processing.

A learning method using backpropagation will be described as a specific example of supervised learning. FIG. 21A is a schematic view of backpropagation. Backpropagation is a method for changing a weight coefficient so as to reduce an error between an output of a hierarchical neural network and teacher data.

Specifically, in back propagation, with respect to error energy E determined by an output $z_k^{(L)}$ of the output layer and teacher data $t_k$, the weight coefficient $w_{nm}^{(l)}$ of the l-th layer is changed by the update amount $\partial E/\partial w_{nm}^{(l)}$.

For example, when an error $\delta_n^{(l)}$ of the l-th layer is defined as $\delta_n^{(l)} \equiv \partial E/\partial u_n^{(l)}$, the error $\delta_n^{(l)}$ and the update amount $\partial E/\partial w_{nm}^{(l)}$ are represented by following Formula (a5) and Formula (a6), respectively. Note that $f'$ is a derivative of the output function of a neuron.

$$\delta_n^{(l)} = \Sigma_k \delta_k^{(l+1)} \cdot w_{kn}^{(l+1)} \cdot f'(u_n^{(l)}) \quad (a5)$$

$$\partial E/\partial w_{nm}^{(l)} = \delta_n^{(l)} \cdot z_m^{(l-1)} \quad (a6)$$

Figure 21B:
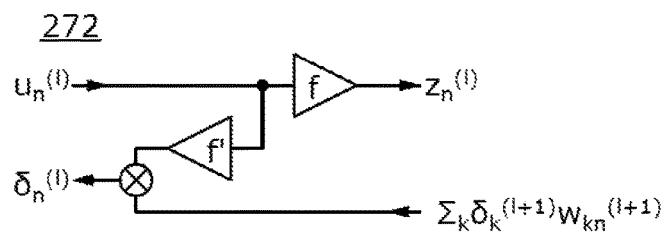
Figure 21C:
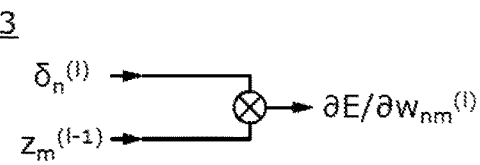

For example, the arithmetic processing of Formula (a5) can be performed by using a circuit 272 illustrated in FIG. 21B. The arithmetic processing of Formula (a6) can be performed by using a circuit 273 illustrated in FIG. 21C. The arithmetic processing regarding the derivative can be performed with an output signal from the OP amplifier in an arithmetic circuit corresponding to a desired derivative, for example.

Part of the arithmetic processing of Formula (a5) can be performed by using a product-sum operation circuit, which will be described later.

An error $\delta_n^{(l+1)}$ and the update amount $\partial E/\partial w_{nm}^{(l+1)}$ of the (l+1)th layer, which is the output layer, are represented by following Formula (a7) and Formula (a8), respectively.

$$\delta_k^{(l+1)} = (z_k^{(l+1)} - t_k) \cdot f'(u_k^{(l+1)}) \quad (a7)$$

$$\partial E/\partial w_{kn}^{(l+1)} = \delta_k^{(l+1)} \cdot z_n^{(l)} \quad (a8)$$

Figure 21D:
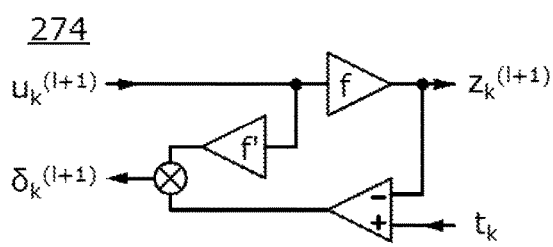

For example, the arithmetic processing of Formula (a7) can be performed by using a circuit 274 illustrated in FIG. 21D. The arithmetic processing of Formula (a8) can be performed by using the circuit 273 illustrated in FIG. 21C.

<<Product-Sum Operation Circuit>>

Figure 22:
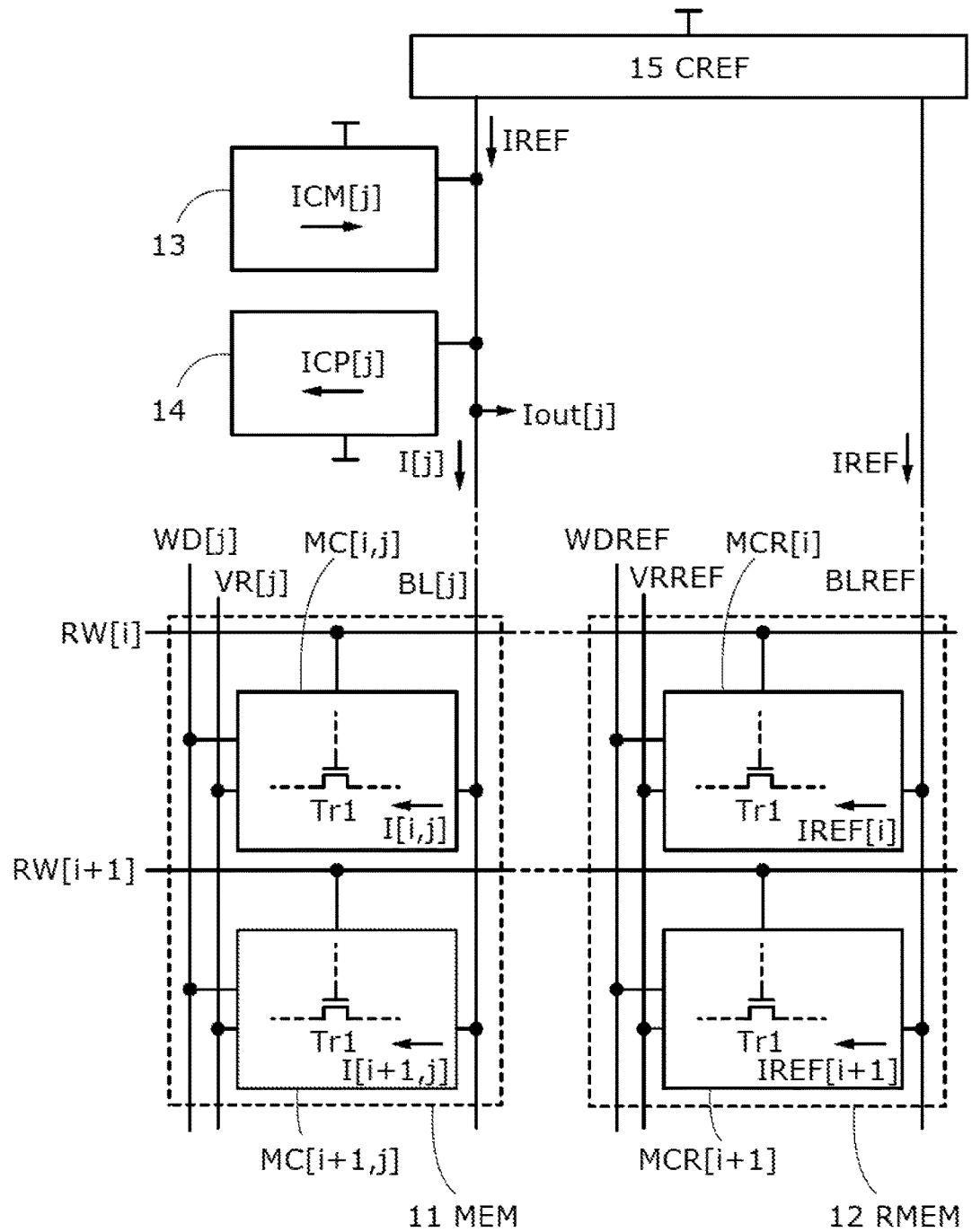
FIG. 22 illustrates a configuration example of a product-sum operation circuit.

FIG. 22 illustrates an example of a product-sum operation circuit; the circuit performs the arithmetic processing represented by Formula (a1) and Formula (a3) in the hierarchical neural network, which is illustrated as an example of a neural network applicable to the AI controller 156.

The example of a product-sum operation circuit illustrated in FIG. 22 has a function of performing analog arithmetic processing using analog data. Having a function of performing analog arithmetic processing enables arithmetic processing without converting analog data into digital data, or with a frequency of converting analog data into digital data being reduced as much as possible. Therefore, this can reduce the enormous amount of arithmetic processing, and thus the scale of an arithmetic circuit can be small. Furthermore, the time required for arithmetic processing can be shortened.

FIG. 22 illustrates a block diagram of a semiconductor device 107 as the example of a product-sum operation circuit. The semiconductor device 107 illustrated in FIG. 22 includes a memory circuit 11 (MEM), a reference memory circuit 12 (RMEM), a circuit 13, and a circuit 14. The semiconductor device 107 may further include a current supply circuit 15 (CREF).

The memory circuit 11 (MEM) includes a memory cell MC such as a memory cell MC[i,j] and a memory cell MC[i+1,j]. The memory cell MC includes an element that has a function of converting an input potential into current. As the element having such a function, an active element such as a transistor can be used, for example. FIG. 22 illustrates an example where each memory cell MC includes a transistor Tr1.

A first analog potential is input to the memory cell MC through a wiring WD such as a wiring WD[j]. The first analog potential corresponds to first analog data. The memory cell MC has a function of generating a first analog current corresponding to the first analog potential. Specifically, drain current of the transistor Tr1, which is obtained when the first analog potential is supplied to a gate of the transistor Tr1, can be used as the first analog current. Hereinafter, current flowing in the memory cell MC[i,j] is denoted by I[i,j], and current flowing in the memory cell MC[i+1,j] is denoted by I[i+1,j].

The drain current of the transistor Tr1 operating in a saturation region is not dependent on voltage between a source and a drain and is controlled by the difference between its gate voltage and threshold voltage. Thus, the transistor Tr1 desirably operates in a saturation region. Note that the gate voltage and the voltage between the source and the drain of the transistor Tr1 are each appropriately set to a voltage at which the transistor Tr1 operates in a saturation region.

Specifically, in the semiconductor device 107 illustrated in FIG. 22, a first analog potential Vx[i,j] is input to the memory cell MC[i,j] through the wiring WD[j]. The memory cell MC[i,j] has a function of generating a first analog current corresponding to the first analog potential Vx[i,j]. This means that the current I[i,j] flowing in the memory cell MC[i,j] corresponds to the first analog current, in this case.

Furthermore, in the semiconductor device 107 illustrated in FIG. 22, a first analog potential Vx[i+1,j] is input to the memory cell MC[i+1,j] through the wiring WD[j]. The memory cell MC[i+1,j] has a function of generating a first analog current corresponding to the first analog potential Vx[i+1,j]. This means that the current I[i+1,j] flowing in the memory cell MC[i+1,j] corresponds to the first analog current, in this case.

The memory cell MC has a function of holding the first analog potential. In other words, the memory cell MC has a function of holding the first analog current corresponding to the first analog potential.

Moreover, a second analog potential is input to the memory cell MC through a wiring RW such as a wiring RW[i] and a wiring RW[i+1]. The second analog potential corresponds to second analog data. The memory cell MC has a function of adding the second analog potential to the first analog potential that is held and a function of holding a third analog potential obtained by the addition. The memory cell MC also has a function of generating a second analog current corresponding to the third analog potential. In other words, the memory cell MC has a function of holding the second analog current corresponding to the third analog potential.

Specifically, in the semiconductor device 107 illustrated in FIG. 22, a second analog potential Vw[i,j] is input to the memory cell MC[i,j] through the wiring RW[i]. The memory cell MC[i,j] has a function of holding a third analog potential corresponding to the first analog potential Vx[i,j] and the second analog potential Vw[i,j]. The memory cell MC[i,j] also has a function of generating a second analog current corresponding to the third analog potential. This means that the current I[i,j] flowing in the memory cell MC[i,j] corresponds to the second analog current, in this case.

Furthermore, in the semiconductor device 107 illustrated in FIG. 22, a second analog potential Vw[i+1,j] is input to the memory cell MC[i+1,j] through the wiring RW[i+1]. The memory cell MC[i+1,j] has a function of holding the first analog potential Vx[i+1,j] and a third analog potential corresponding to the second analog potential Vw[i+1,j]. The memory cell MC[i+1,j] also has a function of generating a second analog current corresponding to the third analog potential. This means that the current I[i+1,j] flowing in the memory cell MC[i+1,j] corresponds to the second analog current, in this case.

The current I[i,j] flows between a wiring BL[j] and a wiring VR[j] through the memory cell MC[i,j]. The current I[i+1,j] flows between the wiring BL[j] and the wiring VR[j] through the memory cell MC[i+1,j]. Accordingly, a current I[j], which corresponds to the sum of the current I[i,j] and the current I[i+1,j], flows between the wiring BL[j] and the wiring VR[j] through the memory cell MC[i,j] and the memory cell MC[i+1,j].

The reference memory circuit 12 (RMEM) includes a memory cell MCR such as a memory cell MCR[i] and a memory cell MCR[i+1]. Note that a first reference potential VPR is input to the memory cell MCR through a wiring WDREF. The memory cell MCR has a function of generating a first reference current corresponding to the first reference potential VPR. Hereinafter, current flowing in the memory cell MCR[i] is denoted by IREF[i], and current flowing in the memory cell MCR[i+1] is denoted by IREF[i+1].

Specifically, in the semiconductor device 107 illustrated in FIG. 22, the first reference potential VPR is input to the memory cell MCR[i] through the wiring WDREF. The memory cell MCR[i] has a function of generating the first reference current corresponding to the first reference potential VPR. This means that the current IREF[i] flowing in the memory cell MCR[i] corresponds to the first reference current, in this case.

Furthermore, in the semiconductor device 107 illustrated in FIG. 22, the first reference potential VPR is input to the memory cell MCR[i+1] through the wiring WDREF. The memory cell MCR[i+1] has a function of generating the first reference current corresponding to the first reference potential VPR. This means that the current IREF[i+1] flowing in the memory cell MCR[i+1] corresponds to the first reference current, in this case.

The memory cell MCR has a function of holding the first reference potential VPR. In other words, the memory cell MCR has a function of holding the first reference current corresponding to the first reference potential VPR.

Moreover, the second analog potential is input to the memory cell MCR through the wiring RW such as the wiring RW[i] and the wiring RW[i+1]. The memory cell MCR has a function of adding the second analog potential to the first reference potential VPR that has been held and holding a second reference potential obtained by the addition. The memory cell MCR also has a function of generating a second reference current corresponding to the second reference potential. In other words, the memory cell MCR has a function of holding the second reference current corresponding to the second reference potential.

Specifically, in the semiconductor device 107 illustrated in FIG. 22, the second analog potential Vw[i,j] is input to the memory cell MCR[i] through the wiring RW[i]. The memory cell MCR[i] has a function of holding a second reference potential corresponding to the first reference potential VPR and the second analog potential Vw[i,j]. The memory cell MCR[i] also has a function of generating the second reference current corresponding to the second reference potential. This means that the current IREF[i] flowing in the memory cell MCR[i] corresponds to the second reference current, in this case.

Furthermore, in the semiconductor device 107 illustrated in FIG. 22, the second analog potential Vw[i+1,j] is input to the memory cell MCR[i+1] through the wiring RW[i+1]. The memory cell MCR[i+1] has a function of holding the first reference potential VPR and a second reference potential corresponding to the second analog potential Vw[i+1,j]. The memory cell MCR[i+1] also has a function of generating the second reference current corresponding to the second reference potential. This means that the current IREF[i+1] flowing in the memory cell MCR[i+1] corresponds to the second reference current, in this case.

The current IREF[i] flows between a wiring BLREF and a wiring VRREF through the memory cell MCR[i]. The current IREF[i+1] flows between the wiring BLREF and the wiring VRREF through the memory cell MCR[i+1]. Accordingly, a current IREF, which corresponds to the sum of the current IREF[i] and the current IREF[i+1], flows between the wiring BLREF and the wiring VRREF through the memory cell MCR[i] and the memory cell MCR[i+1].

The current supply circuit 15 has a function of supplying current with the same value as the current IREF that flows through the wiring BLREF or supplying current corresponding to the current IREF to the wiring BL. In the case where the current I[j] that flows between the wiring BL[j] and the wiring VR[j] through the memory cell MC[i,j] and the memory cell MC[i+1,j] is different from the current IREF that flows between the wiring BLREF and the wiring VRREF through the memory cell MCR[i] and the memory cell MCR[i+1] and thus offset current is set as described later, current corresponding to the difference flows in the circuit 13 or the circuit 14. The circuit 13 functions as a current source circuit, and the circuit 14 functions as a current sink circuit.

Specifically, in the case where the current I[j] is higher than the current IREF, the circuit 13 has a function of generating a current ΔI[j] that corresponds to the difference between the current I[j] and the current IREF. The circuit 13 also has a function of supplying the generated current ΔI[j] to the wiring BL[j]. This means that the circuit 13 has a function of holding the current ΔI[j].

In the case where the current I[j] is lower than the current IREF, the circuit 14 has a function of generating the current ΔI[j] that corresponds the difference between the current I[j] and the current IREF. The circuit 14 also has a function of drawing current corresponding to the value of the generated current ΔI[j] from the wiring BL[j]. This means that the circuit 14 has a function of holding the current ΔI[j].

Next, an operation example of the semiconductor device 107 illustrated in FIG. 22 will be described.

First, a potential corresponding to the first analog potential is stored in the memory cell MC[i,j]. Specifically, a potential VPR−Vx[i,j], which is obtained by subtracting the first analog potential Vx[i,j] from the first reference potential VPR, is input to the memory cell MC[i,j] through the wiring WD[j]. The memory cell MC[i,j] holds the potential VPR−Vx[i,j]. In addition, the memory cell MC[i,j] generates the current I[i,j] that corresponds to the potential VPR−Vx[i,j]. The first reference potential VPR is, for example, a high-level potential that is higher than a ground potential. Specifically, the first reference potential VPR is desirably higher than a ground potential and as high as or lower than a high-level potential VDD that is supplied to the current supply circuit 15.

Furthermore, the first reference potential VPR is stored in the memory cell MCR[i]. Specifically, the potential VPR is input to the memory cell MCR[i] through the wiring WDREF. The memory cell MCR[i] holds the potential VPR. In addition, the memory cell MCR[i] generates the current IREF[i] that corresponds to the potential VPR.

Moreover, a potential corresponding to the first analog potential is stored in the memory cell MC[i+1,j]. Specifically, a potential VPR−Vx[i+1,j], which is obtained by subtracting the first analog potential Vx[i+1,j] from the first reference potential VPR, is input to the memory cell MC[i+1,j] through the wiring WD[j]. The memory cell MC[i+1,j] holds the potential VPR−Vx[i+1,j]. In addition, the memory cell MC[i+1,j] generates the current I[i+1,j] that corresponds to the potential VPR−Vx[i+1,j].

Furthermore, the first reference potential VPR is stored in the memory cell MCR[i+1]. Specifically, the potential VPR is input to the memory cell MCR[i+1] through the wiring WDREF. The memory cell MCR[i+1] holds the potential VPR. In addition, the memory cell MCR[i+1] generates the current IREF[i+1] that corresponds to the potential VPR.

During the above operation, the wiring RW[i] and the wiring RW[i+1] are each set to a base potential. As a base potential, for example, a ground potential or a low-level potential VSS that is lower than a ground potential can be used. Alternatively, a potential between the potential VSS and the potential VDD may be used as a base potential. This is preferable because the potential of the wiring RW can be higher than a ground potential regardless of whether the second analog potential Vw is positive or negative, which enables easy generation of signals and multiplication of either positive or negative analog data.

As a result of the above operation, current corresponding to the sum of currents generated in the memory cells MC electrically connected to the wiring BL[j] flows through the wiring BL[j]. Specifically, in FIG. 22, the current I[j], which is the sum of the current I[i,j] generated in the memory cell MC[i,j] and the current I[i+1,j] generated in the memory cell MC[i+1,j], flows through the wiring BL[j]. In addition, as a result of the above operation, current corresponding to the sum of currents generated in the memory cells MCR electrically connected to the wiring BLREF flows through the wiring BLREF. Specifically, in FIG. 22, the current IREF, which is the sum of the current IREF[i] generated in the memory cell MCR[i] and the current IREF[i+1] generated in the memory cell MCR[i+1], flows through the wiring BLREF.

Next, an offset current Ioffset[j], which is the difference between the current I[j] obtained by inputting the first analog potential and the current IREF obtained by inputting the first reference potential, is held in the circuit 13 or the circuit 14 while the wiring RW[i] and the wiring RW[i+1] are kept at base potentials.

Specifically, when the current I[j] is higher than the current IREF, the circuit 13 supplies the current Ioffset[j] to the wiring BL[j]. This means that a current ICM[j] that flows in the circuit 13 corresponds to the current Ioffset[j]. The current ICM[j] is held in the circuit 13. When the current I[j] is lower than the current IREF, the circuit 14 draws the current Ioffset[j] from the wiring BL[j]. This means that a current ICP[j] that flows in the circuit 14 corresponds to the current Ioffset[j]. The current ICP[j] is held in the circuit 14.

Then, the second analog potential is stored in the memory cell MC[i,j] so as to be added to the first analog potential held in the memory cell MC[i,j]. Specifically, when the potential of the wiring RW[i] is set to a potential that is higher than a base potential by Vw[i], a second analog potential Vw[i] is input to the memory cell MC[i,j] through the wiring RW[i]. The memory cell MC[i,j] holds a potential VPR−Vx[i,j]+Vw[i]. Furthermore, the memory cell MC[i,j] generates the current I[i,j] corresponding to the potential VPR−Vx[i,j]+Vw[i].

In addition, the second analog potential is stored in the memory cell MC[i+1,j] so as to be added to the first analog potential held in the memory cell MC[i+1,j]. Specifically, when the potential of the wiring RW[i+1] is set to a potential that is higher than a base potential by Vw[i+1], a second analog potential Vw[i+1] is input to the memory cell MC[i+1,j] through the wiring RW[i+1]. The memory cell MC[i+1,j] holds a potential VPR−Vx[i+1,j]+Vw[i+1]. Furthermore, the memory cell MC[i+1,j] generates the current I[i+1,j] corresponding to the potential VPR−Vx[i+1,j]+Vw[i+1].

In the case where the transistor Tr1 that operates in a saturation region is used as an element for converting a potential into current, since the drain current of the transistor Tr1 included in the memory cell MC[i,j] corresponds to the current I[i,j], the second analog current is expressed by Formula (a9) below. Note that Vw[i] is the potential of the wiring RW[i], Vw[i+1] is the potential of the wiring RW[i+1], k is a coefficient, and Vth is the threshold voltage of the transistor Tr1.

$$I[i,j]=k(Vw[i]-Vth+VPR-Vx[i,j])^2 \quad (a9)$$

Furthermore, since the drain current of the transistor Tr1 included in the memory cell MCR[i] corresponds to the current IREF[i], the second reference current is expressed by Formula (a10) below.

$$IREF[i]=k(Vw[i]-Vth+VPR)^2 \quad (a10)$$

The current I[j], which corresponds to the sum of the current I[i,j] flowing in the memory cell MC[i,j] and the current I[i+1,j] flowing in the memory cell MC[i+1,j], can be expressed as $\Sigma_i I[i,j]$. The current IREF, which corresponds to the sum of the current IREF[i] flowing in the memory cell MCR[i] and the current IREF[i+1] flowing in the memory cell MCR[i+1], can be expressed as $\Sigma_i IREF[i]$. Accordingly, the current ΔI[j] that correspond to the difference between the current I[j] and the current IREF is expressed by Formula (a11) below.

$$\Delta I[j]=IREF-I[j]=\Sigma_i IREF[i]-\Sigma_i I[i,j] \quad (a11)$$

The current ΔI[j] can be obtained from Formulae (a9) to (a11), as expressed by Formula (a12) below.

$$\begin{aligned}\Delta I[j] &= \Sigma_i\{k(Vw[i]-Vth+VPR)^2 - k(Vw[i]-Vth+VPR-Vx[i,j])^2\} \\ &= 2k\Sigma_i(Vw[i]\cdot Vx[i,j]) - 2k\Sigma_i(Vth-VPR)\cdot Vx[i,j] - k\Sigma_i Vx[i,j]^2\end{aligned} \quad (a12)$$

The term $2k\Sigma_i(Vw[i]\cdot Vx[i,j])$ in Formula (a12) corresponds to the sum of the product of the first analog potential Vx[i,j] and the second analog potential Vw[i] and the product of the first analog potential Vx[i+1,j] and the second analog potential Vw[i+1].

Given that the current Ioffset[j] is defined as the current ΔI[j] at the time when the potential of the wirings RW[i] are set to the base potential, that is, when the second analog potential Vw[i] and the second analog potential Vw[i+1] are both 0, the following Formula (a13) is obtained from Formula (a12).

$$Ioffset[j]=-2k\Sigma_i(Vth-VPR)\cdot Vx[i,j]-k\Sigma_i Vx[i,j]^2 \quad (a13)$$

It is found from Formulae (a11) to (a13) that $2k\Sigma i(Vw[i]\cdot Vx[i,j])$ that corresponds to the product-sum of the first analog data and the second analog data is expressed by Formula (a14) below.

$$2k\Sigma_i(Vw[i]\cdot Vx[i,j])=IREF-I[j]-Ioffset[j] \quad (a14)$$

When the potential of the wiring RW[i] is Vw[i] and the potential of the wiring RW[i+1] is Vw[i+1], a current Iout[j] that flows from the wiring BL[j] is expressed by IREF−I[j]−Ioffset[j], where I[j] is the sum of currents flowing in the memory cells MC, IREF is the sum of currents flowing in the memory cells MCR, and Ioffset[j] is current flowing in the circuit 13 or the circuit 14. According to Formula (a14), the current Iout[j] equals $2k\Sigma i(Vw[i]\cdot Vx[i,j])$, which corresponds to the sum of the product of the first analog potential Vx[i,j] and the second analog potential Vw[i] and the product of the first analog potential Vx[i+1,j] and the second analog potential Vw[i+1].

The transistor Tr1 preferably operates in a saturation region. However, even if the operation region of the transistor Tr1 deviates from an ideal saturation region, the transistor Tr1 is regarded as operating in a saturation region as long as there is no problem in obtaining a current that corresponds to the sum of the product of the first analog potential Vx[i,j] and the second analog potential Vw[i] and the product of the first analog potential Vx[i+1,j] and the second analog potential Vw[i+1] with an accuracy within a desired range.

For example, weight coefficients $w_{n1}^{(l)}$ to $w_{nM}^{(l)}$ of the neurons in the l-th layer are stored into memory cells MC[1,j] to [M,j] in the j-th column as first analog data, and outputs $z_1^{(l-1)}$ to $z_M^{(l-1)}$ of the neurons in the (l−1)th layer are input to the memory cells MC[1,j] to MC[M,j] as second analog data through wirings RW[1] to RW[M]. By the above-described operation, the sum (net value) $u_n^{(l)}$ of the input to the n-th neuron in the l-th layer can be obtained from the current ΔIout[j]. Thus, Formula (a1) can be calculated by using the semiconductor device 107.

For example, weight coefficients $w_{n1}^{(l+1)}$ to $w_{nM}^{(l+1)}$ of the neurons in the (l+1)th layer are stored into the memory cells MC[1,j] to [M,j] in the j-th column as first analog data, and outputs $z_1^{(l)}$ to $z_M^{(l)}$ of the neurons in the l-th layer are input to the memory cells MC[1,j] to MC[M,j] as second analog data through the wirings RW[1] to RW[M]. By the above-described operation, the sum (net value) $u_k^{(l+1)}$ of the input to the k-th neuron in the (l+1)th layer can be obtained from the current ΔIout[j]. Thus, Formula (a3) can be calculated by using the semiconductor device 107.

For example, weight coefficients $w_{n1}^{(l+1)}$ to $w_{nK}^{(l+1)}$ of the neurons in the (l+1)th layer are stored into the memory cells MC[1,j] to [K,j] in the j-th column as first analog data, and errors $\delta_1^{(l+1)}$ to $\delta_K^{(l+1)}$ of the neurons in the (l+1)th layer are input to the memory cells MC[1,j] to MC[K,j] as second analog data through the wirings RW[1] to RW[K]. By the above-described operation, the value of $\Sigma_k \delta_k^{(l+1)} \cdot w_{kn}^{(l+1)}$ in Formula (a5) can be obtained from the current ΔIout[j]. Thus, part of Formula (a5) can be calculated by using the semiconductor device 107.

According to one embodiment of the present invention, arithmetic processing of analog data can be performed without converting the analog data into digital data, and thus the circuit scale of an arithmetic circuit can be small. Alternatively, according to one embodiment of the present invention, arithmetic processing of analog data can be performed without converting the analog data into digital data, and thus the time required for the arithmetic processing can be shortened. Alternatively, according to one embodiment of the present invention, power consumption of an arithmetic circuit can be reduced while the time required for arithmetic processing of analog data is shortened.

Next, a specific configuration example of the memory circuit 11 (MEM) and the reference memory circuit 12 (RMEM) will be described with reference to FIG. 23.

Figure 23:
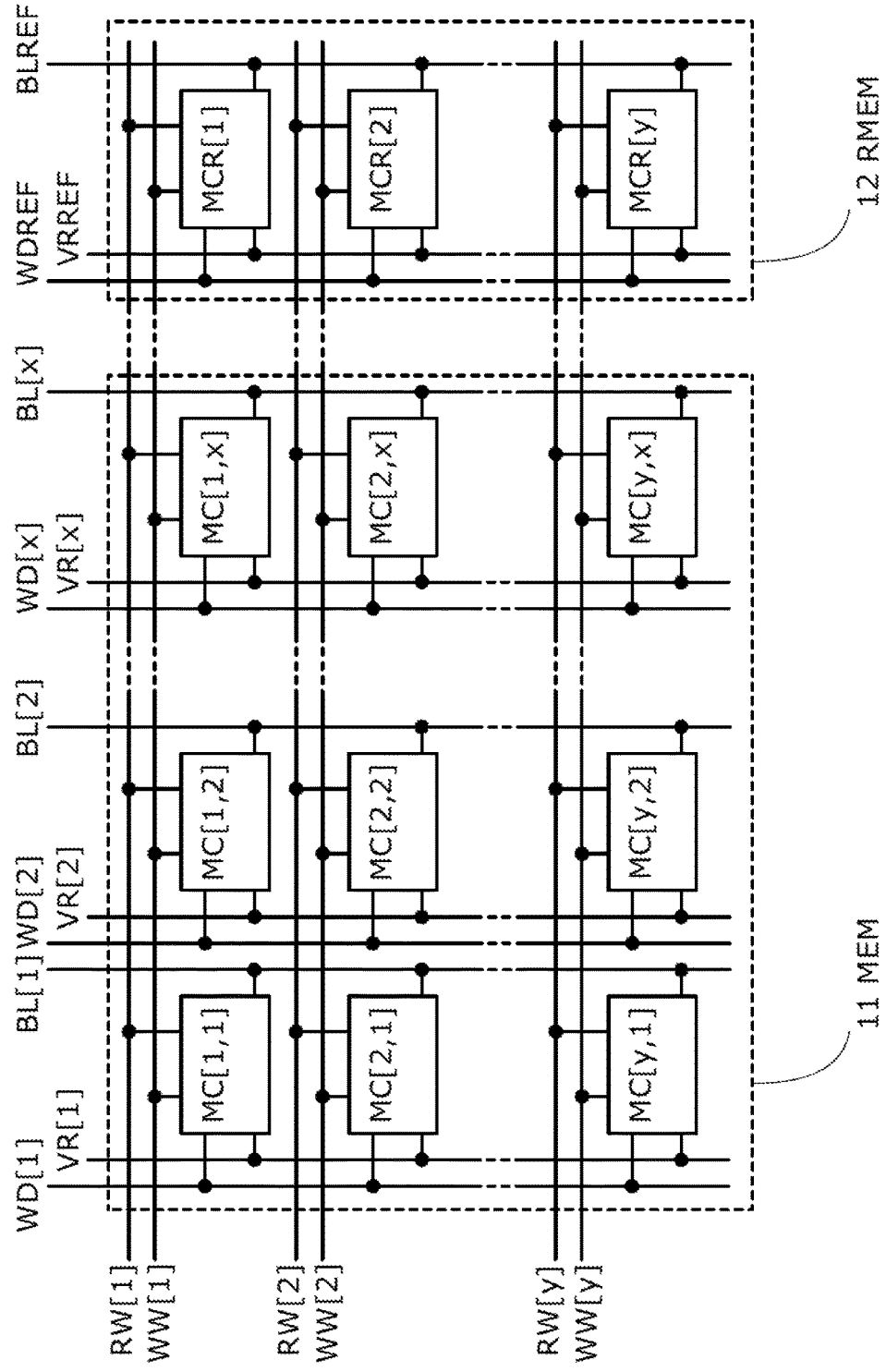
FIG. 23 illustrates a configuration of a memory circuit and a reference memory circuit.

FIG. 23 illustrates an example where the memory circuit 11 (MEM) includes the memory cells MC in y rows and x columns (x and y are natural numbers) and the reference memory circuit 12 (RMEM) includes the memory cells MCR in y rows and one column.

The memory circuit 11 is electrically connected to the wiring RW, a wiring WW, the wiring WD, the wiring VR, and the wiring BL. In the example illustrated in FIG. 23, wirings RW[1] to RW[y] and wirings WW[1] to WW[y] are electrically connected to the memory cells MC in the respective rows. Moreover, wirings WD[1] to WD[x], wirings BL[1] to BL[x], and wirings VR[1] to VR[x] are electrically connected to the memory cells MC in the respective columns. Note that the wirings VR[1] to VR[x] may be electrically connected to each other.

The reference memory circuit 12 is electrically connected to the wiring RW, the wiring WW, the wiring WDREF, the wiring VRREF, and the wiring BLREF. In the example illustrated in FIG. 23, the wirings RW[1] to RW[y] and the wirings WW[1] to WW[y] are electrically connected to the memory cells MCR in the respective rows. Moreover, the wiring WDREF, the wiring BLREF, and the wiring VRREF are electrically connected to the memory cells MCR in the one column. Note that the wiring VRREF may be electrically connected to the wirings VR[1] to VR[x].

Figure 24:
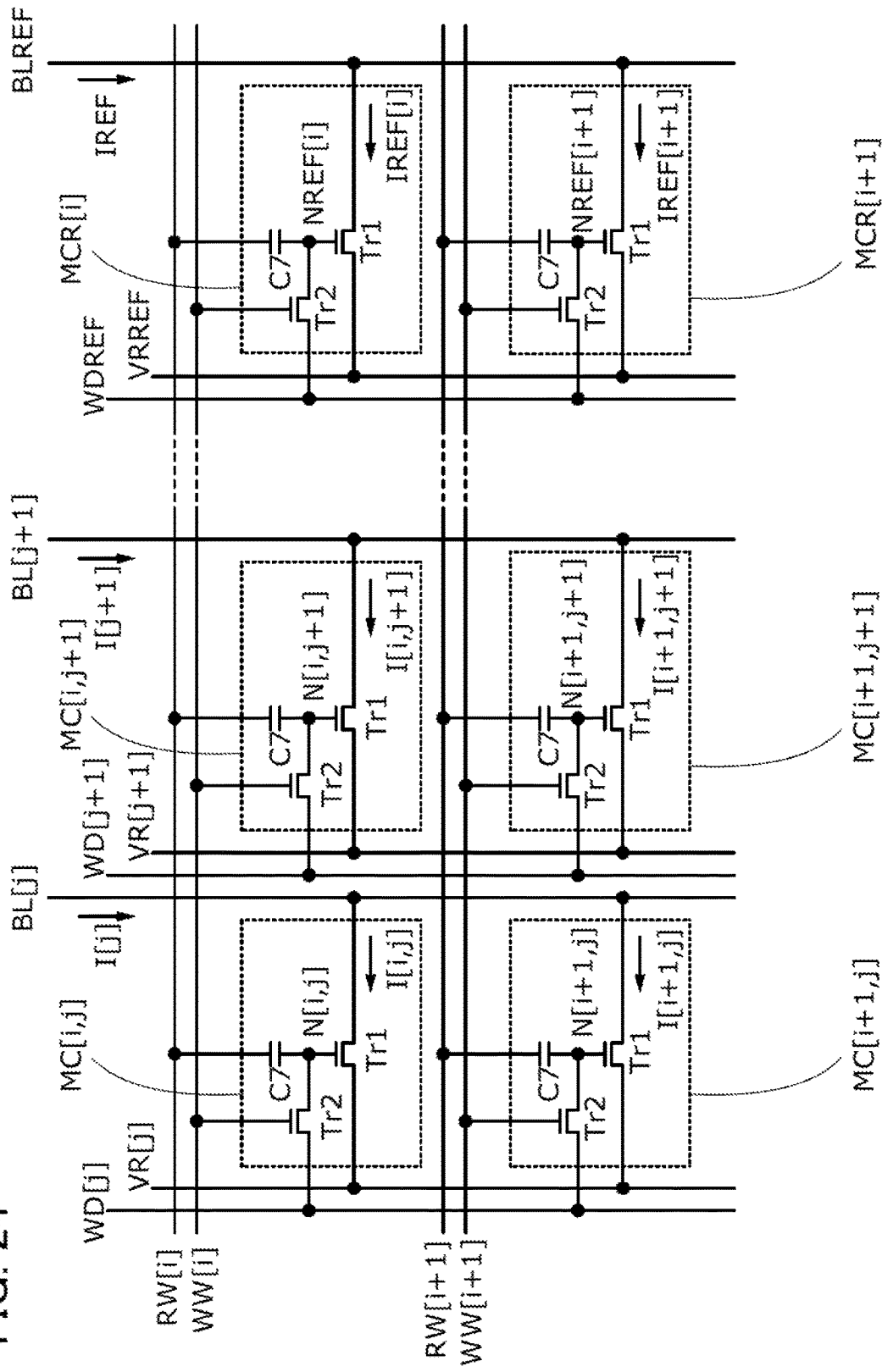
FIG. 24 illustrates a circuit configuration and connection relation of memory cells.

FIG. 24 illustrates, as an example, a specific circuit configuration and a specific connection relationship of the memory cells MC in any two rows and two columns among the memory cells MC illustrated in FIG. 23 and the memory cells MCR in any two rows and one column among the memory cells MCR illustrated in FIG. 23.

Specifically, FIG. 24 illustrates the memory cell MC[i,j] in the i-th row and the j-th column, the memory cell MC[i+1,j] in the (i+1)th row and the j-th column, a memory cell MC[i,j+1] in the i-th row and the (j+1)th column, and a memory cell MC[i+1,j+1] in the (i+1)th row and the (j+1)th column. FIG. 24 also illustrates the memory cell MCR[i] in the i-th row and the memory cell MCR[i+1] in the (i+1)th row. Note that i is any number from 1 to y−1, and j is any number from 1 to x−1.

The memory cell MC[i,j], the memory cell MC[i,j+1], and the memory cell MCR[i] in the i-th row are electrically connected to the wiring RW[i] and a wiring WW[i]. The memory cell MC[i+1,j], the memory cell MC[i+1,j+I], and the memory cell MCR[i+1] in the i+1-th row are electrically connected to the wiring RW[i+1] and a wiring WW[i+1].

The memory cell MC[i,j] and the memory cell MC[i+1,j] in the j-th column are electrically connected to the wiring WD[j], the wiring VR[j], and the wiring BL[j]. The memory cell MC[i,j+1] and the memory cell MC[i+1,j+1] in the j+1-th column are electrically connected to a wiring WD[i+1], a wiring VR[j+1], and a wiring BL[i+1]. The memory cell MCR[i] in the i-th row and the memory cell MCR[i+1] in the (i+1)th row are electrically connected to the wiring WDREF, the wiring VRREF, and the wiring BLREF.

The memory cells MC and MCR each include the transistor Tr1, a transistor Tr2, and a capacitor C7. The transistor Tr2 has a function of controlling the input of the first analog potential to the memory cell MC or the memory cell MCR. The transistor Tr1 has a function of generating analog current in accordance with a potential input to its gate. The capacitor C7 has a function of adding the second analog potential to the first analog potential retained in the memory cell MC or the memory cell MCR.

Specifically, in the memory cell MC illustrated in FIG. 24, a gate of the transistor Tr2 is electrically connected to the wiring WW, one of a source and a drain of the transistor Tr2 is electrically connected to the wiring WD, and the other of the source and the drain of the transistor Tr2 is electrically connected to the gate of the transistor Tr1. Furthermore, one of a source and a drain of the transistor Tr1 is electrically connected to the wiring VR, and the other of the source and the drain of the transistor Tr1 is electrically connected to the wiring BL. A first electrode of the capacitor C7 is electrically connected to the wiring RW, and a second electrode of the capacitor C7 is electrically connected to the gate of the transistor Tr1.

In addition, in the memory cell MCR illustrated in FIG. 24, a gate of the transistor Tr2 is electrically connected to the wiring WW, one of a source and a drain of the transistor Tr2 is electrically connected to the wiring WDREF, and the other of the source and the drain of the transistor Tr2 is electrically connected to the gate of the transistor Tr1. Furthermore, one of a source and a drain of the transistor Tr1 is electrically connected to the wiring VRREF, and the other of the source and the drain of the transistor Tr1 is electrically connected to the wiring BLREF. A first electrode of the capacitor C7 is electrically connected to the wiring RW, and a second electrode of the capacitor C7 is electrically connected to the gate of the transistor Tr1.

The gate of the transistor Tr1 in the memory cell MC is referred to as a node N here. In the memory cell MC, the first analog potential is input to the node N through the transistor Tr2. Then, when the transistor Tr2 is turned off, the node N is brought into a floating state and the first analog potential is held at the node N. In the memory cell MC, when the node N is brought into a floating state, the second analog potential that is input to the first electrode of the capacitor C7 is supplied to the node N. As a result of the above operation, the node N can has a potential obtained by adding the second analog potential to the first analog potential.

Since the potential of the first electrode of the capacitor C7 is supplied to the node N through the capacitor C7, the amount of change in the potential of the node N is not exactly the same as the amount of change in the potential of the first electrode in an actual circuit. Specifically, the accurate amount of change in the potential of the node N can be calculated in the following manner: a coupling coefficient that is uniquely determined by the capacitance of the capacitor C7, the gate capacitance of the transistor Tr1, and a parasitic capacitance is multiplied by the amount of change in the potential of the first electrode. In the following description, the amount of change in the potential of the first electrode is assumed to be substantially the same as the amount of change in the potential of the node N, for easy understanding.

The drain current of the transistor Tr1 is determined in accordance with the potential of the node N. Thus, when the transistor Tr2 is turned off, the value of the drain current of the transistor Tr1 as well as the potential of the node N is held. The drain current is affected by the first analog potential and the second analog potential.

The gate of the transistor Tr1 in the memory cell MCR is referred to as a node NREF here. In the memory cell MCR, the first reference potential is input to the node NREF through the transistor Tr2. Then, when the transistor Tr2 is turned off, the node NREF is brought into a floating state and the first reference potential is held at the node NREF. In the memory cell MCR, when the node NREF is brought into a floating state, the second analog potential that is input to the first electrode of the capacitor C7 is supplied to the node NREF. As a result of the above operation, the node NREF has a potential obtained by adding the second analog potential to the first reference potential.

The drain current of the transistor Tr1 is determined in accordance with the potential of the node NREF. Thus, when the transistor Tr2 is turned off, the value the drain current of the transistor Tr1 as well as the potential of the node NREF is held. The drain current is affected by the first reference potential and the second analog potential.

When the drain current of the transistor Tr1 in the memory cell MC[i,j] is the current I[i,j] and the drain current of the transistor Tr1 in the memory cell MC[i+1,j] is the current I[i+1,j], the sum of currents supplied to the memory cell MC[i,j] and the memory cell MC[i+1,j] through the wiring BL[j] is the current I[j]. When the drain current of the transistor Tr1 in the memory cell MC[i,j+1] is a current I[i,j+1] and the drain current of the transistor Tr1 in the memory cell MC[i+1,j+1] is a current I[i+1, j+1], the sum of currents supplied to the memory cell MC[i,j+1] and the memory cell MC[i+1,j+1] through the wiring BL[j+1] is a current I[j+1]. When the drain current of the transistor Tr1 in the memory cell MCR[i] is the current IREF[i] and the drain current of the transistor Tr1 in the memory cell MCR[i+1] is the current IREF[i+1], the sum of currents supplied to the memory cell MCR[i] and the memory cell MCR[i+1] through the wiring BLREF is the current IREF.

Then, a specific configuration example of the circuit 13, the circuit 14, and the current supply circuit 15 (CREF) will be described with reference to FIG. 25.

Figure 25:
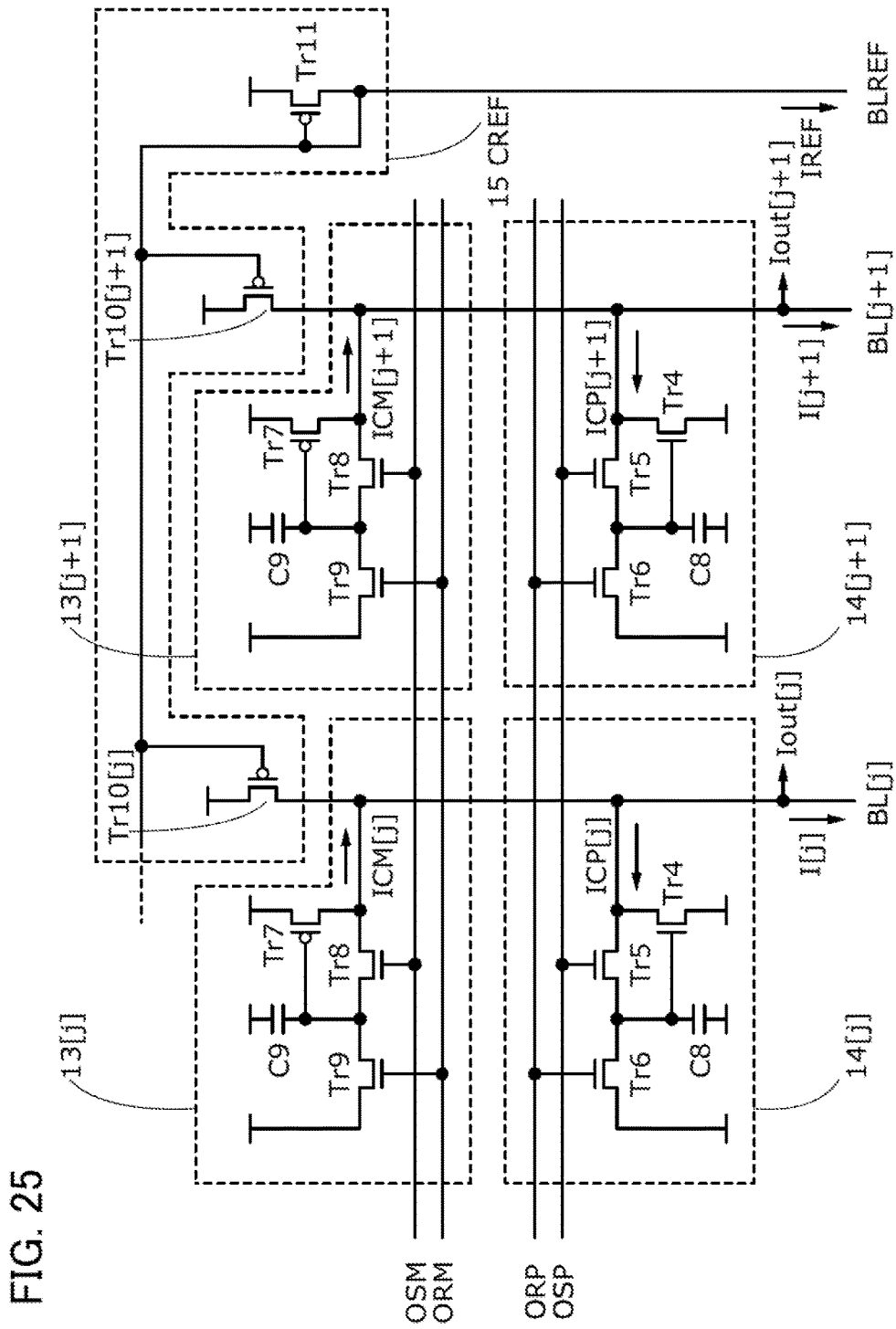
FIG. 25 illustrates a configuration of a circuit 13, a circuit 14, and a current supply circuit.

FIG. 25 illustrates a configuration example of the circuit 13, the circuit 14, and the current supply circuit 15 for the memory cell MC and the memory cell MCR illustrated in FIG. 24. Specifically, the circuit 13 illustrated in FIG. 25 includes a circuit 13[*j*] for the memory cells MC in the j-th column and a circuit 13[*j*+1] for the memory cells MC in the j+1-th column. The circuit 14 illustrated in FIG. 25 includes a circuit 14[*j*] for the memory cells MC in the j-th column and a circuit 14[*j*+1] for the memory cells MC in the j+1-th column.

The circuit 13[*j*] and the circuit 14[*j*] are electrically connected to the wiring BL[j]. The circuit 13[*j*+1] and the circuit 14[*j*+1] are electrically connected to the wiring BL[j+1].

The current supply circuit 15 is electrically connected to the wiring BL[j], the wiring BL[j+1], and the wiring BLREF. The current supply circuit 15 has a function of supplying the current IREF to the wiring BLREF, and a function of supplying a current that is the same as the current IREF or a current that corresponds to the current IREF to each of the wiring BL[j] and the wiring BL[j+1].

Specifically, the circuit 13[*j*] and the circuit 13[*j*+1] each include a transistor Tr7, a transistor Tr8, a transistor Tr9, and a capacitor C9. The transistor Tr7 in the circuit 13[*j*] has a function of generating the current ICM[j] that corresponds to the difference between the current I[j] and the current IREF, when the current I[j] is higher than the current IREF and offset current is set. Furthermore, the transistor Tr7 in the circuit 13[*j*+1] has a function of generating a current ICM

[j+1] that corresponds to the difference between the current I[j+1] and the current IREF, when the current I[j+1] is higher than the current IREF. The current ICM[j] and the current ICM[j+1] are supplied from the circuit 13[*j*] and the circuit 13[*j*+1] to the wiring BL[j] and the wiring BL[j+1], respectively.

In each of the circuit 13[*j*] and the circuit 13[*j*+1], one of a source and a drain of the transistor Tr7 is electrically connected to the corresponding wiring BL, and the other of the source and the drain is electrically connected to a wiring through which a predetermined potential is supplied. One of a source and a drain of the transistor Tr8 is electrically connected to the corresponding wiring BL, and the other of the source and the drain is electrically connected to a gate of the transistor Tr7. One of a source and a drain of the transistor Tr9 is electrically connected to the gate of the transistor Tr7, and the other of the source and the drain is electrically connected to a wiring through which a predetermined potential is supplied. A first electrode of the capacitor C9 is electrically connected to the gate of the transistor Tr7, and a second electrode of the capacitor C9 is electrically connected to a wiring through which a predetermined potential is supplied.

A gate of the transistor Tr8 is electrically connected to a wiring OSM, and a gate of the transistor Tr9 is electrically connected to a wiring ORM.

Note that FIG. 25 illustrates an example where the transistor Tr7 is a p-channel transistor and the transistors Tr8 and Tr9 are n-channel transistors.

The circuit 14[*j*] and the circuit 14[*j*+1] each include a transistor Tr4, a transistor Tr5, a transistor Tr6, and a capacitor C8. The transistor Tr4 in the circuit 14[*j*] has a function of generating the current ICP[j] that corresponds to the difference between the current IREF and the current I[j], when the current I[j] is lower than the current IREF and offset current is set. Furthermore, the transistor Tr4 in the circuit 14[*j*+1] has a function of generating a current ICP[j+1] that corresponds to the difference between the current IREF and the current I[j+1], when the current I[j+1] is lower than the current IREF. The current ICP[j] and the current ICP[j+1] are drawn from the wiring BL[j] and the wiring BL[j+1] into the circuit 14[*j*] and the circuit 14[*j*+1], respectively.

Note that the current ICM[j] and the current ICP[j] each correspond to the current Ioffset[j], and the current ICM[j+1] and the current ICP[j+1] each correspond to a current Ioffset[j+1].

In each of the circuit 14[*j*] and the circuit 14[*j*+1], one of a source and a drain of the transistor Tr4 is electrically connected to the corresponding wiring BL, and the other of the source and the drain is electrically connected to a wiring through which a predetermined potential is supplied. One of a source and a drain of the transistor Tr5 is electrically connected to the corresponding wiring BL, and the other of the source and the drain is electrically connected to a gate of the transistor Tr4. One of a source and a drain of the transistor Tr6 is electrically connected to the gate of the transistor Tr4, and the other of the source and the drain is electrically connected to a wiring through which a predetermined potential is supplied. A first electrode of the capacitor C8 is electrically connected to the gate of the transistor Tr4, and a second electrode of the capacitor C8 is electrically connected to a wiring through which a predetermined potential is supplied.

A gate of the transistor Tr5 is electrically connected to a wiring OSP, and a gate of the transistor Tr6 is electrically connected to a wiring ORP.

Note that FIG. 25 illustrates an example where the transistors Tr4 to Tr6 are n-channel transistors.

The current supply circuit 15 includes a transistor Tr10 for the wiring BL and a transistor Tr11 for the wiring BLREF. Specifically, FIG. 25 illustrates an example where the current supply circuit 15 includes, as the transistor Tr10, a transistor Tr10[*j*] for the wiring BL[j] and a transistor Tr10[*j*+1] for the wiring BL[j+1].

A gate of the transistor Tr10 is electrically connected to a gate of the transistor Tr11. One of a source and a drain of the transistor Tr10 is electrically connected to the corresponding wiring BL, and the other of the source and the drain is electrically connected to a wiring through which a predetermined potential is supplied. One of a source and a drain of the transistor Tr11 is electrically connected to the wiring BLREF, and the other of the source and the drain is electrically connected to a wiring through which a predetermined potential is supplied.

The transistors Tr10 and Tr11 have the same polarity. FIG. 25 illustrates an example where the transistors Tr10 and Tr11 are p-channel transistors.

The drain current of the transistor Tr11 corresponds to the current IREF. The transistor Tr10 and the transistor Tr11 collectively function as a current mirror circuit; thus, the drain current of the transistor Tr10 is substantially the same as the drain current of the transistor Tr11 or corresponds to the drain current of the transistor Tr11.

A switch may be provided between the circuit 13[*j*] and the circuit 14[*j*] illustrated in FIG. 25. Alternatively, a switch may be provided between the circuit 13[*j*+1] and the circuit 14[*j*+1]. Alternatively, a switch may be provided between the reference memory circuit 12 and the transistor Tr11 included in the current supply circuit 15.

Next, a specific operation example of the semiconductor device 107 of one embodiment of the present invention will be described with reference to FIGS. 24 and 25.

Figure 26:
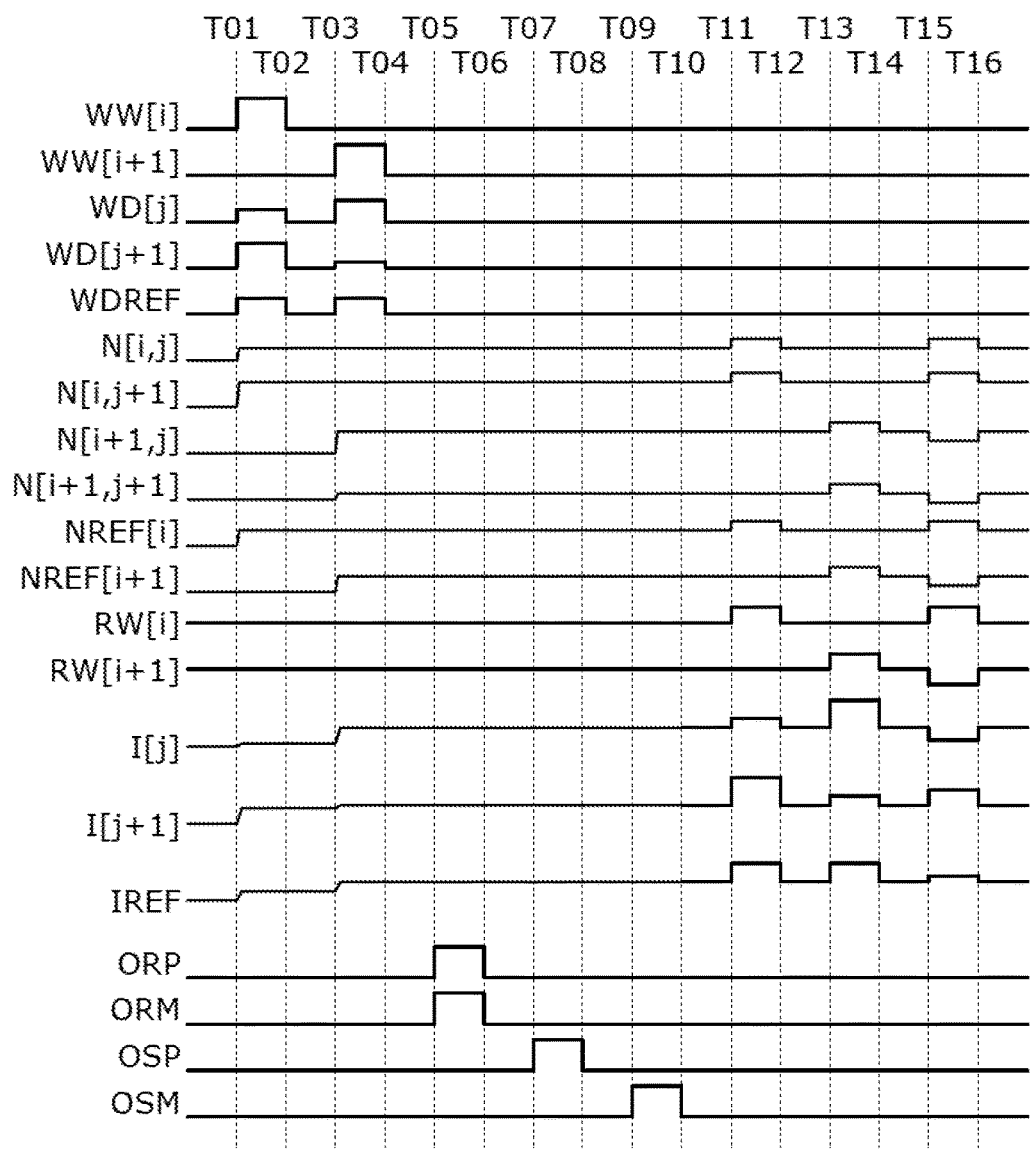
FIG. 26 is a timing diagram.

FIG. 26 is an example of a timing chart showing the operations of the memory cell MC and the memory cell MCR illustrated in FIG. 24 and the circuit 13, the circuit 14, and the current supply circuit 15 illustrated in FIG. 25. From Time T01 to Time T04 in FIG. 26, the first analog data is stored in the memory cell MC and the memory cell MCR. From Time T05 to Time T10, the offset current Ioffset is set to the circuit 13 and the circuit 14. From Time T11 to Time T16, data corresponding to the product-sum of the first analog data and the second analog data is acquired.

Note that a low-level potential is supplied to the wiring VR[j] and the wiring VR[j+1]. The high-level potential VDD is supplied to all wirings having a predetermined potential that are electrically connected to the circuit 13. The low-level potential VSS is supplied to all wirings having a predetermined potential that are electrically connected to the circuit 14. Furthermore, the high-level potential VDD is supplied to all wirings having a predetermined potential that are electrically connected to the current supply circuit 15.

The transistors Tr1, Tr4, Tr7, Tr10[*j*], Tr10[*j*+1], and Tr11 each operate in a saturation region.

First, a high-level potential is applied to the wiring WW[i] and a low-level potential is applied to the wiring WW[i+1] from Time T01 to Time T02. Accordingly, the transistors Tr2 in the memory cell MC[i,j], the memory cell MC[i,j+1], and the memory cell MCR[i] illustrated in FIG. 24 are turned on. The transistors Tr2 in the memory cell MC[i+1,j], the memory cell MC[i+1,j+1], and the memory cell MCR[i+1] remain off.

In addition, from Time T01 to Time T02, a potential obtained by subtracting the first analog potential from the first reference potential VPR is applied to each of the wiring WD[j] and the wiring WD[j+1] illustrated in FIG. 24. Specifically, the potential VPR−Vx[i,j] is applied to the wiring WD[j], and a potential VPR−Vx[i,j+1] is applied to the wiring WD[j+1]. The first reference potential VPR is applied to the wiring WDREF, and a potential between the potential VSS and the potential VDD, e.g., a potential (VDD+VSS)/2, is applied as a base potential to the wiring RW[i] and the wiring RW[i+1].

Accordingly, the potential VPR−Vx[i,j] is supplied to a node N[i,j] through the transistor Tr2 in the memory cell MC[i,j] illustrated in FIG. 24, the potential VPR−Vx[i,j+1] is supplied to a node N[i,j+1] through the transistor Tr2 in the memory cell MC[i,j+1], and the potential VPR is supplied to a node NREF[i] through the transistor Tr2 in the memory cell MCR[i].

After Time T02, the potential applied to the wiring WW[i] illustrated in FIG. 24 changes from a high-level potential to a low-level potential, so that the transistors Tr2 in the memory cell MC[i,j], the memory cell MC[i,j+1], and the memory cell MCR[i] are turned off. Accordingly, the potential VPR−Vx[i,j] is held at the node N[i,j], the potential VPR−Vx[i,j+1] is held at the node N[i,j+1], and the potential VPR is held at the node NREF[i].

Then, from Time T03 to Time T04, the potential of the wiring WW[i] illustrated in FIG. 24 remains at a low level and a high-level potential is supplied to the wiring WW[i+1]. Accordingly, the transistors Tr2 in the memory cell MC[i+1,j], the memory cell MC[i+1,j+1], and the memory cell MCR[i+1] illustrated in FIG. 24 are turned on. The transistors Tr2 in the memory cell MC[i,j], the memory cell MC[i,j+1], and the memory cell MCR[i] remain off.

Furthermore, from Time T03 to Time T04, a potential obtained by subtracting the first analog potential from the first reference potential VPR is supplied to each of the wiring WD[j] and the wiring WD[j+1] illustrated in FIG. 24. Specifically, the potential VPR−Vx[i+1,j] is applied to the wiring WD[j], and a potential VPR−Vx[i+1,j+1] is applied to the wiring WD[j+1]. The first reference potential VPR is applied to the wiring WDREF, and a potential between the potential VSS and the potential VDD, e.g., a potential (VDD+VSS)/2, is applied as a base potential to the wiring RW[i] and the wiring RW[i+1].

Accordingly, the potential VPR−Vx[i+1,j] is supplied to a node N[i+1,j] through the transistor Tr2 in the memory cell MC[i+1,j] illustrated in FIG. 24, the potential VPR−Vx[i+1,j+1] is supplied to a node N[i+1,j+1] through the transistor Tr2 in the memory cell MC[i+1,j+1], and the potential VPR is supplied to a node NREF[i+1] through the transistor Tr2 in the memory cell MCR[i+1].

After Time T04, the potential applied to the wiring WW[i+1] illustrated in FIG. 24 changes from a high-level potential to a low-level potential, so that the transistors Tr2 in the memory cell MC[i+1,j], the memory cell MC[i+1,j+1], and the memory cell MCR[i+1] are turned off. Accordingly, the potential VPR−Vx[i+1,j] is held at the node N[i+1,j], the potential VPR−Vx[i+1,j+1] is held at the node N[i+1,j+1], and the potential VPR is held at the node NREF[i+1].

Next, a high-level potential is applied to the wiring ORP and the wiring ORM illustrated in FIG. 25 from Time T05 to Time T06. When a high-level potential is applied to the wiring ORM, the transistors Tr9 in the circuit 13[j] and the circuit 13[j+1] illustrated in FIG. 25 are turned on, so that the gates of the transistors Tr7 are reset by the potential VDD applied thereto. Furthermore, when a high-level potential is applied to the wiring ORP, the transistors Tr6 in the circuit 14[j] and the circuit 14[j+1] illustrated in FIG. 25 are turned on, so that the gates of the transistors Tr4 are reset by the potential VSS applied thereto.

After Time T06, the potential applied to the wiring ORP and the wiring ORM illustrated in FIG. 25 changes from a high-level potential to a low-level potential, so that the transistors Tr9 in the circuit 13[j] and the circuit 13[j+1] and the transistors Tr6 in the circuit 14[j] and the circuit 14[j+1] are turned off. Accordingly, the potential VDD is held at the gate of the transistor Tr7 in each of the circuit 13[j] and the circuit 13[j+1], and the potential VSS is held at the gate of the transistor Tr4 in each of the circuit 14[j] and the circuit 14[j+1].

From Time T07 to Time T08, a high-level potential is applied to the wiring OSP illustrated in FIG. 25. Furthermore, a potential between the potential VSS and the potential VDD, e.g., the potential (VDD+VSS)/2, is supplied as the base potential to each of the wiring RW[i] and the wiring RW[i+1] illustrated in FIG. 24. Since a high-level potential is applied to the wiring OSP, the transistors Tr5 in the circuit 14[j] and the circuit 14[j+1] are turned on.

If the current I[j] flowing through the wiring BL[j] is lower than the current IREF flowing through the wiring BLREF, that is, if the current ΔI[j] has a positive value, this means that the sum of a current that can be drawn by the transistor Tr1 in the memory cell MC[i,j] in FIG. 24 and a current that can be drawn by the transistor Tr1 in the memory cell MC[i+1,j] is smaller than the drain current of the transistor Tr10[j]. Thus, if the current ΔI[j] has a positive value, part of the drain current of the transistor Tr10[j] flows to the gate of the transistor Tr4 when the transistor Tr5 is turned on in the circuit 14[j], and the potential of the gate starts to rise. When the drain current of the transistor Tr4 becomes substantially equal to the current ΔI[j], the potential of the gate of the transistor Tr4 converges on a certain value. The potential of the gate of the transistor Tr4 at this time corresponds to a potential at which the drain current of the transistor Tr4 becomes the current ΔI[j], i.e., the current Ioffset[j] (=ICP[j]). This means that the transistor Tr4 in the circuit 14[j] is in a state of serving as a current source that can supply the current ICP[j].

Similarly, if the current I[j+1] flowing through the wiring BL[j+1] is lower than the current IREF flowing through the wiring BLREF, that is, if a current ΔI[j+1] has a positive value, part of the drain current of the transistor Tr10[j+1] flows to the gate of the transistor Tr4 when the transistor Tr5 is turned on in the circuit 14[j+1], and the potential of the gate starts to rise. When the drain current of the transistor Tr4 becomes substantially equal to the current ΔI[j+1], the potential of the gate of the transistor Tr4 converges on a certain value. The potential of the gate of the transistor Tr4 at this time corresponds to a potential at which the drain current of the transistor Tr4 becomes the current ΔI[j+1], i.e., the current Ioffset[j+1] (=ICP[j+1]). This means that the transistor Tr4 in the circuit 14[j+1] is in a state of serving as a current source that can supply the current ICP[j+1].

After Time T08, the potential applied to the wiring OSP illustrated in FIG. 25 changes from a high-level potential to a low-level potential, so that the transistors Tr5 in the circuit 14[j] and the circuit 14[j+1] are turned off. Accordingly, the potentials of the gates of the transistors Tr4 are held. Thus, the circuit 14[j] remains in a state of serving as the current source that can supply the current ICP[j], and the circuit 14[j+1] remains in a state of serving as the current source that can supply the current ICP[j+1].

From Time T09 to Time T10, a high-level potential is applied to the wiring OSM illustrated in FIG. 25. Furthermore, a potential between the potential VSS and the potential VDD, e.g., the potential (VDD+VSS)/2, is supplied as the base potential to each of the wiring RW[i] and the wiring RW[i+1] illustrated in FIG. 24. Since a high-level potential is applied to the wiring OSM, the transistors Tr8 in the circuit 13[j] and the circuit 13[j+1] are turned on.

If the current I[j] flowing through the wiring BL[j] is higher than the current IREF flowing through the wiring BLREF, that is, if the current ΔI[j] has a negative value, this means that the sum of a current that can be drawn by the transistor Tr1 in the memory cell MC[i,j] in FIG. 24 and a current that can be drawn by the transistor Tr1 in the memory cell MC[i+1,j] is larger than the drain current of the transistor Tr10[j]. Thus, if the current ΔI[j] has a negative value, current flows from the gate of the transistor Tr7 to the wiring BLL[j] when the transistor Tr8 is turned on in the circuit 13[j], and the potential of the gate starts to decrease. When the drain current of the transistor Tr7 becomes substantially equal to the current ΔI[j], the potential of the gate of the transistor Tr7 converges on a certain value. The potential of the gate of the transistor Tr7 at this time corresponds to a potential at which the drain current of the transistor Tr7 becomes the current ΔI[j], i.e., the current Ioffset[j] (=ICM[j]). This means that the transistor Tr7 in the circuit 13[j] is in a state of serving as a current source that can supply the current ICM[j].

Similarly, if the current I[j+1] flowing through the wiring BL[j+1] is higher than the current IREF flowing through the wiring BLREF, that is, if the current ΔI[j+1] has a negative value, current flows from the gate of the transistor Tr7 in the circuit 13[j+1] to the wiring BL[j+1] when the transistor Tr8 is turned on, and the potential of the gate starts to decrease. When the drain current of the transistor Tr7 becomes substantially equal to the absolute value of the current ΔI[j+1], the potential of the gate of the transistor Tr7 converges on a certain value. The potential of the gate of the transistor Tr7 at this time corresponds to a potential at which the drain current of the transistor Tr7 equal to the absolute value of ΔI[j+1], i.e., the current Ioffset[j+1] (=ICM[j+1]). This means that the transistor Tr7 in the circuit 13[j+1] is in a state of serving as a current source that can supply the current ICM[j+1].

After Time T10, the potential applied to the wiring OSM illustrated in FIG. 25 changes from a high-level potential to a low-level potential, so that the transistors Tr8 in the circuit 13[j] and the circuit 13[j+1] are turned off. Accordingly, the potentials of the gates of the transistors Tr7 are held. Thus, the circuit 13[j] remains in a state of serving as the current source that can supply the current ICM[j], and the circuit 13[j+1] remains in a state of serving as the current source that can supply the current ICM[j+1].

In each of the circuit 14[j] and the circuit 14[j+1], the transistor Tr4 has a function of drawing current. Thus, from Time T07 to Time T08, if the current I[j] flowing through the wiring BL[j] is higher than the current IREF flowing through the wiring BLREF and the current ΔI[j] has a negative value, or if the current I[j+1] flowing through the wiring BL[j+1] is higher than the current IREF flowing through the wiring BLREF and the current ΔI[j+1] has a negative value, it might be difficult to supply a proper (neither too much nor too little) amount of current from the circuit 14[j] or the circuit 14[j+1] to the wiring BL[j] or the wiring BL[j+1]. In that case, it might be difficult for the transistor Tr1 in the memory cell MC, the transistor Tr4 in the circuit 14[j] or the circuit 14[j+1], and the transistor Tr10[j] or Tr10[j+1] to concurrently operate in a saturation region because a balance between the current flowing through the wiring BLREF and the current flowing through the wiring BL[j] or the wiring BL[j+1] is struck.

To ensure the operation of the transistor Tr1, the transistor Tr4, and the transistor Tr10[j] or the transistor Tr10[j+1] in a saturation region from Time T07 to Time T08 even when the current ΔI[j] has a negative value, the potential of the gate of the transistor Tr7 may be set to a potential that is high enough to obtain a predetermined drain current, instead of resetting the potential of the gate of the transistor Tr7 to the potential VDD, from Time T05 to Time T06. In the above configuration, the amount of current that cannot be drawn by the transistor Tr1 can be drawn by the transistor Tr4 to some extent because current from the transistor Tr7, as well as the drain current of the transistor Tr10[j] or Tr10[j+1], is supplied; thus, the operations of the transistor Tr1, the transistor Tr4, and the transistor Tr10[j] or Tr10[j+1] in a saturation region can be ensured.

Note that if the current I[j] flowing through the wiring BL[j] is lower than the current IREF flowing through the wiring BLREF, that is, if the current ΔI[j] has a positive value from Time T09 to Time T10, since the circuit 14[j] has been set as the current supply that can supply the current ICP[j] from Time T07 to Time T08, the potential of the gate of the transistor Tr7 in the circuit 13[j+1] remains substantially the same as the potential VDD. Similarly, if the current I[j+1] flowing through the wiring BL[j+1] is lower than the current IREF flowing through the wiring BLREF, that is, if the current ΔI[j+1] has a positive value, since the circuit 14[j+1] has been set as the current source that can supply the current ICP[j+1] from Time T07 to Time T08, the potential of the gate of the transistor Tr7 in the circuit 13[j+1] keeps a value substantially the same as that of the potential VDD.

Then, from Time T11 to Time T12, the second analog potential Vw[i] is supplied to the wiring RW[i] illustrated in FIG. 24. Furthermore, a potential between the potential VSS and the potential VDD, e.g., the potential (VDD+VSS)/2, is still applied as a base potential to the wiring RW[i+1]. In practice, the potential of the wiring RW[i] is a potential higher than the potential between the potential VSS and the potential VDD (e.g., the potential (VDD+VSS)/2), which is the base potential, by Vw[i]; for the simplicity of the following description, however, the potential of the wiring RW[i] is assumed to be the potential Vw[i].

When the potential of the wiring RW[i] becomes the potential Vw[i], with the assumption that the amount of change in the potential of the first electrode of the capacitor C7 is substantially the same as the amount of change in the potential of the node N, the potential of the node N in the memory cell MC[i,j] in FIG. 24 becomes VPR−Vx[i,j]+Vw[i] and the potential of the node N in the memory cell MC[i,j+1] becomes VPR−Vx[i,j+1]+Vw[i]. According to Formula (a14), the product-sum of the first analog data and the second analog data for the memory cell MC[i,j] affects a current obtained by subtracting the current Ioffset[j] from the current ΔI[j], that is, the current Iout[j] flowing from the wiring BL[j]. Furthermore, the product-sum of the first analog data and the second analog data for the memory cell MC[i,j+1] affects current obtained by subtracting the current Ioffset[j+1] from the current ΔI[j+1], that is, a current Iout[j+1] flowing from the wiring BL[j+1].

After Time T12, a potential between the potential VSS and the potential VDD (e.g., the potential (VDD+VSS)/2), which is a base potential, is applied again to the wiring RW[i].

Then, from Time T13 to Time T14, the second analog potential Vw[i+1] is supplied to the wiring RW[i+1] illustrated in FIG. 24. Furthermore, a potential between the potential VSS and the potential VDD, e.g., the potential (VDD+VSS)/2, is still applied as a base potential to the wiring RW[i]. In practice, the potential of the wiring RW[i+1] is a potential higher than the potential between the potential VSS and the potential VDD (e.g., the potential (VDD+VSS)/2), which is the base potential, by Vw[i+1]; for the simplicity of the following description, however, the potential of the wiring RW[i+1] is assumed to be the potential Vw[i+1].

When the potential of the wiring RW[i+1] becomes the potential Vw[i+1], with the assumption that the amount of change in the potential of the first electrode of the capacitor C7 is substantially the same as the amount of change in the potential of the node N, the potential of the node N in the memory cell MC[i+1,j] illustrated in FIG. 24 becomes VPR−Vx[i+1,j]+Vw[i+1] and the potential of the node N in the memory cell MC[i+1,j+1] becomes VPR−Vx[i+1,j+1]+Vw[i+1]. According to Formula (a14), the product-sum of the first analog data and the second analog data for the memory cell MC[i+1,j] affects current obtained by subtracting the current Ioffset[j] from the current ΔI[j], that is, the current Iout[j]. Furthermore, the product-sum of the first analog data and the second analog data for the memory cell MC[i+1,j+1] affects current obtained by subtracting the current Ioffset[j+1] from the current ΔI[j+1], that is, a current Iout[j+1].

After Time T14, a potential between the potential VSS and the potential VDD (e.g., the potential (VDD+VSS)/2), which is a base potential, is applied again to the wiring RW[i+1].

Then, from Time T15 to Time T16, the second analog potential Vw[i] is applied to the wiring RW[i] illustrated in FIG. 24 and the second analog potential Vw[i+1] is applied to the wiring RW[i+1]. In practice, the potential of the wiring RW[i] is a potential higher than the potential between the potential VSS and the potential VDD (e.g., the potential (VDD+VSS)/2), which is the base potential, by Vw[i] and the potential of the wiring RW[i+1] is a potential higher than the potential between the potential VSS and the potential VDD (e.g., the potential (VDD+VSS)/2) by Vw[i+1]. However, for the simplicity of the following description, the potential of the wiring RW[i] is assumed to be the potential Vw[i] and the potential of the wiring RW[i+1] is assumed to be the potential Vw[i+1].

When the potential of the wiring RW[i] becomes the potential Vw[i], with the assumption that the amount of change in the potential of the first electrode of the capacitor C7 is substantially the same as the amount of change in the potential of the node N, the potential of the node N in the memory cell MC[i,j] in FIG. 24 becomes VPR−Vx[i,j]+Vw[i] and the potential of the node N in the memory cell MC[i,j+1] becomes VPR−Vx[i,j+1]+Vw[i]. When the potential of the wiring RW[i+1] becomes the potential Vw[i+1], with the assumption that the amount of change in the potential of the first electrode of the capacitor C7 is substantially the same as the amount of change in the potential of the node N, the potential of the node N in the memory cell MC[i+1,j] illustrated in FIG. 24 becomes VPR−Vx[i+1,j]+Vw[i+1] and the potential of the node N in the memory cell MC[i+1,j+1] becomes VPR−Vx[i+1,j+1]+Vw[i+1].

According to Formula (a14), the product-sum of the first analog data and the second analog data for the memory cell MC[i,j] and the memory cell MC[i+1,j] affects current obtained by subtracting the current Ioffset[j] from the current ΔI[j], that is, the current Iout[j]. Furthermore, the product-sum of the first analog data and the second analog data for the memory cell MC[i,j+1] and the memory cell MC[i+1,j+1] affects current obtained by subtracting the current Ioffset[j+1] from the current ΔI[j+1], that is, a current Iout[j+1].

After Time T16, a potential between the potential VSS and the potential VDD (e.g., the potential (VDD+VSS)/2), which is a base potential, is applied again to the wiring RW[i] and the wiring RW[i+1].

With the above configuration, the product-sum operation can be performed with a small circuit scale. With the above configuration, the product-sum operation can be performed at high speed. With the above configuration, the product-sum operation can be performed with low power.

Note that a transistor with an extremely low off-state current is desirably used as the transistor Tr2, Tr5, Tr6, Tr8, or Tr9. When a transistor with an extremely low off-state current is used as the transistor Tr2, the potential of the node N can be held for a long time. When a transistor with an extremely low off-state current is used as the transistors Tr5 and Tr6, the potential of the gate of the transistor Tr4 can be held for a long time. When a transistor with an extremely low off-state current is used as the transistors Tr8 and Tr9, the potential of the gate of the transistor Tr7 can be held for a long time.

To reduce an off-state current of a transistor, a channel formation region contains a semiconductor with a wide band gap, for example. As described above, a semiconductor with a wide bandgap sometimes refers to a semiconductor with a bandgap of 2.2 eV or more; such semiconductors include an oxide semiconductor. As the transistor Tr2, Tr5, Tr6, Tr8, and Tr9, OS transistors may be used.

This embodiment can be combined with any of the other embodiments as appropriate.

Embodiment 5

In this embodiment, electronic devices that include a display device of one embodiment of the present invention will be described.

The display device can display an image by combining display with a reflective element and display with a light-emitting element as appropriate, and thus can display images with high quality, regardless of the weather (fine, rainy, or cloudy weather), the time (day or night), or the like. The display device is therefore suited for a display portion of a portable electronic device used at various places. The display device enables both smooth display of moving image and low power consumption, and thus can increase the operating time of a portable electronic device that has a battery as its power source. Of course, the display device can be applied to display portions of various electronic devices other than portable electronic devices. With reference to FIGS. 27A to 27H, some examples of an electronic device with a display portion will be explained.

FIGS. 27A to 27G illustrate electronic devices. These electronic devices can include a housing 5000, a display portion 5001, a speaker 5003, an LED lamp 5004, operation keys 5005 (including a power switch and an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 27A:
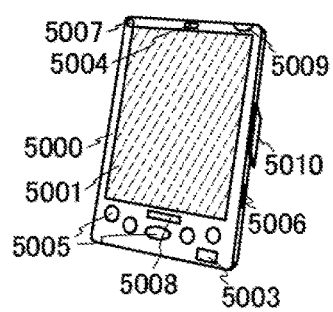
FIGS. 27A to 27H are perspective views illustrating examples of an electronic device.
Figure 27B:
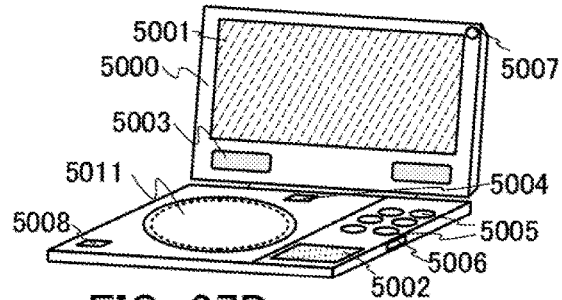
Figure 27C:
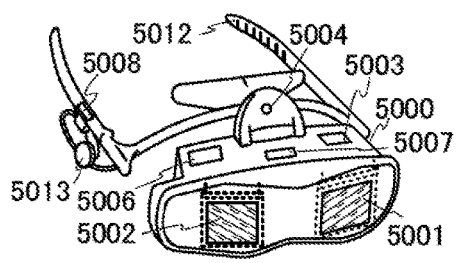
Figure 27D:
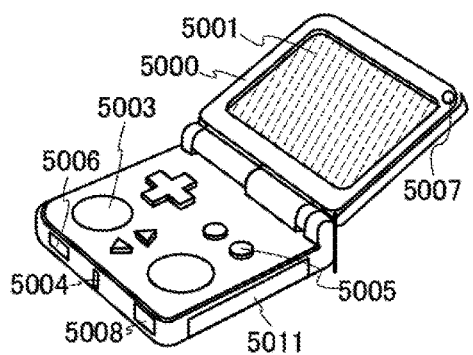
Figure 27E:
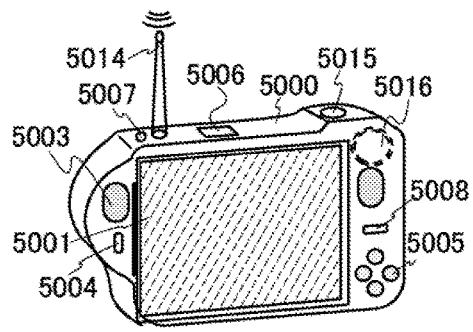
Figure 27F:
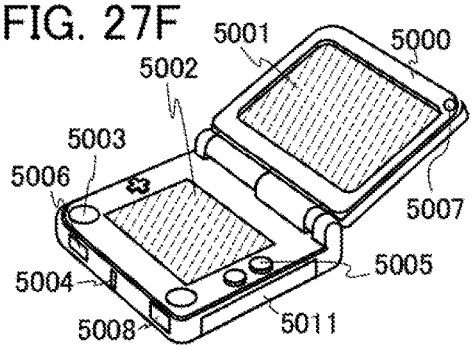
Figure 27G:
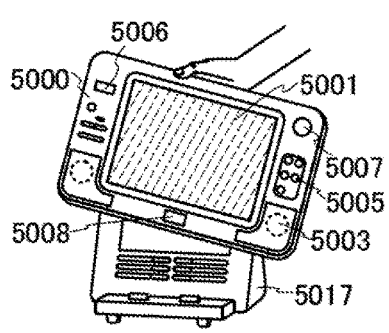

FIG. 27A illustrates a mobile computer which can include a switch 5009, an infrared port 5010, and the like in addition to the above components. FIG. 27B illustrates a portable image reproducing device (e.g., a DVD player) which is provided with a memory medium and can include a second display portion 5002, a memory medium reading portion 5011, and the like in addition to the above components. FIG. 27C illustrates a goggle-type display which can include the second display portion 5002, a supporting portion 5012, an earphone 5013, and the like in addition to the above components. FIG. 27D illustrates a portable game machine which can include the memory medium reading portion 5011 and the like in addition to the above components. FIG. 27E illustrates a digital camera which has a television reception function and can include an antenna 5014, a shutter button 5015, an image receiving portion 5016, and the like in addition to the above components. FIG. 27F illustrates a portable game machine which can include the second display portion 5002, the memory medium reading portion 5011, and the like in addition to the above components. FIG. 27G illustrates a portable television receiver that can include a charger 5017 capable of transmitting and receiving signals, and the like in addition to the above components.

The electronic devices illustrated in FIGS. 27A to 27G can have a variety of functions such as a function of displaying a variety of data (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Furthermore, the electronic device including a plurality of display portions can have a function of displaying image information mainly on one display portion while displaying text information on another display portion, a function of displaying a three-dimensional image by displaying images where parallax is considered on a plurality of display portions, or the like. Furthermore, the electronic device including an image receiving portion can have a function of photographing a still image, a function of photographing a moving image, a function of automatically or manually correcting a photographed image, a function of storing a photographed image in a memory medium (an external memory medium or a memory medium incorporated in the camera), a function of displaying a photographed image on the display portion, or the like. Note that functions that can be provided for the electronic devices illustrated in FIGS. 27A to 27G are not limited to those described above, and the electronic devices can have a variety of functions.

Figure 27H:
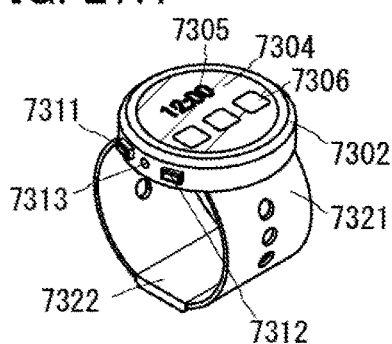

FIG. 27H illustrates a smart watch, which includes a housing 7302, a display panel 7304, operation buttons 7311 and 7312, a connection terminal 7313, a band 7321, a clasp 7322, and the like.

The display panel 7304 mounted in the housing 7302 serving as a bezel includes a non-rectangular display region. The display panel 7304 may have a rectangular display region. The display panel 7304 can display an icon 7305 indicating time, another icon 7306, and the like.

The smart watch in FIG. 27H can have a variety of functions such as a function of displaying a variety of data (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion.

The housing 7302 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. Note that the smart watch can be manufactured using the light-emitting element for the display panel 7304.

Embodiment 6

<Composition of CAC-OS>

In this embodiment, described below is the composition of a cloud-aligned composite oxide semiconductor (CAC-OS) applicable to an OS transistor.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a c-axis-aligned crystalline (CAAC) structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated intentionally, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In the CAC-OS, an electron diffraction pattern that is obtained by irradiation with an electron beam with a probe diameter of 1 nm (also referred to as nanobeam electron beam) has regions with high luminance in a ring pattern and a plurality of bright spots appear in the ring-like pattern. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element including a CAC-OS has high reliability. Thus, the CAC-OS is suitably used in a variety of semiconductor devices typified by a display.

This application is based on Japanese Patent Application Serial No. 2016-144229 filed with Japan Patent Office on Jul. 22, 2016, the entire contents of which are hereby incorporated by reference.

What is claimed is:

1. A semiconductor device comprising:
   a first controller;
   a second controller;
   a frame memory;
   a register; and
   an image processing portion,
   wherein the frame memory is configured to store image data,
   wherein the image processing portion is configured to process the image data,
   wherein the register is configured to store a parameter for performing processing in the image processing portion,
   wherein the frame memory is configured to retain the image data while power supply to the frame memory is stopped,
   wherein the register is configured to retain the parameter while power supply to the register is stopped,
   wherein the first controller is configured to control the power supply to the frame memory, the power supply to the register, and power supply to the image processing portion, and wherein the second controller is configured to instruct the register in timing of performing preparation operation against stop of the power supply to the register.

2. The semiconductor device according to claim 1, further comprising a third controller,
wherein the third controller is configured to receive a first signal from a touch sensor and to generate a second signal on the basis of the first signal,
wherein the second signal comprises information sensed by the touch sensor, and
wherein the second controller is configured to instruct the register in timing of performing preparation operation for stop of the power supply to register on the basis of the second signal and current consumption of the frame memory.

3. The semiconductor device according to claim 1,
wherein the register comprises a scan chain register, a first register, and a second register,
wherein the scan chain register comprises a third register and a fourth register,
wherein an output terminal of the third register is electrically connected to an input terminal of the fourth register,
wherein the first register is configured to read data stored in the third register,
wherein the second register is configured to read data stored in the fourth register,
wherein the data read to the first register is output to the image processing portion as the parameter and the data read to the second register is output to the image processing portion as the parameter,
wherein the third register comprises a first retention circuit,
wherein the fourth register comprises a second retention circuit,
wherein the first retention circuit is configured to store the data stored in the third register,
wherein the third register is configured to read the data stored in the first retention circuit,
wherein the second retention circuit is configured to store the data stored in the fourth register,
wherein the fourth register is configured to read the data stored in the second retention circuit,
wherein the first retention circuit is configured to retain the stored data while the power supply to the third register is stopped,
wherein the second retention circuit is configured to retain the stored data while the power supply to the fourth register is stopped, and
wherein the second controller is configured to instruct the first retention circuit in timing of storing the data stored in the third register and to instruct the second retention circuit in timing of storing the data stored in the fourth register.

4. The semiconductor device according to claim 3, further comprising a third controller,
wherein the third controller is configured to receive a first signal from a touch sensor and to generate a second signal on the basis of the first signal,
wherein the second signal comprises information sensed by the touch sensor, and
wherein the second controller is configured to instruct the first retention circuit in timing of storing the data stored in the third register and to instruct the second retention circuit in timing of storing the data stored in the fourth register on the basis of the second signal and current consumption of the frame memory.

5. The semiconductor device according to claim 3,
wherein the first retention circuit comprises a first transistor and a first capacitor,
wherein the second retention circuit comprises a second transistor and a second capacitor,
wherein the first transistor controls charge and discharge of the first capacitor,
wherein the second transistor controls charge and discharge of the second capacitor, and
wherein the first transistor and the second transistor each comprise a metal oxide in a channel formation region.

6. The semiconductor device according to claim 1,
wherein the second controller comprises a product-sum operation circuit comprising an analog memory.

7. The semiconductor device according to claim 6,
wherein a transistor in the analog memory comprises a metal oxide in a channel formation region.

8. The semiconductor device according to claim 1,
wherein the frame memory comprises a plurality of memory cells,
wherein the memory cell comprises a third transistor and a third capacitor,
wherein the third transistor controls charge and discharge of the third capacitor, and
wherein the third transistor comprises a metal oxide in a channel formation region.

* * * * *